US012751289B2

(12) United States Patent
Tong et al.

(10) Patent No.: US 12,751,289 B2
(45) Date of Patent: Sep. 29, 2026

(54) SEMICONDUCTOR PACKAGE AND SEMICONDUCTOR PACKAGE ASSEMBLY WITH EDGE INTERCONNECTION AND METHOD OF FORMING THE SAME

(71) Applicants: ND-HI TECHNOLOGIES LAB, INC., Taipei City (TW); ETRON TECHNOLOGY, INC., Hsinchu (TW)

(72) Inventors: Ho-Ming Tong, Taipei City (TW); Chao-Chun Lu, Hsinchu (TW)

(73) Assignees: ND-HI TECHNOLOGIES LAB, INC.; ETRON TECHNOLOGY, INC., Hsinchu (TW)

( * ) Notice: Subject to any disclaimer, the term of this patent is extended or adjusted under 35 U.S.C. 154(b) by 0 days.

(21) Appl. No.: 19/059,275

(22) Filed: Feb. 21, 2025

(65) Prior Publication Data

US 2025/0233045 A1 Jul. 17, 2025

Related U.S. Application Data

(63) Continuation-in-part of application No. 18/471,670, filed on Sep. 21, 2023.

(Continued)

(51) Int. Cl.
*H01L 23/373* (2006.01)
*H01L 23/48* (2006.01)
(Continued)

(52) U.S. Cl.
CPC ....... *H10W 40/258* (2026.01); *H10W 40/259* (2026.01); *H10W 70/611* (2026.01);
(Continued)

(58) Field of Classification Search
CPC ............. H01L 23/3736; H01L 23/3731; H01L 23/5385; H01L 23/481; H01L 25/072;
(Continued)

(56) References Cited

U.S. PATENT DOCUMENTS 5,031,072 A 7/1991 Malhi et al.
5,397,747 A 3/1995 Angiulli et al.
(Continued)

FOREIGN PATENT DOCUMENTS

CN 117766514 A 3/2024
JP S59194460 A 11/1984
(Continued)

OTHER PUBLICATIONS

Office Action issued by TIPO dated Apr. 21, 2025 for TW112136128.
(Continued)

*Primary Examiner* — Peniel M Gumedzoe
(74) *Attorney, Agent, or Firm* — WPAT, P.C.; Anthony King

(57) ABSTRACT

An IC stack includes: a plurality of integrated circuit (IC) structure horizontally separate with each other, wherein each IC structure comprises a top surface, a bottom surface opposite to the top surface, and four sidewalls with a first sidewall, a second sidewall, a third sidewall and a fourth sidewall; wherein the area of the bottom surface or the top surface is larger than that of any sidewall; a laterally extending RDL structure covering each first sidewall of the plurality of IC structures; and an upward extending thermal conductivity layer between two adjacent IC structures.

19 Claims, 43 Drawing Sheets

Related U.S. Application Data

(60) Provisional application No. 63/716,506, filed on Nov. 5, 2024, provisional application No. 63/409,852, filed on Sep. 26, 2022.

(51) Int. Cl.

| | |
|---|---|
| ***H01L 23/538*** | (2006.01) |
| ***H01L 25/07*** | (2006.01) |
| ***H10B 80/00*** | (2026.01) |
| ***H10W 40/25*** | (2026.01) |
| ***H10W 70/60*** | (2026.01) |
| ***H10W 90/00*** | (2026.01) |
| *H10W 20/20* | (2026.01) |

(52) U.S. Cl.
CPC ......... *H10W 90/00* (2026.01); *H10W 90/401* (2026.01); *H10B 80/00* (2023.02); *H10W 20/20* (2026.01)

(58) Field of Classification Search
CPC .. H10B 80/00; H10W 40/258; H10W 40/259; H10W 90/00; H10W 90/401; H10W 70/611; H10W 20/20
See application file for complete search history.

(56) References Cited

U.S. PATENT DOCUMENTS

| | | | | |
|---|---|---|---|---|
| 5,561,622 | A | 10/1996 | Bertin et al. | |
| 6,381,164 | B1 | 4/2002 | Fan et al. | |
| 8,618,659 | B2 | 12/2013 | Sato | |
| 9,263,157 | B2 | 2/2016 | Kilmer et al. | |
| 9,490,195 | B1 | 11/2016 | Prabhu | |
| 9,865,310 | B2 | 1/2018 | Cantle et al. | |
| 10,170,456 | B2 | 1/2019 | Sung | |
| 10,283,492 | B2 | 5/2019 | Gamini | |
| 10,665,571 | B2 | 5/2020 | Lee | |
| 11,024,603 | B2 | 6/2021 | Chen | |
| 11,145,526 | B2 | 10/2021 | Wang | |
| 11,183,484 | B2 | 11/2021 | Okutsu | |
| 11,233,034 | B2 | 1/2022 | Keeth | |
| 11,239,169 | B1 | 2/2022 | Kirby | |
| 11,270,921 | B2 | 3/2022 | Hou | |
| 11,302,673 | B2 | 4/2022 | Yang | |
| 11,373,977 | B1 | 6/2022 | Bean | |
| 11,482,500 | B2 | 10/2022 | Bowers | |
| 11,526,302 | B2 | 12/2022 | Smolka et al. | |
| 11,552,054 | B2 | 1/2023 | Lin | |
| 11,557,541 | B2 | 1/2023 | Hossain | |
| 11,854,921 | B2 | 12/2023 | Yu | |
| 11,869,821 | B2 | 1/2024 | Ko | |
| 11,876,076 | B2 | 1/2024 | DeLaCruz et al. | |
| 12,027,473 | B2 | 7/2024 | Kwon et al. | |
| 12,230,613 | B2 | 2/2025 | Chang | |
| 2007/0102801 | A1 | 5/2007 | Ishida | |
| 2008/0029884 | A1 | 2/2008 | Grafe | |
| 2008/0083976 | A1 | 4/2008 | Haba | |
| 2008/0290493 | A1 | 11/2008 | Tsunozaki | |
| 2009/0045444 | A1 | 2/2009 | Huebner | |
| 2009/0045524 | A1 | 2/2009 | Mohammed | |
| 2010/0200959 | A1 | 8/2010 | Sasaki et al. | |
| 2010/0327461 | A1 | 12/2010 | Co | |
| 2012/0049376 | A1 | 3/2012 | Harada | |
| 2012/0211878 | A1 | 8/2012 | Popovic | |
| 2012/0273961 | A1 | 11/2012 | Kwon et al. | |
| 2013/0099393 | A1 | 4/2013 | Jeong | |
| 2013/0299977 | A1 | 11/2013 | Dayringer | |
| 2013/0341803 | A1 | 12/2013 | Cheah | |
| 2014/0089609 | A1 | 3/2014 | Kegel | |
| 2014/0185352 | A1* | 7/2014 | Chow .................... | G11C 5/025 365/63 |
| 2014/0210097 | A1 | 7/2014 | Chen et al. | |
| 2014/0264945 | A1 | 9/2014 | Yap | |
| 2014/0376323 | A1 | 12/2014 | Terada | |
| 2015/0091179 | A1 | 4/2015 | Shenoy | |
| 2016/0064063 | A1 | 3/2016 | Nomura | |
| 2017/0018485 | A1 | 1/2017 | Prabhu | |
| 2017/0018529 | A1* | 1/2017 | Katkar .................... | H01L 24/19 |
| 2017/0141063 | A1 | 5/2017 | Lee | |
| 2017/0278833 | A1 | 9/2017 | Park | |
| 2017/0338203 | A1 | 11/2017 | Yuan | |
| 2018/0040587 | A1* | 2/2018 | Tao ..................... | H01L 25/0657 |
| 2018/0047706 | A1 | 2/2018 | Upadhyayula | |
| 2018/0233452 | A1 | 8/2018 | Lin | |
| 2020/0006246 | A1 | 1/2020 | Kong et al. | |
| 2020/0006367 | A1 | 1/2020 | Krutzik et al. | |
| 2020/0343218 | A1 | 10/2020 | Hu | |
| 2020/0411481 | A1 | 12/2020 | Yang et al. | |
| 2021/0242100 | A1 | 8/2021 | Hou et al. | |
| 2021/0305226 | A1 | 9/2021 | Tsai | |
| 2022/0328374 | A1 | 10/2022 | Zhang | |
| 2023/0029098 | A1 | 1/2023 | Kim | |
| 2023/0042063 | A1* | 2/2023 | Bae ..................... | H01L 25/0657 |
| 2023/0059491 | A1 | 2/2023 | Dokania | |
| 2023/0069969 | A1 | 3/2023 | Boutaleb | |
| 2023/0178502 | A1 | 6/2023 | Goh | |
| 2023/0238300 | A1 | 7/2023 | Zhou | |
| 2023/0343769 | A1 | 10/2023 | Karhade et al. | |
| 2023/0369289 | A1 | 11/2023 | Guo et al. | |
| 2024/0038724 | A1 | 2/2024 | Karikalan | |
| 2024/0057351 | A1 | 2/2024 | Chuang | |
| 2024/0063120 | A1 | 2/2024 | Elsherbini et al. | |
| 2024/0063179 | A1 | 2/2024 | Elsherbini et al. | |
| 2024/0087976 | A1 | 3/2024 | Kim et al. | |
| 2024/0099030 | A1 | 3/2024 | Huang | |
| 2024/0128208 | A1 | 4/2024 | Tong et al. | |
| 2024/0170458 | A1 | 5/2024 | Ji | |
| 2025/0140741 | A1 | 5/2025 | Mongia et al. | |
| 2025/0286031 | A1 | 9/2025 | Kawano | |

FOREIGN PATENT DOCUMENTS

| | | | |
|---|---|---|---|
| JP | 2016004896 | A | 1/2016 |
| KR | 20180071138 | | 6/2018 |
| KR | 20240035240 | A | 3/2024 |
| KR | 20240074354 | A | 5/2024 |
| WO | 2021095083 | A1 | 5/2021 |
| WO | 2024135670 | | 6/2024 |

OTHER PUBLICATIONS

English translation of the Search Report appended to Office Action issued by TIPO dated Apr. 21, 2025 for TW112136128.

Office Action of U.S. Appl. No. 19/062,467 issued by USPTO on May 21, 2025.

Office Action of U.S. Appl. No. 19/062,566 issued by USPTO on Feb. 25, 2025.

English abstract of JP2016004896A.

Anthony Agnesina et al., A COTS-Based Novel 3-D DRAM Memory Cube Architecture for Space Applications, IEEE Transactions on Very Large Scale Integration (VLSI) Systems, Sep. 2020, vol. 28 No. 9.

Extended European Search Report with search report issued by the European Patent Office for European Patent Application No. 25159330.7 on Sep. 24, 2025 (8 pages).

Office Action issued by KIPO dated Feb. 4, 2026 for Application No. KR10-2025-0023228.

English translation of the Search Report appended to Office Action issued by KIPO dated Feb. 4, 2026 for Application No. KR10-2025-0023228.

Office Action issued by JPO dated Apr. 14, 2026 for Application No. JP2025-027233.

English translation of the Search Report appended to Office Action issued by JPO dated Apr. 14, 2026 for Application No. JP2025-027233.

Office Action issued by EPO dated Feb. 19, 2026 for Application No. EP25202067.2.

Search Report appended to Office Action issued by EPO dated Feb. 19, 2026 for Application No. EP25202067.2.

(56) References Cited

OTHER PUBLICATIONS

Office Action issued by EPO dated Feb. 20, 2026 for Application No. EP25202075.5.
Search Report appended to Office Action issued by EPO dated Feb. 20, 2026 for Application No. EP25202075.5.
Office Action issued by EPO dated Mar. 27, 2026 for Application No. EP25159308.3.
Search Report appended to Office Action issued by EPO dated Mar. 27, 2026 for Application No. EP25159308.3.
Office Action issued by KIPO dated May 13, 2026 for Application No. KR10-2025-0130745.
English translation of the Search Report appended to Office Action issued by KIPO dated May 13, 2026 for Application No. KR10-2025-0130745.
Notice of Allowance issued by the United States Patent and Trademark Office for U.S. Appl. No. 19/315,804 on May 12, 2026.
Office Action issued by the USPTO for U.S. Appl. No. 18/471,670 on Jun. 29, 2026.
Office Action from the Korean family application dated Jul. 23, 2026.
English translation of the Office from the Korean family application dated Jul. 23, 2026.
US20240128208A1 is the US counterpart to CN117766514A.
US20240087976A1 is the US counterpart to KR20240035240A.

* cited by examiner 100W
104
102

122E
104
102

400W
232
110S
122E
110
106

400W
242
122E
110
106

400W
242
108A
232
110
106

401W
108P
242
102P
108B
232
108A
120
108P
102P
116

SEMICONDUCTOR PACKAGE AND SEMICONDUCTOR PACKAGE ASSEMBLY WITH EDGE INTERCONNECTION AND METHOD OF FORMING THE SAME

PRIORITY CLAIM AND CROSS-REFERENCE

This application is a continuation-in-part application of a U.S. non-provisional application Ser. No. 18/471,670, filed Sep. 1, 2023, which claims the benefit of U.S. provisional application No. 63/409,852 filed Sep. 26, 2022, and claims the benefit of U.S. provisional application No. 63/716,506 filed Nov. 5, 2024, the disclosures of which are incorporated by reference herein in its entirety.

FIELD

This disclosure relates in general to a semiconductor device and a method of forming the same, and more particularly to a semiconductor device with side edge interconnection and a method of forming the same.

BACKGROUND

Tremendous progress has been made in two dimensional (2D) geometrical scaling of conventional transistors due to the great feats of engineering and material science involving extremely complex multiple-step lithographic patterning, new strain enhancing materials and metal oxide gate. However, 2D device scaling is losing momentum as the above-mentioned techniques approach their practical limits. Three-dimensional integrated circuit (3D IC) integration which represents a radical departure from the traditional 2D IC integration has been recognized as a next-generation semiconductor technology to simultaneously achieve high performance, low power consumption, small physical size and high integration density. The 3D ICs provide a path to continually meet performance and cost demands of next generation devices while still permitting more relaxed gate lengths with less process complexity for high-end applications such as high-performance computing (HPC), data centers and artificial intelligence (AI).

3D IC integration can proceed via
monolithic integration, and/or
vertical integration of disparate dies.

3D monolithic integration involves typically vertical integration of multiple active silicon layers with vertical interconnects between the layers. Recently, a "cache-on-central processing unit (CPU)" 3D IC structure has been demonstrated and commercialized using copper hybrid bonding. Today, high-bandwidth-memory (HBM) dynamic random-access memory (DRAM) stacks, each of which created by vertically integrating a number of DRAM dies on a control IC, represent the highest volume commercial 3D ICs today. These HBM DRAM stacks are typically mounted side-by-side with a processor IC on a silicon interposer in 2.5D IC packaging (FIG. 1A) for high-end applications such as HPC, data centers and AI. A 2.5D IC typically contains through-silicon vias (TSVs) in active dies such as DRAM and control ICs, and in the silicon interposer which can be passive or active. A 2.5D IC can also contain redistribution layers (RDLs) in the interposer and active dies. Take ChatGPT for instance, it is powered by nVidia's H100 GPU in 2.5D IC configuration. Going forward, 3D ICs can enable memory on memory, memory over logic, and logic over logic structures using interconnect technologies including TSVs, RDLs containing interconnect wiring and micro-vias, flip chip bonding based on copper pillar micro-bumps or solder bumps, as well as the newly emerged technique of copper hybrid bonding. 3D ICs created by monolithic integration and/or heterogeneous integration allow for vertical stacking of heterogeneous dies and/or active silicon layers from different manufacturing processes and nodes, chip/chiplet reuse, and chiplets-in-SiP (system-in-a-package). Ultimately, 3D IC integration will enable stacking of HBM DRAM stacks on processors to greatly shorten the time of data transfer between DRAM dies and the processor and greatly reduce the peak compute memory bandwidth gap. 3D ICs are ideal for applications that require integration of more transistors in a given footprint (such as mobile system-on-chip, SoC) or for applications already pushing the capability limit of a single die at the most-advanced node, such as HPC, data centers, AI/machine learning, 5G/6G networks, graphics, smartphones/wearables, automotive and others that demand ultra-high-performance, higher-power-efficiency devices. These devices include CPU, GPU (graphics processing unit), FPGA (field-programmable gate array), ASIC (application-specific IC), TPU (tensor processing unit), integrated photonics, AP (application processor for cell phones), packet buffer/router devices, and the like.

To accelerate adoption, 3D IC systems must be designed in a holistic manner via IC-package-system co-design, which involves a silicon IP, ICs/chiplets and an IC package, and addresses accompanying power and thermal challenges. In contrast to PPAC (performance, power, area and cost) optimization per square centimeter as applied in 2D packaging, IC-package-system co-design for 3D ICs aims to achieve "PPAC optimization per cubic millimeter", wherein a vertical dimension that covers ICs, interposer, IC package substrate, IC package and system printed circuit board (PCB) must all be considered in all tradeoff decisions.

Today, all 3D ICs adopt packaging topologies with single-sided areal electrical interconnects, for instance, from the bottom-side of the control IC in the HBM DRAM stack, which is connected to an interposer, to DRAM dies on top of the control IC, or from the laminate substrate to the bottom side of the CPU in cache-on-CPU. In powering 3D ICs that rely on single-sided interconnects, designers must consider all stacked layers while designing a power delivery network with a topmost die receiving power from its underlying die, the die underneath it from the die directly below, etc., a bottom die and a processor die from a 2.5D interposer and the interposer from a laminate substrate which, in turn, gets its power from the PCB. The single-sided interconnects are not scalable since the 3D IC footprint is invariant to the number of dies implemented vertically. Take HBM DRAM stacks for instance, the number of dies in the stack increases from 5 for HBM1 to 13 for HBM3. The one-sided electrical interconnects impose a severe constraint on PPAC optimization of 3D ICs.

SUMMARY

One aspect of the present disclosure provides an IC stack, which includes: a plurality of integrated circuit (IC) structure horizontally separate with each other, wherein each IC structure comprises a top surface, a bottom surface opposite to the top surface, and four sidewalls with a first sidewall, a second sidewall, a third sidewall and a fourth sidewall; wherein the area of the bottom surface or the top surface is larger than that of any sidewall; a laterally extending RDL structure covering each first sidewall of the plurality of IC structures; and an upward extending thermal conductivity layer between two adjacent IC structures.

Another aspect of the present disclosure provides an IC stack, which includes: a plurality of integrated circuit (IC) structure horizontally separate with each other, wherein each IC structure comprises a top surface, a bottom surface opposite to the top surface, and four sidewalls with a first sidewall, a second sidewall, a third sidewall and a fourth sidewall; wherein the area of the bottom surface or the top surface is larger than that of any of the four sidewalls; a set of upward extending thermal conductivity layers, wherein a corresponding upward extending thermal conductivity layer is disposed between any two adjacent IC structures of the plurality of IC structures; and a first laterally extending thermal conductivity layer covering each second sidewall of the plurality of IC structures and thermally coupling to the set of upward extending thermal conductivity layers.

In the present disclosure, four untapped sidewalls of a 3D IC stack are used for interconnecting dies in the 3D IC stack to allow for skip-die and multi-sided signal and power distribution and heat dissipation. As a result, power and signal routes and heat dissipation paths can be supplied from a bottom die (or from an interposer supporting the bottom die) on a front side not only to the die directly above, but also to all other dies in the die stack. Routing areas, heat dissipation performance and design flexibility can thus be increased or enhanced without substantially increasing a footprint of the 3D IC, and performance can be improved due to more efficient interconnect strategies.

BRIEF DESCRIPTION OF THE DRAWINGS

Aspects of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

Figure 1A:
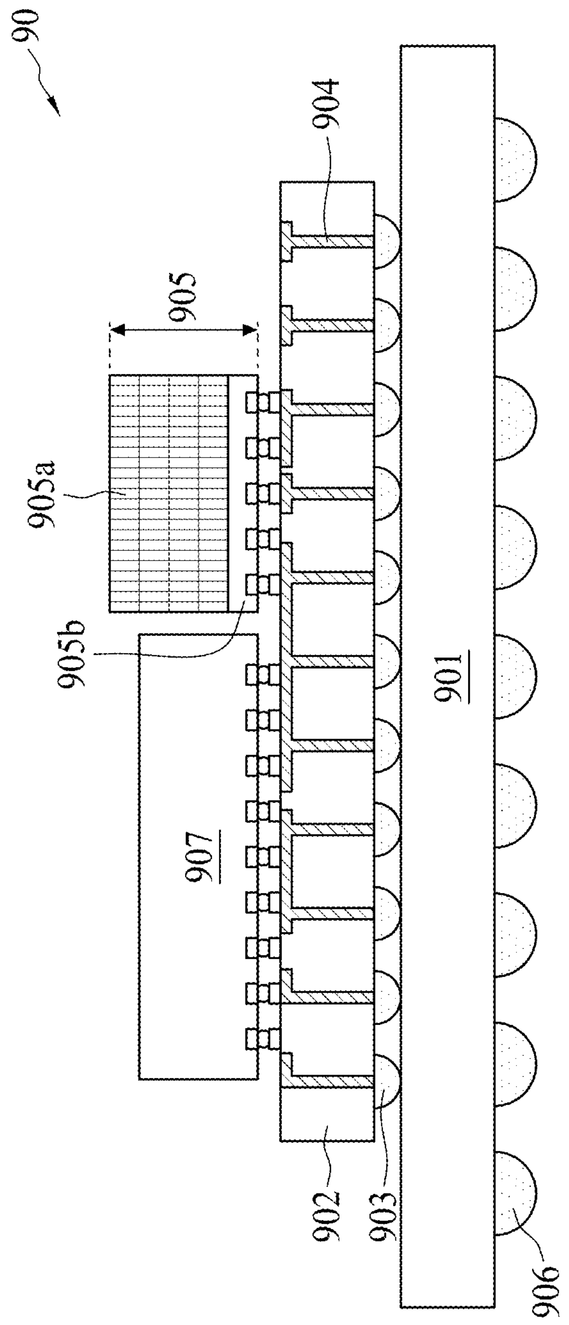
FIGS. 1A to 1F show various systems-in-a-package (SIPs), according to comparative embodiments of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings. Further, like reference numerals across different figures dictate similar features, and therefore a detailed explanation of the similar feature may be provided when such features are first introduced in the disclosure, and may not be subsequently repeated.

DETAILED DESCRIPTION

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Embodiments of the present invention disclose methodologies, processes and structures to create redistribution layers (RDL) and interconnects (e.g., through-silicon vias, through-mold vias, metal vias, metal pads for copper hybrid bonding, and micro-bumps or solder bumps for flip-chip assembly) on four side surfaces of 3D ICs and short 3D IC structure stacks (detailed descriptions of which are provided below), wherein each stacked layer consists of one or more ICs in an x-y direction (in-plane direction) and a z direction (out-of-plane direction or IC thickness direction).

Embodiments of the package structures proposed in the present disclosure allow for at least the following features: (a) five-sided power and signal distribution (through a front-side and four side faces of the 3D IC package); (b) skip-die and multi-sided interconnection (e.g., from a bottom die or a substrate such as an interposer directly to a top die and other ICs in the stack) through the four side faces and/or interior interconnections using combinations of RDLs, TSVs and through mold vias (TMVs); (c) RDLs on side surfaces to be interconnected in three dimensions through use of bendable flexible printed circuits (flexes); and (d) ability to use various interconnection technologies covering RDLs, TSVs, micro-bumps, solder bumps, copper hybrid bonds and fine-pitch Flexes. Therefore, the proposed package structures can effectively reduce lengths of global and IC packaging interconnect routes and increase a number of transistors visited within one clock cycle.

FIGS. 1A to 1F show various systems-in-a-package (SIPs), according to comparative embodiments of the present disclosure.

Figure 1B:
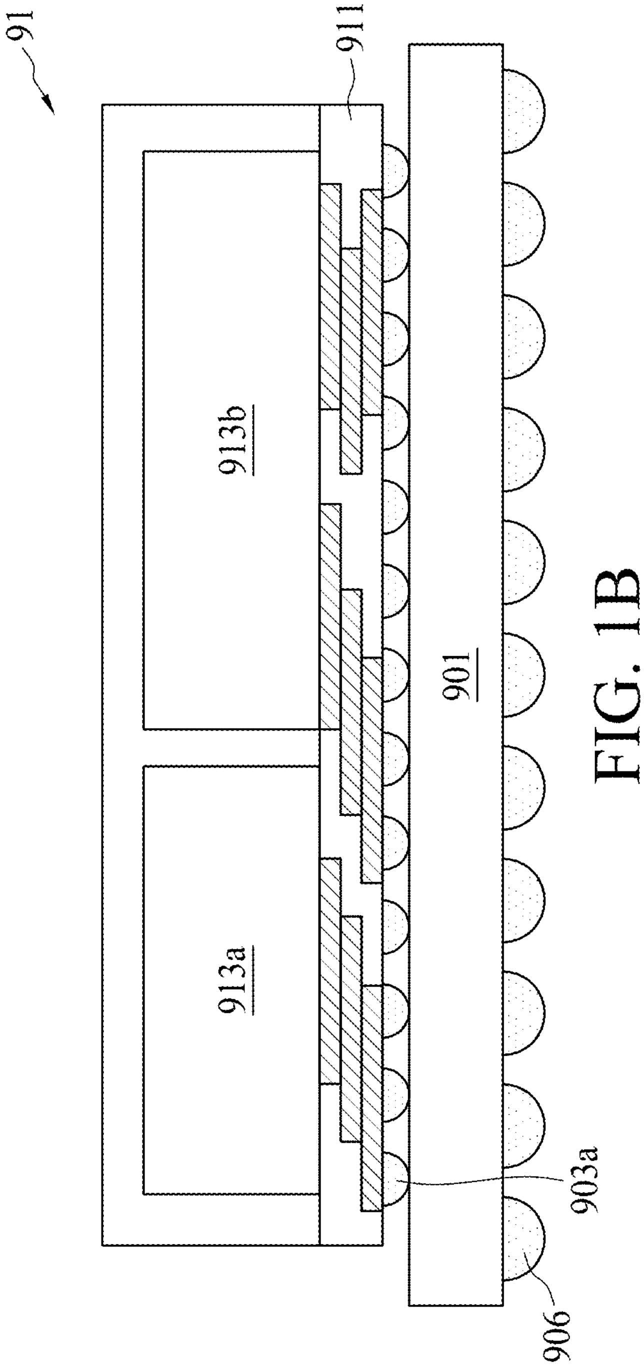
Figure 1C:
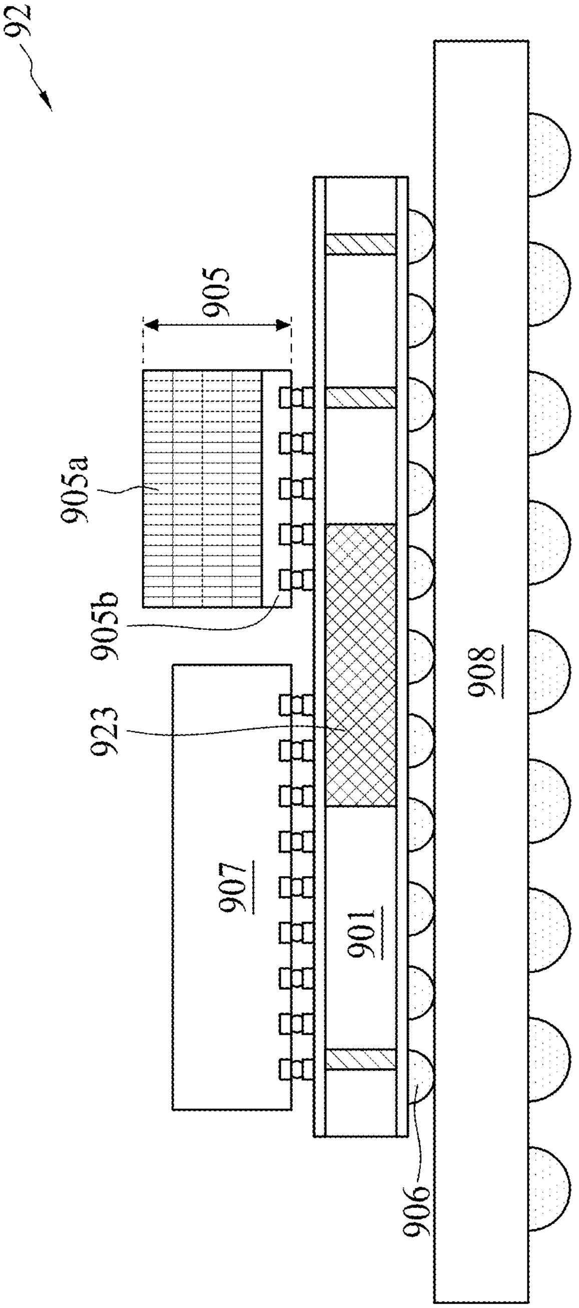
Figure 1D:
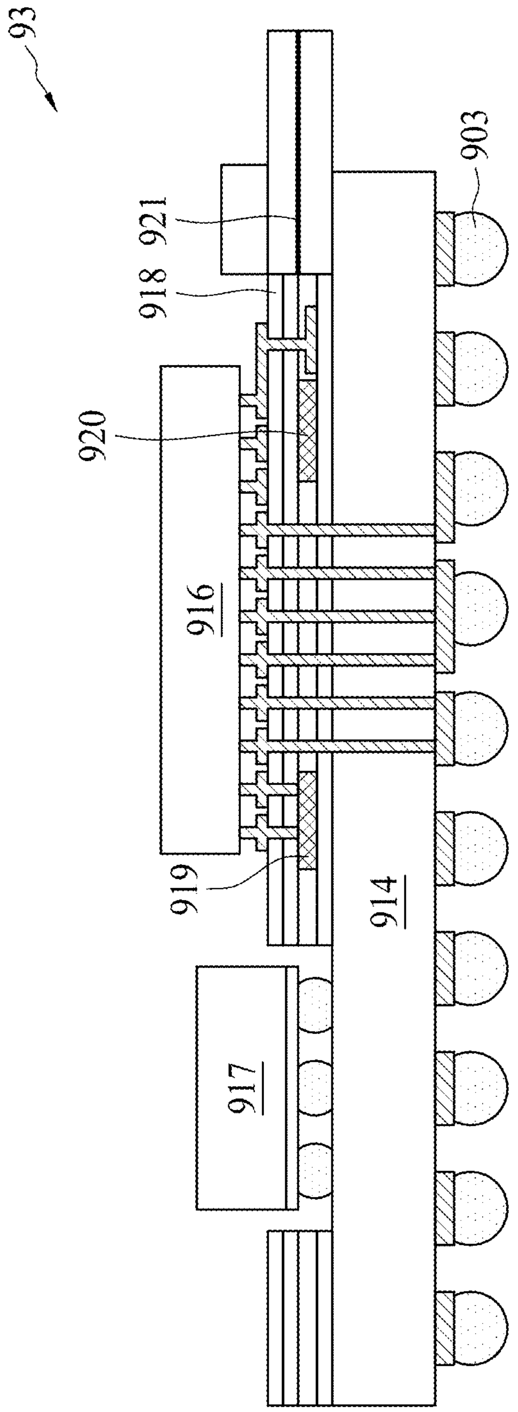
Figure 1E:
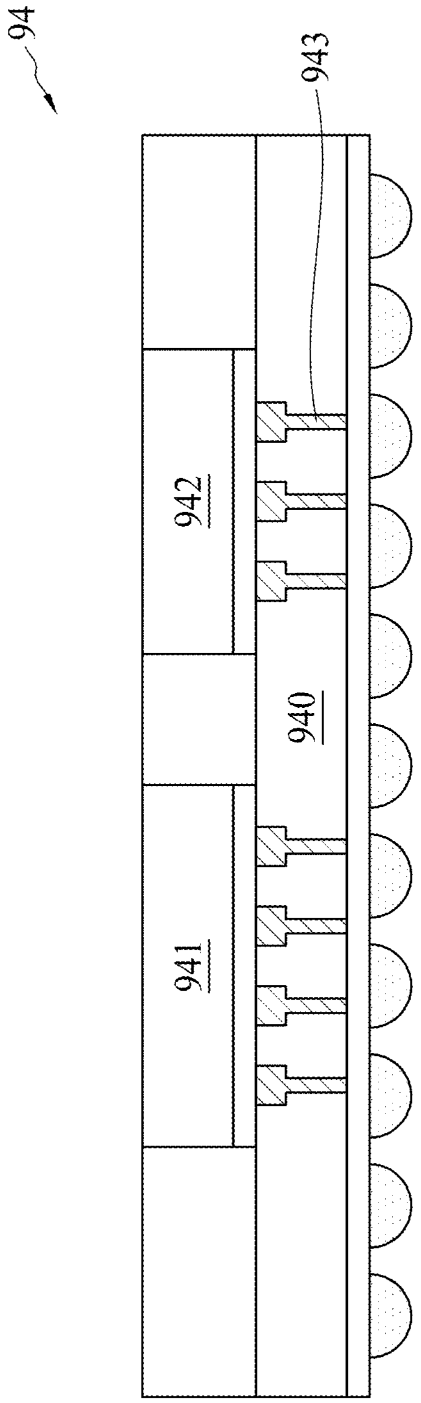
Figure 1F:
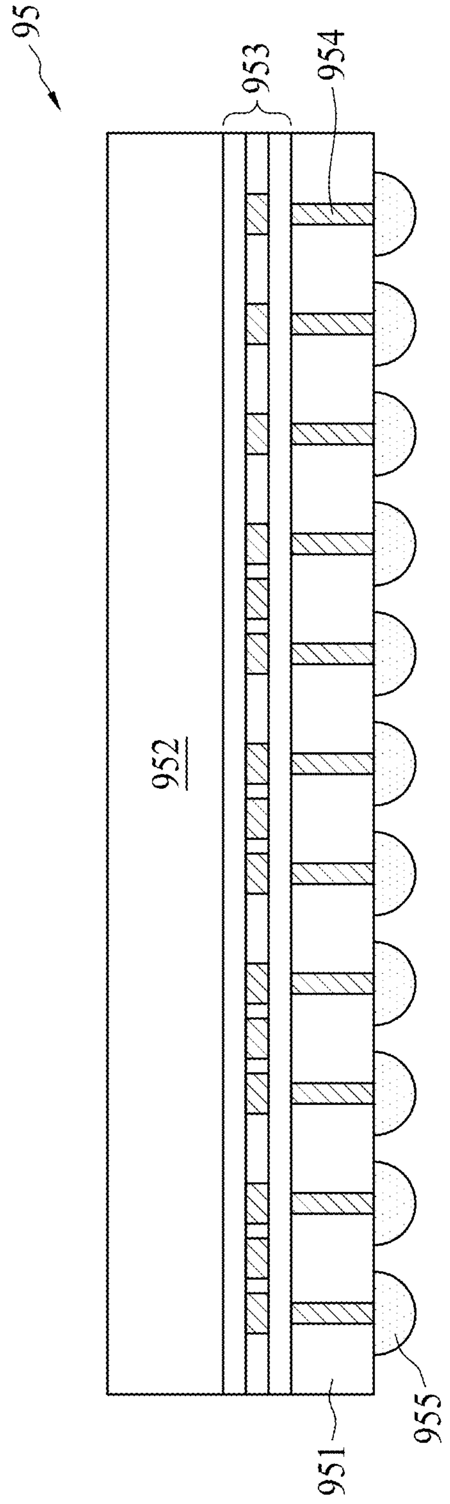

For high-end applications such as HPC, data centers, AI and smart handhelds, costs of IC (integrated circuit) scaling increase exponentially for system-on-chip (SoC) designs. Adding to complexity and cost are the industry's increasing reliance on complex advanced SiPs (system-in-package) to package advanced ICs. Advanced SiPs described herein include a 2.5D IC as shown in FIG. 1A, a fan-out SiP as shown in FIG. 1B, an embedded SiP as shown in FIG. 1C, silicon photonics as shown in FIG. 1D, a 3D IC assembled using chip-to-wafer (C2W) bonding as shown in FIG. 1E and a 3D IC assembled using wafer-to-wafer (W2W) bonding as shown in FIG. 1F. Advanced SiPs can also include chiplets-in-SiPs to enable high-end SoC partitioning using chiplets and one or more of the advanced SiP technologies and their enabling building block technologies shown in FIGS. 1A to 1F for improved yield, cost, time-to-market and performance. All advanced SiPs involve integration of multiple dies, and some SiPs (e.g., 2.5D and 3D ICs) can contain wafer-level components with tiny through-silicon vias (TSVs) as small as about 5 μm in diameter (and about 30 μm in depth, which is equivalent to a typical silicon substrate thickness) in thin active ICs such as HBM DRAM chips, as well as fine L (line width)/S (line spacing) redistribution layers (RDL) with an L/S of 2 μm/2 μm and below. All advanced SiPs commercially available today are packaged with single-sided power supply and signaling.

Referring to FIG. 1A, a 2.5D IC structure 90 includes a laminate substrate 901 supporting a silicon interposer 902 through a plurality of solder connections 903. The silicon interposer 902, which is commonly used in 2.5D IC packaging, contains through-silicon vias (TSVs) 904 and can be used as a platform to bridge a fine-line/spacing/pitch capability gap between the laminate substrate 901 and IC blocks covering a 3D IC such as an HBM DRAM stack, i.e., a memory structure 905 and a processor IC 907. A wide variety of electronic components, produced by wafer-level processes, can be disposed on the silicon interposer 902, and can include memory devices (e.g., 905), logic ICs (e.g., 907), MEMS (micro-electro-mechanical system) devices, and passive devices mounted on a top side (i.e., a chip side) of the silicon interposer 902, while the electronic components can be arranged in 2D IC, 2.5D IC or 3D IC package configurations. For instance, the memory structure 905 can be an HBM DRAM stack which includes a plurality of DRAM dies 905*a* vertically stacked over a base die (typically a control die) 905*b* through copper pillar micro-bumps. When needed, the interposer 902 and laminate substrate 901 combination can be replaced with a laminate substrate containing a silicon interconnect substrate which is either embedded in the substrate (FIG. 1C) or mounted on the substrate. As shown in FIG. 1A, the laminate substrate 901 upon which the silicon interposer 902 is bonded using micro-bumps or solder bumps can be bonded to a printed circuit board (PCB, not shown) through a plurality of ball grid array (BGA) solder balls 906 underneath the laminate substrate 901.

Referring to FIG. 1B, a fan-out package structure 91 can be adopted with electrical connections on chips 913*a* and 913*b*, wherein the electrical connections are fanned out from the active surfaces of chips 913*a* and 913*b* to enable placement of solder bumps 903*a* beyond the confines of the chips, which serve as external I/Os, distal to the chips 913*a* and 913*b*. The fan-out package structure 91, which can include one or more semiconductor chips (e.g., the chips 913*a* and 913*b*) allows individual chips to be connected to fan-out wiring layers 911 and to the solder bumps 903*a* or, alternatively, micro bumps, depending on applications. As depicted in FIG. 1B, the fan-out package structure 91, which is produced by wafer-level fan-out processes, is bonded to a substrate 901, wherein the substrate 901 can be a laminate substrate, an interposer or another fan-out package structure and which, in turn, is bonded to a next-level substrate using solder bumps or solder balls 906.

In FIG. 1C, an embedded SiP 92 includes one or more devices 923 embedded in a laminate substrate 901. The one or more devices 923 can be an embedded silicon interconnect (which can be either a passive device or an active device), an active device such as a power IC, or an embedded passive device such as a capacitor or an inductor. Furthermore, the laminate substrate 901, having the device 923 embedded therein, can be bonded to another laminate substrate or a PCB 908 through solder balls 906 or micro-bumps, depending on applications.

Referring to FIG. 1D, a silicon photonics structure 93 includes a CMOS die 916, a waveguide RDL structure 918, a modulator 919 and a photodetector 920 embedded in the waveguide RDL structure 918, and an optical fiber 921 coupling an optical signal into or out of the waveguide RDL structure 918. A laser diode 917 and the waveguide RDL structure 918 as well as the components coupled to the waveguide RDL structure 918 are integrated over a silicon interposer 914 without or with TSVs. The silicon interposer 914, which is produced by wafer-level processes, is configured to be mounted on a substrate through a plurality of solder bumps, or micro-bumps 903 for external connections.

Referring to FIG. 1E, a C2W structure 94 includes a first carrier 940, a first die 941, and a second die 942. The first die 941 and the second die 942 are placed over the first carrier 940 through various suitable bonding technologies including flip-chip assembly based on micro-bumps and copper hybrid bonding. The first carrier 940 can be an active device or a passive device including an interposer with through vias 943, and the first carrier 940 serves as a platform to interconnect the first die 941 and the second die 942 and a substrate (not shown) upon which the C2W structure 94 is mounted.

Referring to FIG. 1F, a W2W structure 95 includes a first carrier 951, a second carrier 952, and an interconnect layer 953 electrically coupling the first carrier 951 to the second carrier 952. The interconnect layer 953 includes flip-chip bonding, polyimide (PI)-to-PI or oxide-to-oxide based copper hybrid bonding, or another suitable bonding structure. Through vias 954 can be formed, for example, in the first carrier 951 to establish electrical connections between the first carrier 951, the second carrier 952, and a substrate (not shown) upon which the W2W structure 95 is mounted using solder bumps, micro-bumps or solder balls 955.

In FIGS. 1A to 1F, interconnection between components is achieved in practice today by flip-chip assembly based on solder bumps, micro-bumps or BGA solder balls. Copper hybrid bonding which is relatively new to high-end applications including HPC, data center and AI applications in principle can be employed to achieve finer-pitch bonding compared to flip-chip and higher density function integration as warranted by applications.

A 3D IC typically contains ICs and/or connectors (e.g., interposers) having top or bottom faces of a same or a similar size. In some embodiments of the present disclosure, a semiconductor package structure to be interconnected via its side faces can be an IC stack comprising ICs of a same or a similar size, or an IC stack consisting of a number of packaging layers embedded with ICs of different sizes but of the same size following embedding, or an IC stack of both ICs and embedded ICs of the same sizes. Embedding of ICs is achieved using a fanout-like process and a potting material, a molding compound, or an encapsulation material, which is a dielectric material to ensure that ICs of different sizes in different stacked layers are of the same sizes after embedding. As a result, side-face interconnections of the 3D IC are formed using conductive edge connections such as edge contact pads or edge vias in the RDL, edge through-silicon vias and edge through-mold vias residing at the edges of packaging layers. The components integrated in the 3D IC can serve different electronic functions and preferably are available as known-good dies or components. They can include ICs, other types of active devices such as MEMS (micro-electromechanical system) devices, and passive devices. This means an essentially unlimited choice of components is available for stacking and embedding.

Figure 2B:
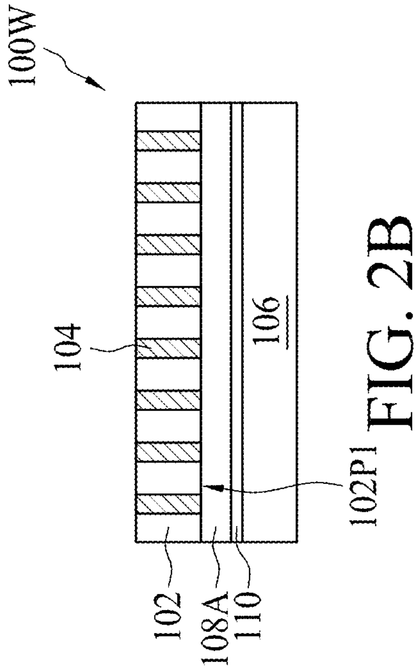
FIGS. 2A to 2C show cross-sectional views of structures in different stages of a method of manufacturing an integrated circuit (IC) structure, in accordance with some embodiments of the present disclosure.
Figure 2C:
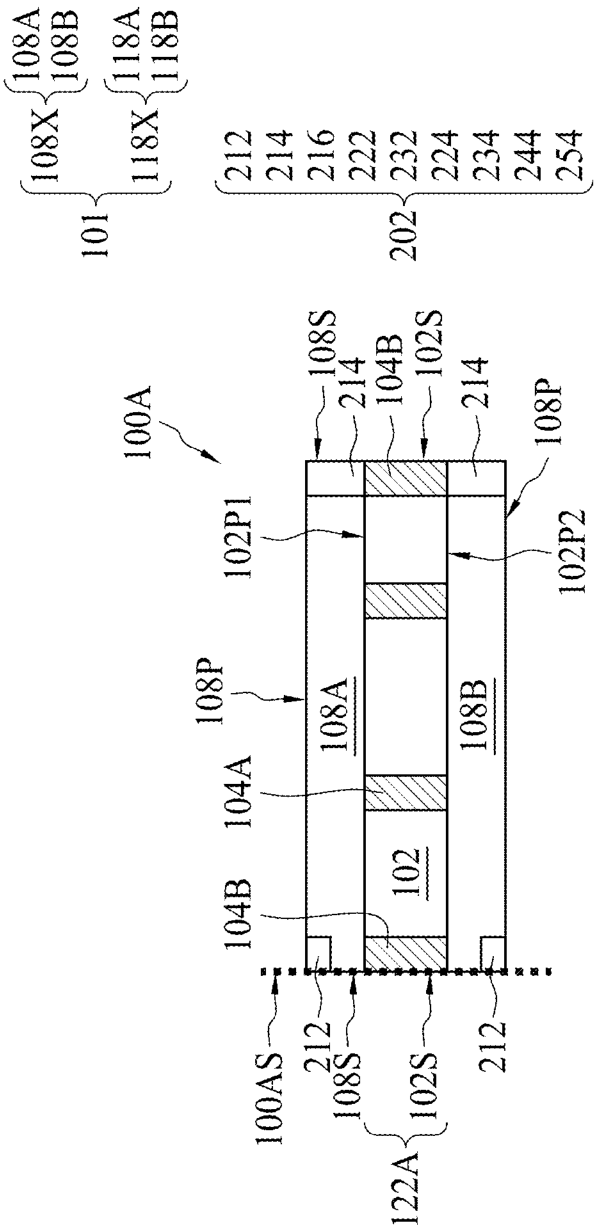
Figure 2A:
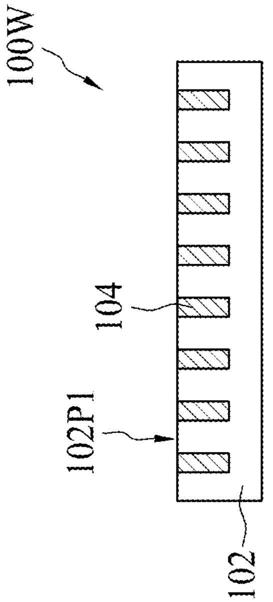

FIGS. 2A to 2C show cross-sectional views of structures in different stages of a method of manufacturing an IC structure 100A, in accordance with some embodiments of the present disclosure. According to some embodiments, the IC structure 100A shown in FIG. 2C is a semiconductor package device. The IC structure 100A may be formed from a semiconductor device 100W, which is a wafer-level device, wherein the IC structure 100A is formed by separating the semiconductor device 100W using a singulation or dicing process covering mechanical dicing, laser dicing, plasma etching or dicing, dry etching, wet etching (e.g., with an acid etch), the like, or a combination thereof.

Referring to FIG. 2A, the semiconductor device 100W is received or provided. Initially, a substrate 102 is provided or received. According to some embodiments, the substrate 102 is formed of a semiconductor material such as bulk silicon. According to some embodiments, the substrate 102 is formed of other semiconductor materials, such as silicon germanium, silicon carbide, gallium arsenide, or the like. In the present embodiment, the substrate 102 is a P-type semiconductive substrate (acceptor type). In some other embodiments, an N-type semiconductive substrate (donor type) can be used. Alternatively, the substrate 102 includes another elementary semiconductor, such as germanium; a compound semiconductor including gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; or a combination thereof. In yet another embodiment, the substrate 102 includes portions to form a semiconductor-oninsulator (SOI) substrate. In other embodiment, the substrate 102 may include a doped epitaxial layer, a gradient semiconductor layer, and/or a semiconductor layer overlaying another semiconductor layer of a different type, such as a silicon layer on a silicon germanium layer.

A plurality of conductive vias 104 are formed in the substrate 102. The conductive vias 104 may extend from a primary surface 102P1 of the substrate 102 to a thickness of the substrate 102. Throughout the present disclosure, "primary surface" is used to indicate an upper surface or a bottom surface of a circuit or a device, which has a greatest surface area among six surfaces of a device or a layer. Similarly, "secondary surface" is used to indicate a lateral side surface of a circuit or a device (there are often four such side surfaces of the circuit or device), which has a surface area less than the surface area of the primary surface. The conductive vias 104 may include conductive materials, such as copper, tungsten, molybdenum, cobalt, ruthenium, titanium, tantalum, aluminum, silver, gold, or other suitable materials. The conductive vias 104 may include a single layer, or multilayer structure which can include a diffusion barrier layer, a seed layer to aid in electroplating, a filling layer, a combination thereof, or the like.

In an exemplary forming process of the conductive vias 104, a plurality of holes (not shown) are formed on the primary surface 102P1 of the substrate 102. The holes may be formed using a dry etch (e.g., a reactive ion etch, RIE), a wet etch, a combination thereof, or the like. Following hole opening, a deposition process, e.g., plasma enhanced chemical vapor deposition (PECVD), can be used to deposit silicon dioxide to passivate the hole openings and physical vapor deposition (PVD), sputter deposition, atomic layer deposition (ALD), or other suitable deposition operations is performed to deposit the materials of the conductive vias 104 in the holes and over the primary surface 102P1. The conductive vias 104 may be referred to herein as through-silicon vias (TSV) after the hole filling process.

According to some embodiments, a planarization process, e.g., chemical mechanical planarization (CMP), dry etching (e.g., using RIE), grinding, wet etching and/or other suitable etching operations is performed to remove excess conductive materials and planarize upper surfaces of the conductive vias 104 which are flush with the primary surface 102P1. Following planarization, a primary RDL 108A is deposited on the primary surface 102P1 with surface finish and pads for subsequent bonding as needed.

Referring to FIG. 2B, another substrate or a temporary carrier 106 is provided or received and the semiconductor structure 100W is bonded to the temporary carrier 106. According to some embodiments, the substrate 106 is a carrier substrate or a supporting substrate. The carrier substrate 106 may be formed of glass, silicon, ceramics, or other suitable carrier materials. A release layer 110 is formed over the carrier substrate 106. Examples of the release layer include release/adhesion layers commonly used in fan-out processes. The release layer 110 is an temporary layer formed over the carrier substrate 106 and can allow for easier removal of the carrier substrate 106 from the semiconductor device 100W by laser irradiation, thermos-mechanical release, grinding, CMP, dry or wet etching/cleaning, or a combination thereof.

Besides the release layers used in fan-out processing, the release layer can also be a combination of Ti (titanium)/Au (gold) on the carrier and Ti/Au on the backside of an IC structure. Au here can also be Cu (copper) or a solder on both surfaces. Compression or reflow bonding can be used to achieve bonding of the carrier and the IC structure. Annealing is optional and can be done on an as-needed basis. When silicon is used as the carrier, the release layer can be $SiO_2$, $Si_3N_4$ and others that are common in wafer BEOL and/or MEMS/NEMS processing. The release layers as such may also serve as the permanent bonding layers between IC structures (such as those shown in FIG. 7B).

Pre-bonding conditioning of the carrier and the IC structure surfaces can involve:

Chemical mechanical polish (CMP) to achieve, preferably a surface roughness, RA (arithmetic average roughness or sometimes root mean square roughness) <1 nm for both diamond and silicon when needed. This level of RA can be achieved by CMP for silicon, and by a combination of sacrificial $SiO_2$ layer deposition, and $SiO_2$ planarization by CMP and deep reactive ion etching (DRIE) for diamond, Wet surface pre-treatments involving ultrasonic de-ionized (DI) water clean, $H_2SO_4/H_2O_2$ treatment, $NH_3/H_2O_2$ treatment, and $N_2$ blow dry Plasma/inductively coupled plasma reactive ion etching (ICP-RIE): $O_2$, $H_2/O_2$, Deep RIE (DRIE): $O_2/CF_4$, and Activation of the bonding surfaces (with and/or without the glue layers) inside bonding machines prior to bonding by a fast atom beam gun, FAB (using, for instance, argon neutral atom beam at ~1 keV), or by an ion gun (using for instance, argon ion at ~60 eV) to remove oxide films in vacuum and to reveal dangling bonds at the surfaces for bonding.

(Note 1: FAB works well for (sputtered) Si/Si, Si/$SiO_2$, metals, compound semiconductors and single crystal oxides, while ion guns is known to work for $SiO_2/SiO_2$, Glass, $Si_3N_4$ (silicon nitride)/$Si_3N_4$, Si/Si, Si/$SiO_2$, metals, compound semiconductor, and single crystal oxides.)

(Note 2: A vacuum of $10^{-6}$ Pa (pascal) is required during bonding to prevent re-adsorption to activated bonding surfaces.)

Besides the aforementioned direct bonding approaches, an ultrathin glue or bonding layer such as CVD poly-silicon (poly-Si) can be deposited on the mating IC structures (FIG. 7B) as a permanent bonding layer or on both the IC structure and the carrier as a temporary release layer to achieve high low-temperature direct bonding yield. For heat sensitive applications, poly-Si (whose thermal conductivity, TC, is more than 100 times that of $SiO_2$) is preferred over $SiO_2$ for use to create the thin bonding layers in terms of minimizing the thermal resistivity impact to the final IC or package structure. Glue layers are typically ultrathin, around 100 nm or less than 100 nm, to minimize their thermal impacts. When used as a permanent layer, higher-TC and lower-thermal expansion materials are preferred. Glue layer candidates include the following and their combinations (or alloys):

Non-metals: Si (e.g., poly-silicon), $SiO_2$, $Si_3N_4$, $Al_2O3_3$ (alumina), diamond, boron nitride, graphene Metals: Ti, W, Pt, Cr, Au, Cu, Ir, nickel (Ni), iron (Fe), Ag—In, Au—In, Ag, Sn, Mo Metal-on-oxides: Ir on $SrTiO_3$, Ir on YSZ/Si, Ir on MgO, sapphire or $TaO_3$ When metallic glue layers are used for bonding the IC structures (see, for instance, FIG. 7B), it is advisable to deposit a barrier layer such as Ti on the backside of the IC structures prior to glue layer deposition to prevent metal diffusion in silicon lattices which can poison the devices. This is particularly true for ultrathin ICs. Diamond growth on silicon seed is a common practice during diamond CVD.

Silicon nitride ($Si_3N_4$) is common in wafer BEOL processing. Alumina can be deposited by atom layer deposition. When it comes to extreme thermal conductivity, graphene is another material worth considering besides diamond. In monolayer, graphene can have a thermal conductivity of 30-50 W/cm·K. It can be considered as a glue or bonding layer assuming proper 3D molecular structures. Graphene can be grown on the silicon (100) surface using a direct cobalt-assisted two-step ion beam synthesis. It can also be grown on silicon through a simple transfer-free synthesis method. Epitaxial graphene can be grown on crystalline and semi-insulating surface (e.g., SiC and silicon), and graphene nanostructures with exceptional properties have been realized by a selective growth process on SiC surface. In addition to diamond and graphene, boron nitride merits attention with cubic boron nitride in particular as it is known to have a similar crystalline structure to diamond and a high in-plane TC (~16 W/cm·K). Furthermore, the glue layer can be a combination of Ti/Au on one IC structure and Ti/Au on the backside of another IC structure for bonding. Prior to Au deposition and as needed, thin metallization based on Ti, W or Cr can also be deposited. Thin layers of transient liquid bonding materials such as silver-indium (Ag—In) and Au—In, sintered Ag, In, Au or Cu can also be applied with matching metallization (e.g., Au, Ag or Cu). Glue layers can be deposited by CVD, atomic layer deposition (ALD), physical vapor deposition, thermal oxidation (in the case of silicon) or other means. Following deposition, glue layers can be conditioned through a combination of the aforementioned pre-bonding surface pre-treatments, DRIE (e.g., using a mixture of $SF_6$ and $O_2$), plasma/ICP-RIE (using $O_2$, Ar, $N_2$, Ar/$O_2$), and FAB (using, e.g., Ar neutral atom) or ion gun (using, e.g., Ar ion) in bonding stations.

Following the creation of the primary RDL 108A, the planarized structure with the primary RDL 108A is bonded to the substrate 106 with the help of the release layer through- and the bulk portion of the substrate 102 underlying the conductive vias 104 is removed to expose bottom surfaces of the conductive vias 104 (see FIG. 2B). Another RDL 108B can then be deposited on the revealed conductive vias 104 in FIG. 2B, complete with surface finish and solder bumps or micro-bumps as needed. Following the formation of the RDL 108B, mounting of the resultant structure with the RDL 108A and 108B on the carrier 106 on a wafer mount tape frame, release of the carrier 106, and singulation of the individual packages, the semiconductor structure 100A in FIG. 2C is formed.

Figure 2D:
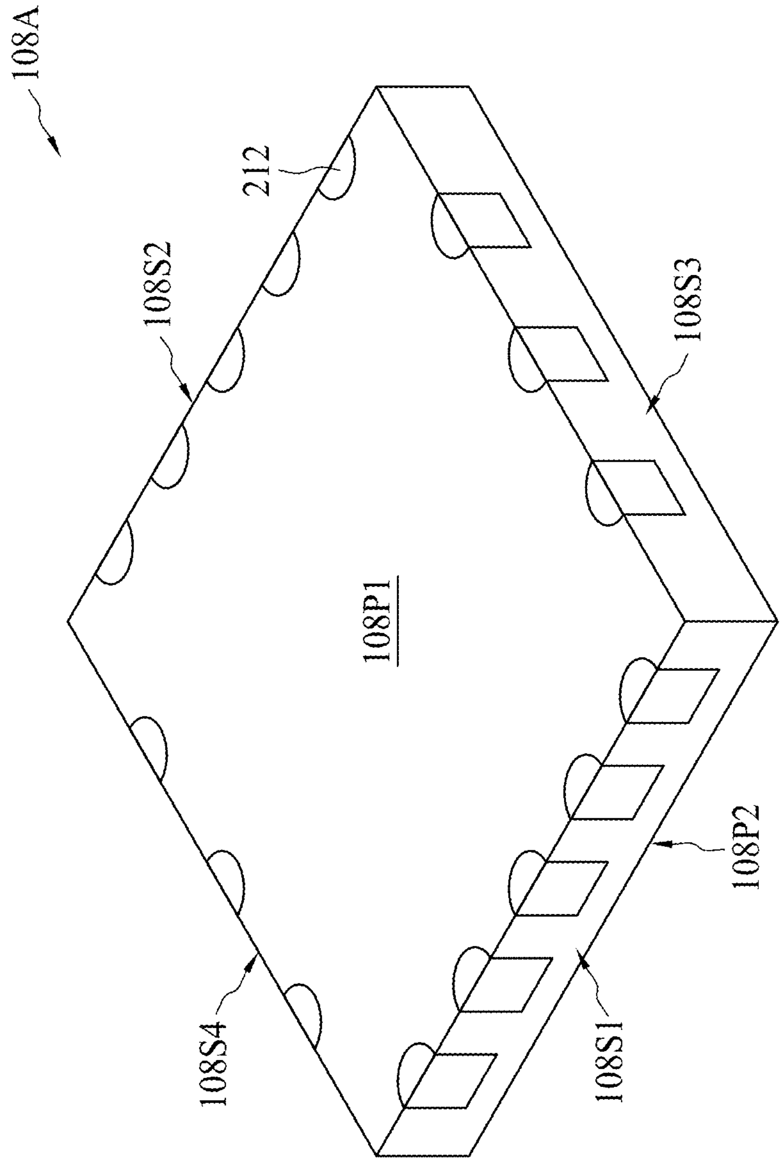
FIG. 2D shows a perspective view of a redistribution layer, in accordance with various embodiments of the present disclosure.
Figure 2F:
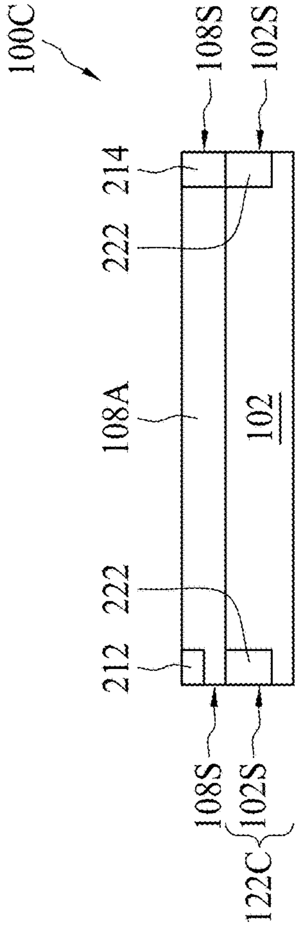
FIGS. 2E and 2F show cross-sectional views of an IC structure, in accordance with various embodiments of the present disclosure.

Based on the processes shown in FIGS. 2A to 2C, various layers, and structures can be formed to create the semiconductor structure 100A containing exposed edge pads, edge vias and edge TSVs which can go all the way or partially through the thickness of the silicon or the potting material, or its subset, for instance, a structure containing only the RDL 108A with edge pad/via interconnections in the RDL (FIG. 2E), or a structure containing both the RDL 108A with edge interconnections and edge TSVs (see FIG. 2F).

According to some embodiments, the release layer 110 includes a polymer-based material. According to some embodiments, the release layer 110 is an epoxy-based thermal release material, such as a light-to-heat-conversion (LTHC) release coating, which loses its adhesive property when heated or exposed to a laser. According to other embodiments, the release layer 110 is an ultraviolet (UV) glue, which loses its adhesive property when exposed to UV light. The release layer 110 may be thermoplastic or thermoset material. According to some embodiments, the release layer 110 includes polyimide or silicone-based materials. According to some other embodiments, the release layer 110 is a mixture of metal and non-metal materials. Metal candidates of the release layer can include nickel, chromium, titanium, gold, copper, manganese, iron, cobalt, tungsten, molybdenum, ruthenium, and tantalum, whereas non-metal candidates can include oxides, nitrides, phosphates and chromates of the metals. The release layer 110 may be disposed by spin-coating as a liquid and cured. In other embodiments, the release layer 110 may be a laminate film laminated on the carrier substrate 106. In yet some other embodiments, bonding between the substrate 102 and the temporary carrier 106 can be achieved by direct bonding based on, for instance, oxide-to-oxide or polyimide-to-polyimide without needing the release layer 110.

The RDL 108A is part of an interconnect structure 101 of the IC structure 100A. The RDL 108A includes one or more interconnected conduction paths formed through one or more conductive lines in conductive line layers and one or more conductive vias in conductive via layers (not separately shown) to route power and signals of a first circuit from one side of the RDL 108A to a second circuit on the same side or on an opposite side of the RDL 108A. The RDL 108A may include an encapsulating material (or an encapsulant such as a polyimide or an oxide layer to facilitate direct or copper hybrid bonding) encapsulating the conductive line layers and the conductive via layers. According to some embodiments, the encapsulating material includes one or more dielectric materials, e.g., silicon oxide, silicon nitride, silicon carbide, silicon oxynitride, polyimide, a combination thereof, or the like. Due to use of the RDL 108A of the interconnect structure 101, distribution of signals and power of devices or circuits in the IC structure 100A can meet design requirements. Throughout the present disclosure, an RDL, e.g., the RDL 108A, which is formed on a primary surface, e.g., the primary surface 102P1, of a circuit or a device is referred to as a primary RDL 108A. More structural details of the primary RDL 108A are discussed below.

According to some embodiments, the substrate 102 is arranged over and bonded to the primary RDL 108A. The bonding of the substrate 102 to the primary RDL 108A may be performed using thermal bonding, thermos-compression bonding, flip-chip bonding, hybrid bonding, or the like. Although not illustrated, the conductive vias 104 of the substrate 102 are electrically coupled to one of the conductive lines or one of the conductive vias of the primary RDL 108A to extend a signal-delivery network or a power-delivery network of the RDL 108A. Further, an upper portion of the substrate 102 is removed or thinned from a top portion of the substrate 102. The bottom surfaces of the conductive vias 104 are exposed accordingly. The removal or thinning of the upper portion of the substrate 102 may be performed using CMP, grinding, a dry etch (e.g., RIE), a wet etch, or the like. The conductive vias 104 then become the TSVs 104 accordingly.

Referring to FIG. 2C, a singulation or dicing process is performed to separate the semiconductor device 100W into individual IC structures 100A following mounting of the structure with RDL 108A and RDL 108B on a wafer mount frame, and release of the carrier 106. The singulation or dicing process may be performed using a diamond blade, a laser, a plasma with a masking layer deposited on, for instance, the RDL 108A, wet etching or a combination thereof to singulate the semiconductor devices 100W along scribe lines to form the individual IC structures 100A. The interconnect structure 101 in the IC structure 100A comprises the TSV die 122A, an interior interconnect structure 108X such as interior pads and vias in the RDLs 108A, 108B, and an edge interconnect structure 118X such as edge pads and vias in the RDLs.

During singulation or dicing, the areas that are cut away are called dicing, saw or die streets and they are typically between 50 μm to 100 μm wide. Dicing saw may use a diamond blade which rotates at 30,000 rounds per minute and is cooled with de-ionized water. To reveal the edge pads or vias, it is preferable that the sizes of the edge pads or vias are comparable to the dicing street width and dicing is carried out in immediate vicinity of the edge pads or vias (but not directly through the edge pads or vias), followed by light wet etching of the silicon as needed and warranted. To minimize bottom side chipping during mechanical blade dicing, it can be advantageous to dice the wafer first with the carrier support, followed by carrier release. Laser ablation dicing which can enable a dicing street width of 10 μm can also be used first to remove the fine wire layer on the dicing street's surface (and expose the edge pads adjacent to it) using a non-contact laser, followed by cutting the residual substrate with laser scribing and/or blade dicing. This process reduces problems like chipping, die cracking, and layer peeling. In laser ablation dicing, the laser heats the material to such a temperature that the area under the laser spot is ablated or simply vaporized. Alternatively, dicing can be carried out by stealth dicing which is dry and does not require liquid. Stealth dicing works as a two-stage process in which a laser beam (e.g., a pulsed Nd:YAG laser at the 1064 nm wavelength for silicon) is first directed to scan along intended cut lines to create defect regions and then an underlying membrane film (which is attached to wafer, followed by wafer carrier release) is expanded to induce fracture. Stealth laser dicing has the potential to replace blade dicing as a next generation ultrathin wafer singulation technology in support of 3D IC packaging as stealth laser allows for faster cutting, higher accuracy, less damage, and a smaller dicing street width. In comparison with mechanical and laser dicing, plasma dicing (also known as deep reactive ion etching) is a relatively new method of applying the Bosch dry etch process that can render the dies particle- and contamination-free with high-precision cuts. This method requires a custom mask design for effective plasma dicing. It etches all narrow dicing streets at the same time into the wafer using a plasma gas such as sulfur hexafluoride, resulting in high precision, throughputs and quality. Plasma dicing can produce cuts that are non-rectangular in shape, which is beyond the reach of blade dicing. Plasma dicing causes minimal damage to the wafer surface or trench sidewall, resulting in better die strengths, improved device reliability, and longer device life. Plasma dicing is fast gaining popularity within the semiconductor industry as the preferred solution, particularly as chips become smaller, thinner and more complex.

As a result of the singulation or dicing process, the IC structure 100A includes four secondary planes or side planes 100AS, although FIG. 2D only illustrates two secondary planes 100AS. The TSV die 122A includes side surfaces 102S on its four sides, while the primary RDL 108A and the primary RDL 108B include side surfaces 108S on their four sides. The side surface 102S of the TSV die 122A and the side surfaces 108S of the two primary RDLs, 108A, and 108B, together constitute or coincide with the secondary plane 100AS of the IC structure 100A. Through appropriate arrangement, the TSVs 104 are formed in the TSV die 122A and comprise two TSV types after the singulation or dicing process: interior TSVs 104A and edge TSVs 104B, wherein the interior TSV 104A is fully surrounded by the substrate 102 and the primary RDLs 108A and 108B, while the edge TSV 104B has at least one side surface exposed through the side surfaces 102S of the substrate 102.

Similarly, the primary RDL 108A or 108B includes conductive pads 212 and conductive vias 214, formed from conductive elements 202 such as the conductive lines and the conductive vias, respectively, wherein the conductive elements 202 comprise two parts: interior conductive elements 202 and edge conductive elements 202. Through appropriate arrangement, the conductive pads 212 and the conductive vias 214 are formed in the IC structure 100A and comprise two parts after the singulation or dicing processes: interior conductive pads/vias, 212 and 214, and edge conductive pads/vias, 212 and 214, in which the interior conductive pads/vias, 212 and 214, are fully surrounded by the substrate material and the encapsulating material of the two primary RDLs, 108A and 108B, while the edge conductive pads/vias 212, 214 have at least one side surface exposed through the side surfaces 108S of the primary RDL, 108A or 108B.

According to some embodiments, the edge conductive pads 212 have at least one upper surface exposed through a primary surface 108P of the primary RDL 108A or 108B. The interior or edge conductive pads 212 may be arranged on a topmost conductive line layer of the respective primary RDL 108A or 108B, which is most distal to the TSV die 122A. According to some embodiments, the conductive pads 212 are arranged parallel to the primary surface 108P of the primary RDL 108A or 108B. The conductive pads 212 may stop short of the TSV die 122A. Further, the edge conductive pads 212 have at least one side surface exposed through the secondary plane 100AS of the IC structure 100A or the secondary surface 108S of the primary RDL 108A or 108B.

Likewise, according to some embodiments, the edge conductive vias 214 have at least one upper surface exposed through the primary surface 108P of the primary RDL 108A or 108B. The edge conductive vias 214 may be arranged to extend through a thickness (in a z-direction) of the respective primary RDL 108A or 108B. According to some embodiments, the edge conductive vias 214 are referred to herein as the TSVs of the primary RDL 108A or 108B. Further, the edge conductive vias 214 have at least one side surface exposed through the secondary plane 100AS of the IC structure 100A or the secondary surface 108S of the primary RDL 108A or 108B.

FIG. 2D shows a perspective view of the primary RDL 108A or 108B, in accordance with various embodiments of the present disclosure. The primary RDL 108A or 108B includes primary surfaces 108P, e.g., an upper primary surface 108P1 and a lower primary surface 108P2, and four secondary (side) surfaces 108S, e.g., a front secondary surface 108S1, a rear secondary surface 108S2, a right secondary surface 108S3 and a left secondary surface 108S4. A plurality of conductive elements 202, e.g., the conductive pads/vias 212, are formed on the primary RDL 108A or 108B and exposed through the four secondary surfaces 108S. The arrangement of the conductive pads 212 of the primary RDL 108A or 108B in FIG. 2D is shown for illustrative purposes. The conductive pad 212 or other conductive elements can be formed or exposed through one or more of the four secondary surfaces 108S.

As discussed above, throughout the present disclosure, the TSVs 104 (see 104A and 104B in FIG. 2C), the conductive pads 212, the conductive vias 214 and all other conductive members of the interconnect structure 101 in FIG. 2C are part of what are collectively referred to as the conductive elements 202 in the interconnect structure 101 of the IC structure 100A. The TSVs 104, the conductive pads 212 and the conductive vias 214 are configured to form at least part of the interconnect structure 101 of the IC structure 100A for fan-in or fan-out interconnections for devices or package layers to be electrically coupled to the IC structure 100A through the two primary surfaces 108P in FIG. 2C (i.e., the upper primary surface 108P1 and the lower primary surface 108P2; see FIG. 2D) of the IC structure 100A, as well as through the four secondary surfaces, 108S1 through 108S4 (see FIG. 2D), of the IC structure 100A. According to some embodiments, the TSVs 104 and the conductive vias 214 of the primary RDLs 108A and 108B can be coupled to form a collective TSV of the IC structure 100A. For example, the right-side edge conductive via 214 (FIG. 2C) of the primary RDL 108A, the right-side edge TSV 104 and the right-side edge conductive via 214 of the primary RDL 108B constitute a stacked edge TSV of the IC structure 100A to extend through the substrate thickness of the IC structure 100A.

Figure 2E:
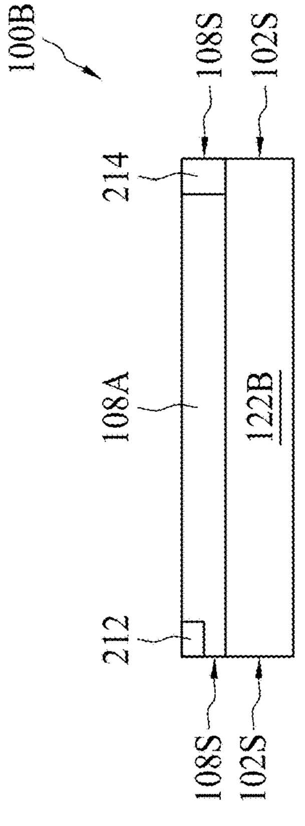

FIG. 2E shows a cross-sectional view of an IC structure 100B, in accordance with various embodiments of the present disclosure. The IC structure 100B is similar to the IC structure 100A in many aspects, e.g., the primary RDL 108A, the conductive pad 212 and the conductive via 214, and therefore details of such similar aspects are not repeated for brevity. A main difference between the IC structure 100A and the IC structure 100B is that the TSV die 122A of the IC structure 100A is replaced with a semiconductor die 122B in the IC structure 100B, and the primary RDL 108B in the IC structure 100A is absent from the IC structure 100B. According to some embodiments, the semiconductor die 122B can be at least one of a CPU die, a GPU die, a TPU die, a MEMS die, an AP die, an FPGA die, an ASIC die, a memory die, a transceiver die, a network interface die, an integrated photonics die, a packet buffer/router die or another suitable die. The semiconductor die 122B may include a substrate 102 comprising a material similar to that of the substrate 102 of the IC structure 100A shown in FIG. 2D. The semiconductor die 122B therefore constitutes a substrate or body of the IC structure 100B. According to some embodiments, the semiconductor die 122B does not include any edge interconnect structure 118X exposed through the side surfaces 102S of the semiconductor die 122B.

FIG. 2F shows a cross-sectional view of an IC structure 100C, in accordance with various embodiments of the present disclosure. The IC structure 100C is similar to the IC structure 100B in many aspects, e.g., the primary RDL 108A, the conductive pad 212, and the conductive via 214, and therefore details of such similar aspects are not repeated for brevity. Further, the IC structure 100C includes a semiconductor die 122C, which can be at least one of a CPU die, a GPU die, a TPU die, a MEMS die, an AP die, an FPGA die, an ASIC die, a memory die, a transceiver die, a network interface die, an integrated photonics die, a packet buffer/router die or another suitable die. The semiconductor die 122C may include a substrate 102 similar to the substrate 102 of the IC structure 100A shown in FIG. 2D. A main difference between the semiconductor die 122C and the semiconductor die 122B is that the semiconductor die 122C further includes an edge interconnect structure 118X, e.g., edge conductive pads 222, exposed through the secondary planes or side surfaces 102S of the semiconductor die 122C. According to some embodiments, an edge conductive pad 222 is electrically connected to the conductive via 214 of the primary RDL 108A for establishing a stacked conductive via for the semiconductor die 122C. The semiconductor die 122C therefore constitutes a body of the IC structure 100C.

Figure 2G:
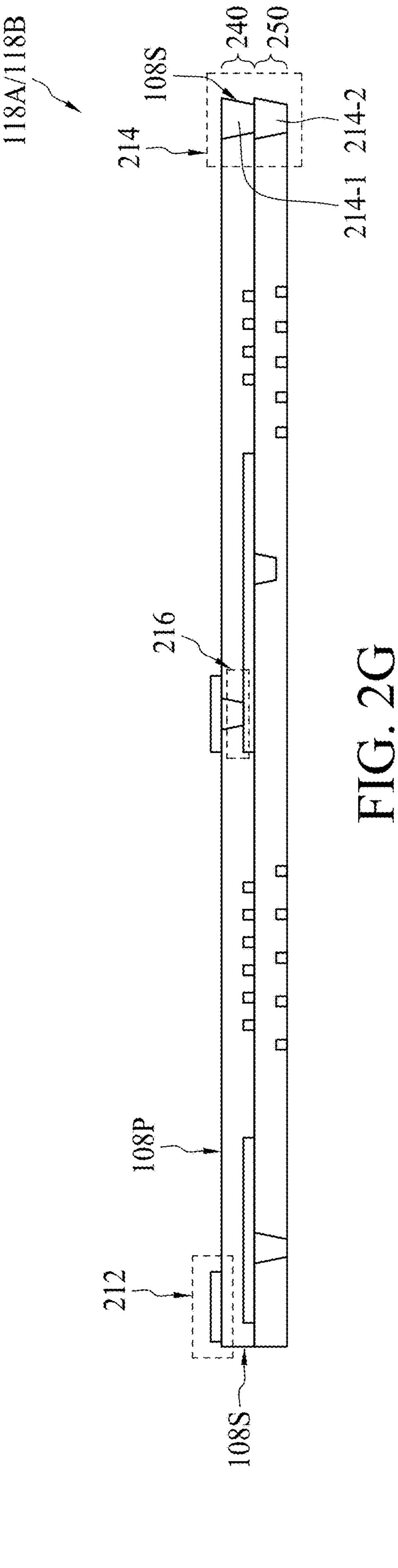
FIG. 2G shows a cross-sectional view of a redistribution layer of the IC structure shown in FIGS. 2B, 2C, 2E and 2F, in accordance with various embodiments of the present disclosure.

FIG. 2G shows a cross-sectional view of a primary RDL 108A or 108B of the IC structure 100A, 100B or 100C shown in FIGS. 2B to 2F, in accordance with various embodiments of the present disclosure. As illustrated in FIG. 2G, the primary RDL 108A or 108B is formed of a first major conductive line/via layer 240 and a second major conductive line/via layer 250 under the first major conductive line/via layer 240. Each of the first major conductive line/via layer 240 and the second major conductive line/via layer 250 includes one or more conductive lines and conductive vias (all of which are part of the collective conductive elements 202 of the interconnect structure 101 in the primary RDL 108A or 108B) extending in a horizontal or vertical direction. The conductive lines or vias are electrically insulated by a dielectric layer, referred to as an inter-metal dielectric (IMD) layer. The IMD layer may include one or more dielectric materials, such as silicon oxide, silicon nitride, silicon oxynitride, silicon carbide, polyimide, or other suitable dielectric materials. Some of the conductive vias in the first major conductive line/via layer 240 extend half-way in the vertical direction, while some of the conductive vias, e.g., a conductive via 214-1, in the first major conductive line/via layer 240, extend through an entire thickness of the first major conductive line/via layer 240. Similarly, some of the conductive vias in the second major conductive line/via layer 250 extend halfway in the vertical direction, while some of the conductive vias, e.g., a conductive via 214-2, in the second major conductive line/via layer 250, extend through a thickness of the second major conductive line/via layer 250. The conductive vias 214-1 and 214-2 are electrically connected to form a stacked conductive via 214 of the primary RDL 108A or 108B traversing the primary RDL 108A or 108B. According to some embodiments, the first major conductive line/via layer 240 includes two conductive line layers and a conductive via layer between the two conductive line layers, wherein a conductive via 216 is arranged in the conductive via layer to electrically connect two conductive lines in the adjacent conductive line layers, Referring to FIG. 2F and FIG. 2G, the conductive via 214 of the IC structure 100C shown in FIG. 2F is considered a conductive via connecting the adjacent first and second major conductive line/via layers, 240 and 250. According to some embodiments, the stacked conductive via 214 is part of the edge interconnect structure 118X and is exposed through a secondary surface 108S of the primary RDL 108A or 108B. Although FIG. 2G illustrates only two major conductive line/via layers, 240 and 250, the present disclosure is not limited thereto. Other numbers of major conductive line/via layers and configurations of conductive lines or conductive vias in each major conductive line/via layer are also within the contemplated scope of the present disclosure.

Figure 3A:
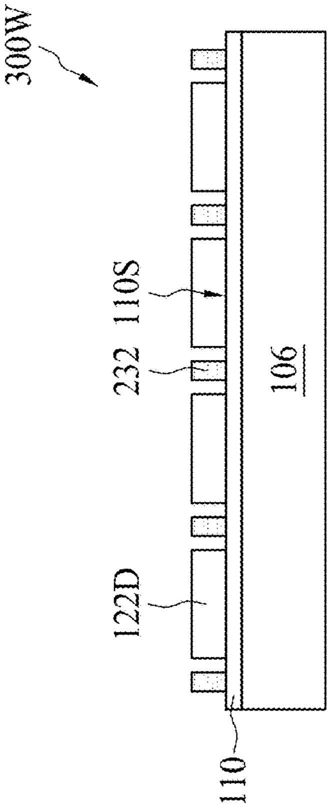
FIGS. 3A to 3D show cross-sectional views of structures in different stages of a method of manufacturing an IC structure, in accordance with some embodiments of the present disclosure.
Figure 3B:
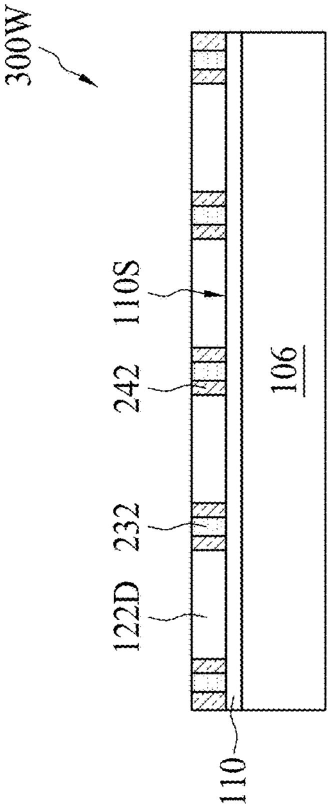
Figure 3C:
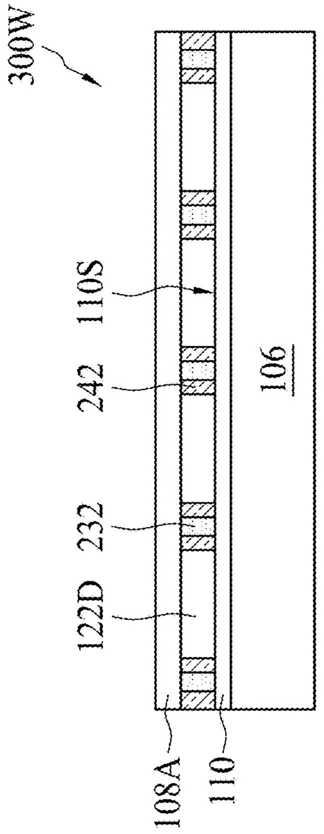
Figure 3D:
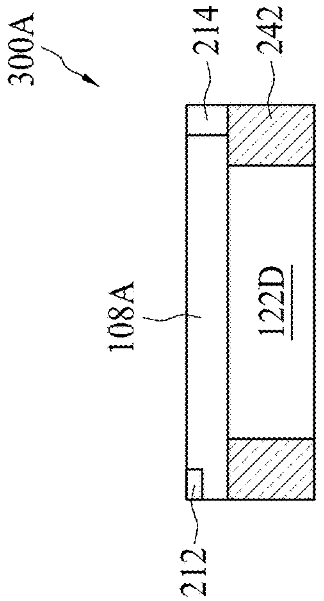

FIGS. 3A to 3D show cross-sectional views of structures in different stages of a method of manufacturing an IC structure 300A, in accordance with some embodiments of the present disclosure. According to some embodiments, the IC structure 300A shown in FIG. 3D is a semiconductor package device. The IC structure 300A may be formed from a semiconductor device 300W, which is a wafer-level device, wherein the IC structure 300A is formed by separating the semiconductor device 300W using a singulation or dicing process.

Referring to FIG. 3A, the carrier substrate 106 is received or provided. Further, the release layer 110 is formed over the carrier substrate 106 as in the case of FIGS. 2A to 2C. A plurality of semiconductor dies 122D are arranged over the release layer 110. The semiconductor die 122D may include at least one of a CPU die, a GPU die, a TPU die, a MEMS die, an AP die, an FPGA die, an ASIC die, a memory die, a transceiver die, a network interface die, an integrated photonics die, a packet buffer/router die or another suitable die. Further, a plurality of conductive pillars or vias 232 are created over the release layer 110 in between adjacent semiconductor dies 122D with suitable pitches and are encapsulated by a molding compound or a suitable potting material (such as an epoxy, for instance, Epotek 377) as shown in FIG. 3B. The conductive vias 232 may be alternately created in the semiconductor dies 122D. The plurality of semiconductor dies 122D and the conductive vias (pillars) 232 are referred to herein as a reconstituted structure and arranged on a carrier surface 110S of the release layer 110 or the carrier substrate 106. The conductive vias 232 may include a conductive material, e.g., tungsten, copper, titanium, tantalum, molybdenum, ruthenium, cobalt, aluminum, silver, gold, or another suitable material. The plurality of semiconductor dies 122D and the conductive vias 232 may have substantially equal heights. According to some embodiments, the semiconductor dies 122D and the conductive vias 232 are arranged over the release layer 110 by a pick-and-place bonding process.

Referring to FIG. 3B, the reconstituted structure of the semiconductor device 300W is molded or encapsulated using a potting material (e.g., an encapsulating material, a molding material or an insulating element) 242. The potting material 242 may include a dielectric material, such as silicon oxide, silicon nitride, silicon carbide, silicon oxynitride, epoxy-based molding material, a polymeric material, or the like. A molding or a deposition process is performed to deposit the potting material 242 in between the semiconductor dies 122D and the conductive vias 232 which can be created prior to bonding of the semiconductor dies 122D and potting material deposition. According to some embodiments, a planarization process, e.g., CMP, grinding, wet etching, a dry etch (e.g., RIE), and/or another suitable etching operation, is performed to remove excess potting material 242 and planarize an upper surface of the potting material 242 revealing the conductive vias 232 from the upper surfaces of the semiconductor dies 122D. According to some embodiments, since the conductive vias 232 are within and laterally surrounded by the potting material 242, the conductive vias 232 are also referred to herein as through-molding vias (TMV) 232.

Referring to FIG. 3C, the primary RDL 108A is formed over the upper surfaces of the potting material 242, the semiconductor dies 122D and the TMVs 232. Materials, configurations and methods of forming the primary RDL 108A are similar to those described with reference to FIGS. 2B to 2G, and repeated description of the primary RDL 108A is omitted for brevity.

Referring to FIG. 3D, a singulation or dicing process is performed to separate the semiconductor device 300W into individual IC structures 300A. Further, the carrier substrate 106 is removed or detached from the semiconductor device 300W by releasing the release layer 110 from the semiconductor device 300W. Through appropriate arrangement, the conductive pads/vias 212/214 are formed in the IC structure 300A and comprise two pad/via types after the singulation or dicing process: interior conductive pads/vias (not separately shown) 212 and edge conductive pads/vias 214. Properties of the conductive pads/vias 212 and the conductive pads/vias 214 are similar to those of the IC structure 100C shown in FIG. 2F, and repeated description thereof is omitted for brevity. The IC structure 300A is different from the IC structure 100C mainly in that in the IC structure 300A, the semiconductor die 122D is laterally surrounded or encapsulated by the potting material 242 while in the case of 100C only the edges of the die and RDLs are exposed. The semiconductor die 122D and the potting material 242 constitute a body of the IC structure 300A.

Figure 3F:
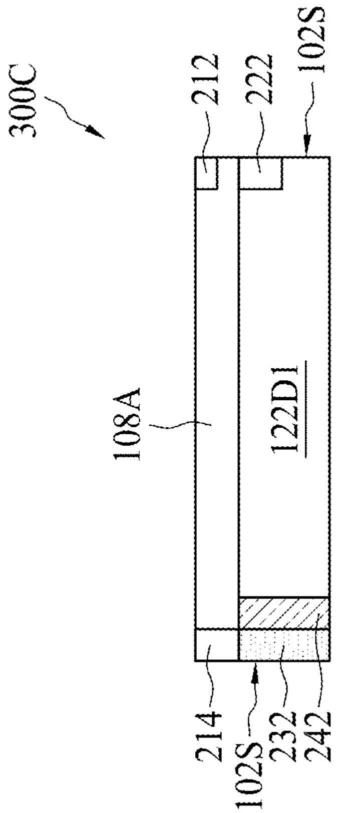
FIGS. 3E and 3F show cross-sectional views of an IC structure, in accordance with various embodiments of the present disclosure.
Figure 3E:
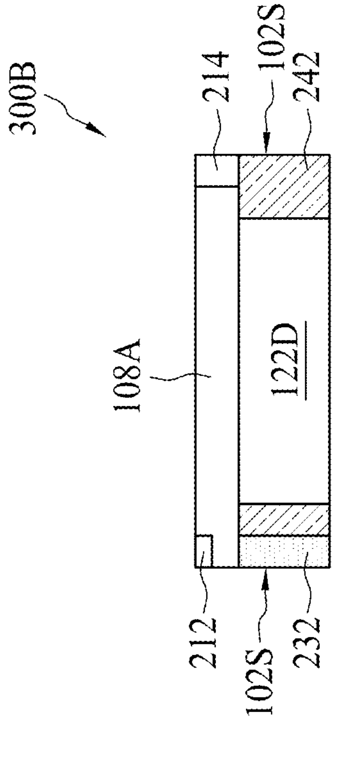

FIG. 3E shows a cross-sectional view of an IC structure 300B, in accordance with various embodiments of the present disclosure. The IC structure 300B is similar to the IC structure 300A in many aspects, e.g., the primary RDL 108A, the conductive pad 212 and the conductive via 214, and therefore details of such similar aspects are not repeated for brevity. A main difference between the IC structure 300A and the IC structure 300B is that, in addition to the semiconductor die 122D and the potting material 242, a body of the IC structure 300B further includes an edge TMV 232, which extends through a thickness of the semiconductor die 122D or partially through a thickness of the semiconductor die 122D. The edge TMV 232 is part of the edge interconnect structure 118X.

FIG. 3F shows a cross-sectional view of an IC structure 300C, in accordance with various embodiments of the present disclosure. The IC structure 300C is similar to the IC structure 300B in many aspects, e.g., the primary RDL 108A, the conductive pad 212, the conductive via 214 and the TMV 232, and therefore details of such similar aspects are not repeated for brevity. Further, the IC structure 300C includes a semiconductor die 122D1, which replaces the semiconductor die 122D and can be at least one of a CPU die, a GPU die, a TPU die, a MEMS die, an AP die, an FPGA die, an ASIC die, a memory die, a transceiver die, a network interface die, an integrated photonics die, a packet buffer/router die or another suitable die. A main difference between the semiconductor die 122D and the semiconductor die 122D1 is that the semiconductor die 122D1 further includes a portion of the edge interconnect structure 118X, e.g., an edge conductive pad 222 exposed through the secondary planes or side surfaces 102S of the semiconductor die 122D1. Materials, configuration and a method of forming the edge conductive pad 222 of the IC structure 300C are similar to those of the conductive via 222 described with reference to FIG. 2F. A body of the IC structure 300C therefore includes the semiconductor die 122D1, the potting material 242, the conductive via 222 and the TMV 232. According to some embodiments, the primary RDL 108A of the IC structure 300C includes a conductive via 214 electrically connected to the TMV 232 in the body of the IC structure 300C for establishing a stacked conductive via for the IC structure 300C.

Figures 4A, 4B, 4C, 4D, 4E, 4F:
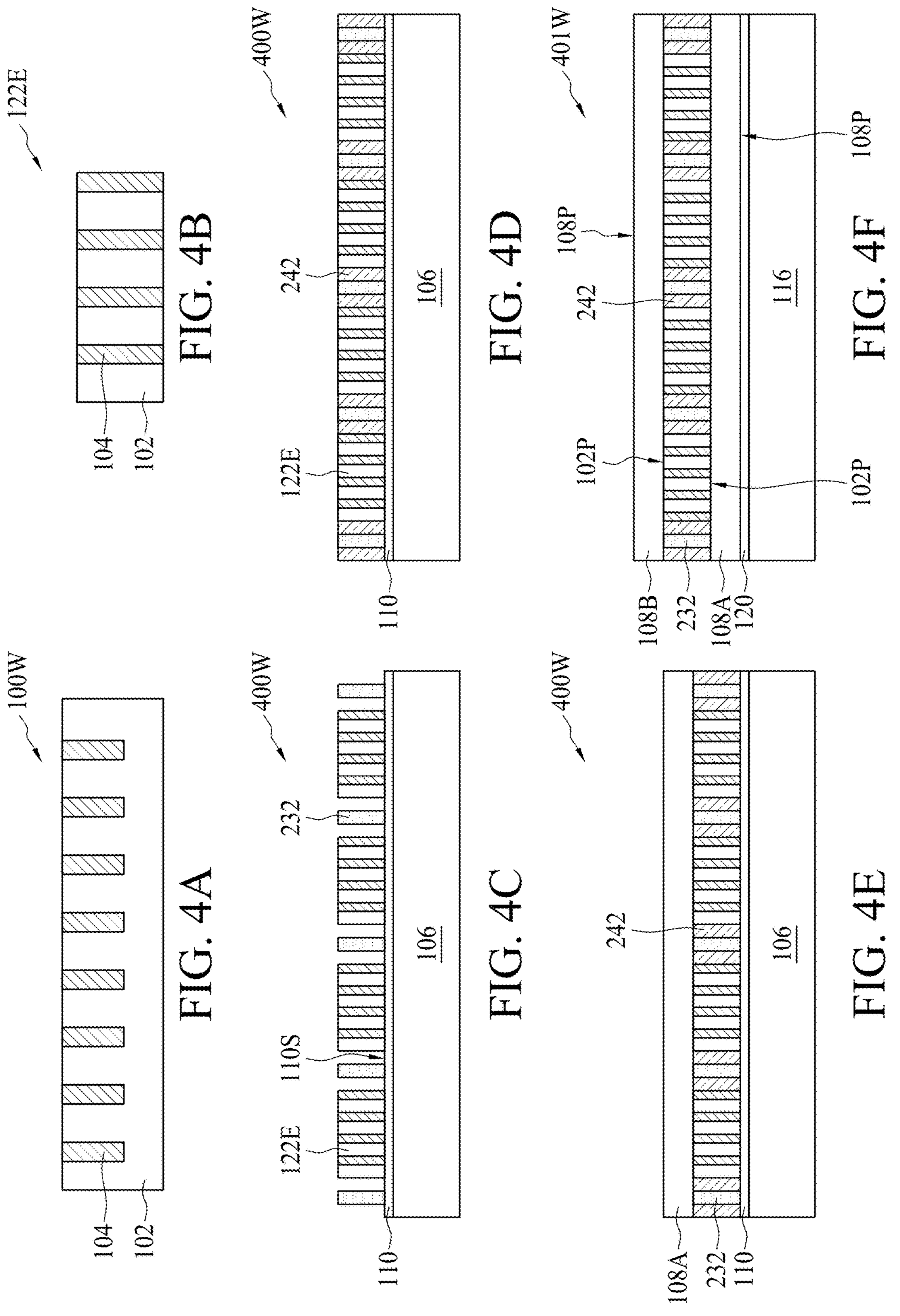
FIGS. 4A to 4G show cross-sectional views of structures in different stages of a method of manufacturing an IC structure, in accordance with some embodiments of the present disclosure.
Figure 4G:
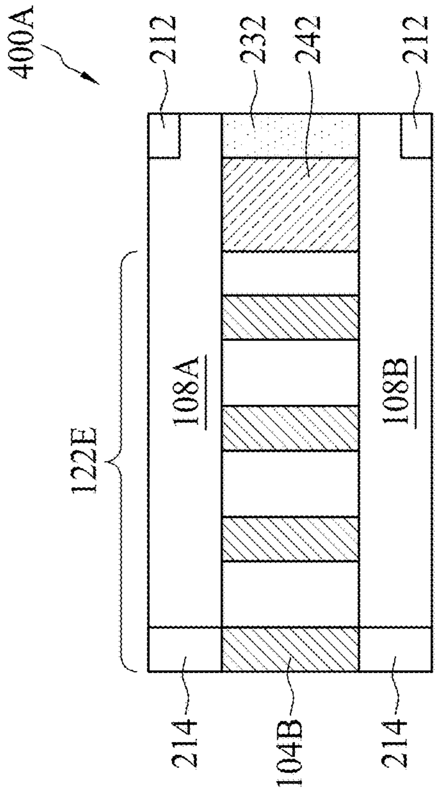

FIGS. 4A to 4G show cross-sectional views of structures in different stages of a method of manufacturing an IC structure 400A, in accordance with some embodiments of the present disclosure. According to some embodiments, the IC structure 400A shown in FIG. 4G is a semiconductor package device. The IC structure 400A may be formed from a semiconductor device 100W (see FIG. 4A), which is a wafer-level device, wherein the IC structure 400A is formed by separating the semiconductor device 400W using a singulation or dicing process.

Referring to FIG. 4A, the substrate 102 is received or provided as the semiconductor device 100W. Further, conductive vias 104 are formed in the substrate 102. Referring to FIG. 4B, a bulk portion of the substrate 102 below the conductive vias 104 is removed, e.g., by CMP, grinding, or an etching operation such that the conductive vias 104 become TSVs 104. A singulation or dicing process is performed to separate the semiconductor device 100W into a plurality of TSV dies 122E, which are similar to the TSV die 122A described with reference to FIG. 2C.

Referring to FIG. 4C, the carrier substrate 106 is received or provided in a semiconductor device 400W. Further, the release layer 110 is formed over the carrier substrate 106. A plurality of TSV dies 122E and a plurality of TMVs 232 are arranged over the release layer 110 to form a reconstituted structure on a carrier surface 110S of the release layer 110 or the carrier substrate 106. The TMVs 232 may be alternately arranged with the TSV dies 122E. The TMVs 232 may include a conductive material, e.g., tungsten, copper, titanium, tantalum, molybdenum, cobalt, ruthenium, aluminum, silver, gold, or another suitable material. The plurality of TSV dies 122E and the plurality of TMVs 232 may have substantially equal heights. According to some embodiments, the TSV dies 122E and the TMVs 232 are arranged over the release layer 110 by a pick-and-place bonding process.

Referring to FIG. 4D, the semiconductor device 400W is molded or encapsulated using a potting material (e.g., an encapsulating material or a molding material) 242. A deposition process or a molding process is performed to deposit the potting material 242 in between the TSV dies 122E and the TMVs 232. According to some embodiments, a planarization process, e.g., CMP, grinding, et etching, or another suitable etching operation, is performed to remove excess potting material 242 and planarize an upper surface of the potting material 242, an upper surface of the TSV dies 122E and an upper surface of the TMVs 232, revealing the TSVs and the TMVs Referring to FIG. 4E, the primary RDL 108A is formed over the upper surfaces of the potting materials 242, the TSV dies 122E and the TMVs 232. Materials, configuration and a method of forming the primary RDL 108A are similar to those described with reference to FIGS. 2B to 2G, and repeated description of the primary RDL 108A is omitted for brevity.

According to some embodiments, an order of the processing steps shown in FIGS. 4C and 4D can be altered. For example, initially, the plurality of TSV dies 122E are arranged over the release layer 110 without the TMVs 232. Subsequently, the potting material 242 is deposited to fill the gaps between the TSV dies 122E and is planarized. A hole opening operation by, for instance, laser is performed to form via holes between the TSV dies 122E which are subsequently filled with conductive materials forming the TMVs 232. The vias may be laterally surrounded by the potting material 242.

Referring to FIG. 4F, another carrier substrate 116 is provided or received in another semiconductor device 401W. Another release layer 120 is formed over the carrier substrate 116. Further, the structure in FIG. 4E is flipped over with its RDL 108A side bonded to the second carrier substrate 116 with the use of a release layer 120 and carrier 106 is released. Subsequently, another primary RDL 108B with surface finish and bonding pads is formed over the other side of the TSV dies 122E, the potting material 242 and the TMV 232*s* supported by the second carrier 116. Materials, configurations, and methods of forming the carrier substrate 116, the release layer 120 and the primary RDL 108B are similar to those of the carrier substrate 106, the release layer 110 and the primary RDL 108A described with reference to FIG. 2C, and therefore details of such similar features are not repeated for brevity. Moreover, the carrier substrate 116 is removed from the semiconductor device 401W by releasing the release layer 120 following wafer mounting Referring to FIG. 4G, a singulation or dicing process is performed to separate the reconstituted structure of the semiconductor device 401W into individual IC structures 400A. Through appropriate arrangement, the TMVs 232 and edge TSVs 104B are formed in the IC structure 400A and comprise

- two TMV types after the singulation or dicing process: interior TMVs (not shown) and edge TMVs 232, and
- two TSV types after the singulation or dicing process: interior TSVs and edge TSVs 104B.

Properties of the conductive pads 212 and the conductive vias 214 of the primary RDLs 108A or 108B are similar to those of the IC structure 100A shown in FIG. 2C, and repeated descriptions thereof are omitted for brevity. The IC structure 400A is different from the IC structure 100A mainly in that the IC structure 400A further includes the potting material 242 filling a space between the semiconductor die 122D and the TMV 232. The semiconductor die 122D, the TMV 232 and the potting material 242 constitute a body of the IC structure 400A.

FIGS. 4H to 4N show cross-sectional views of IC structures 400B, 400C, 400D, 400E, 400F, 400G and 400H, respectively, in accordance with various embodiments of the present disclosure. Since the IC structures 400B, 400C, 400D, 400E, 400F, 400G and 400H are seen as variants of the baseline IC structure 400A in many aspects, the following description will focus only on differences between the IC structure 400A and other IC structures 400B to 400H.

Figure 4H:
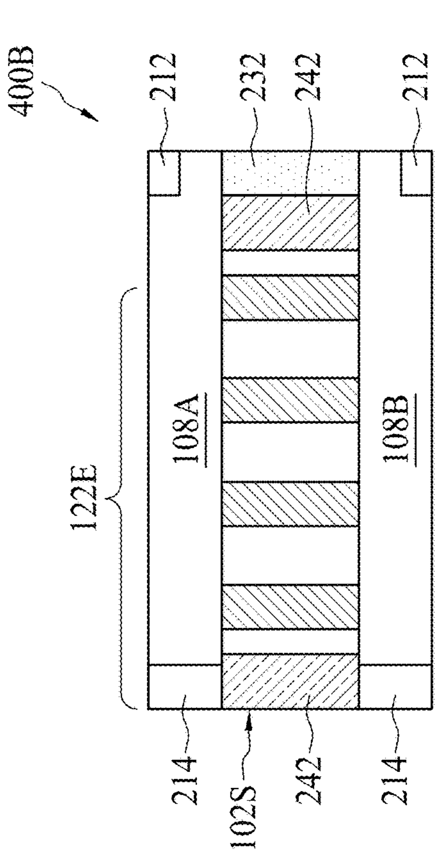
FIGS. 4H to 4N show cross-sectional views of an IC structure, in accordance with various embodiments of the present disclosure.

Referring to FIG. 4H, a main difference between the IC structure 400B and the IC structure 400A is that, in the IC structure 400B, the TSV die 122E containing interior TSVs is laterally surrounded or encapsulated by the potting material 242 and there exists no edge TSV in the IC structure 400B.

Figure 4I:
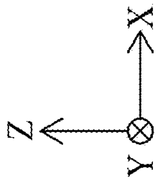
Figure 4I:
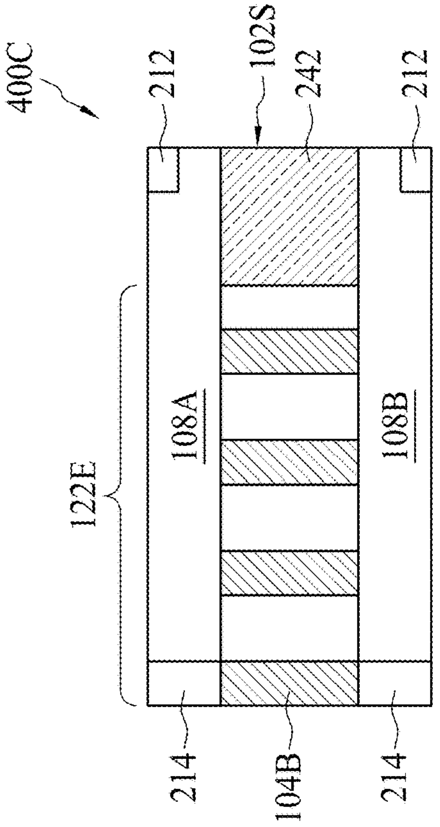
Figure 4J:
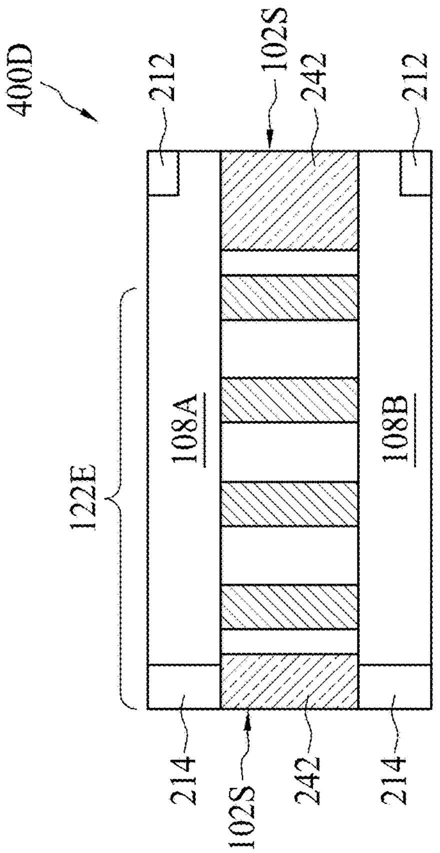

Referring to FIG. 4I, a main difference between the IC structure 400C and the IC structure 400A is that the TMV 232 is absent in the IC structure 400C. Referring to FIG. 4J, the IC structure 400D does not possess edge TSVs nor edge TMVs which are both present in the IC structure 400A.

Figure 4L:
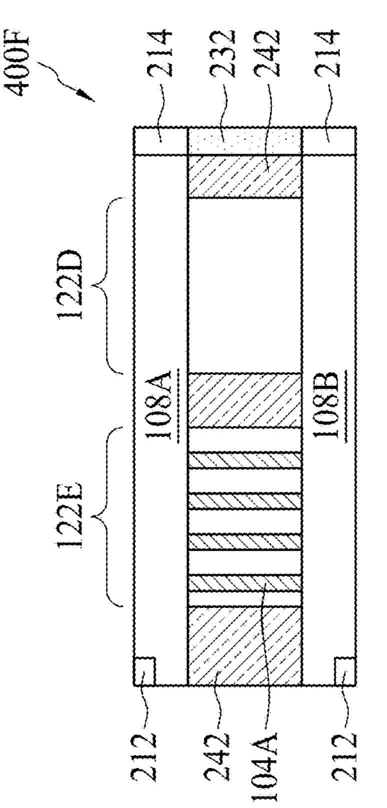
Figure 4N:
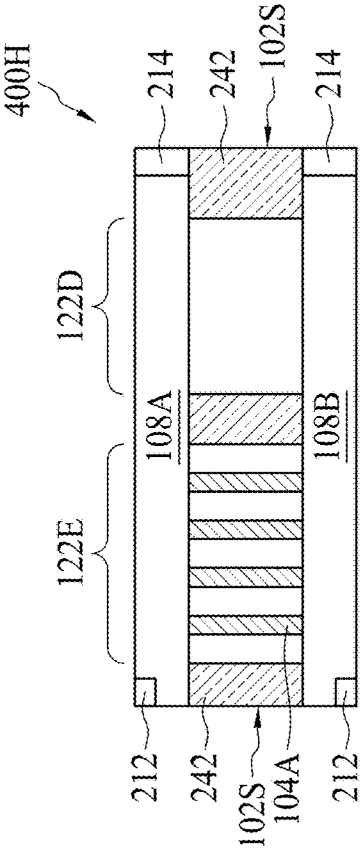
Figure 4K:
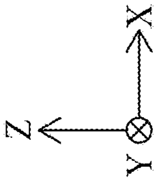
Figure 4K:
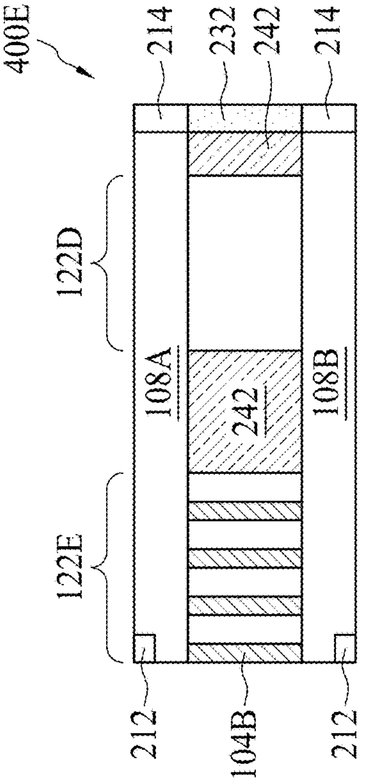

The IC structures 400E, 400F, 400G and 400H shown in FIGS. 4K to 4N can be seen as multi-die versions of the corresponding single-die IC structures 400A, 400B, 400C and 400D, wherein multiple dies are arranged in a same package layer of the IC structures 400E through 400H. Referring to FIG. 4K, a main difference between the IC structure 400E and the IC structure 400A is that the IC structure 400E further includes a second semiconductor die 122D besides the first semiconductor die, i.e., the TSV die 122E, both of which can be of the same or different sizes. A body of the IC structure 400E is thus comprised of the semiconductor die 122D, the TSV die 122E, the TMV 232, the potting material 242 and the RDLs, 108A and 108B. The semiconductor die 122D and the TSV die 122E are arranged in a same package layer. The semiconductor die 122D (which can also contain interior or edge TSVs) is laterally surrounded or encapsulated by the potting material 242. Further, in the IC structure 400E, the TMV 232 serves as an edge TMV, which can be electrically connected to the edge conductive via 214 of the primary RDL 108A and the edge conductive via 214 of the primary RDL 108B to form a stacked TSV extending through an entire thickness of the IC structure 400E.

Referring to FIG. 4L, a main difference between the IC structure 400F and the IC structure 400E is that, in the IC structure 400F, the TSV die 122E is further laterally surrounded or encapsulated by the potting material 242 and the IC structure 400F contains no edge TSVs.

Figure 4M:
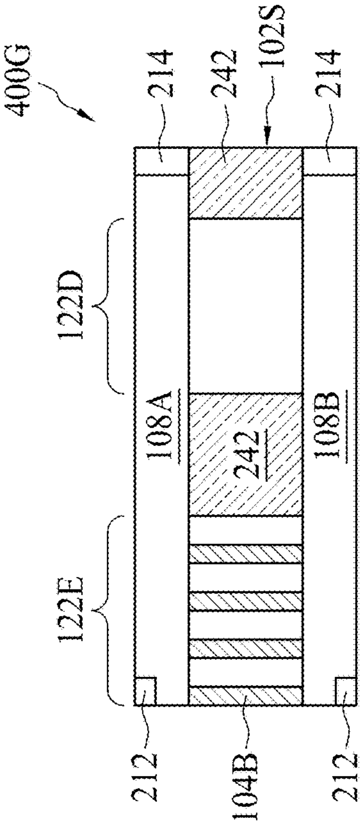

Referring to FIG. 4M, a main difference between the IC structure 400G and the IC structure 400E is that the edge TMV 232 is absent from the IC structure 400G which contains the edge TSV 104B.

Referring to FIG. 4N, the IC structure 400H can be seen as a combination of features of the IC structures 400F and 400G, in which a body of the IC structure 400H comprises only the semiconductor die 122D, the TSV die 122E, the potting material 242 and the RDLs 108A and 108B without edge TSVs and edge TMVs. According to some embodiments, the potting material 242 laterally surrounds and encapsulates the semiconductor dies 122D and 122E. The potting material 242 is exposed through two secondary planes 102S of the body of the IC structure 400H.

Figure 5B:
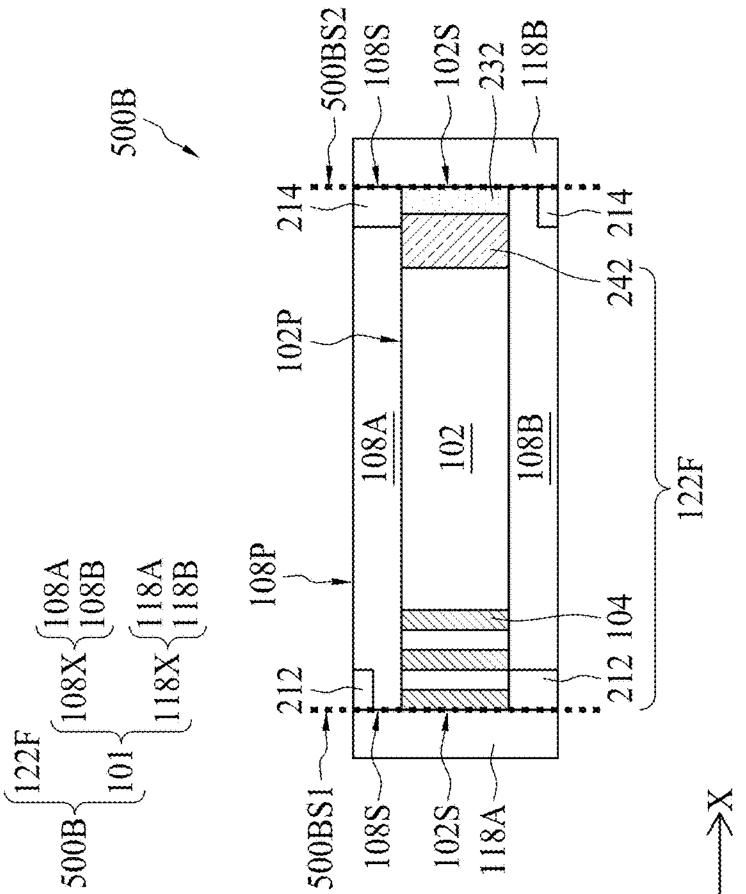
FIGS. 5A and 5B show cross-sectional views of an IC structure, in accordance with various embodiments of the present disclosure.
Figure 5A:
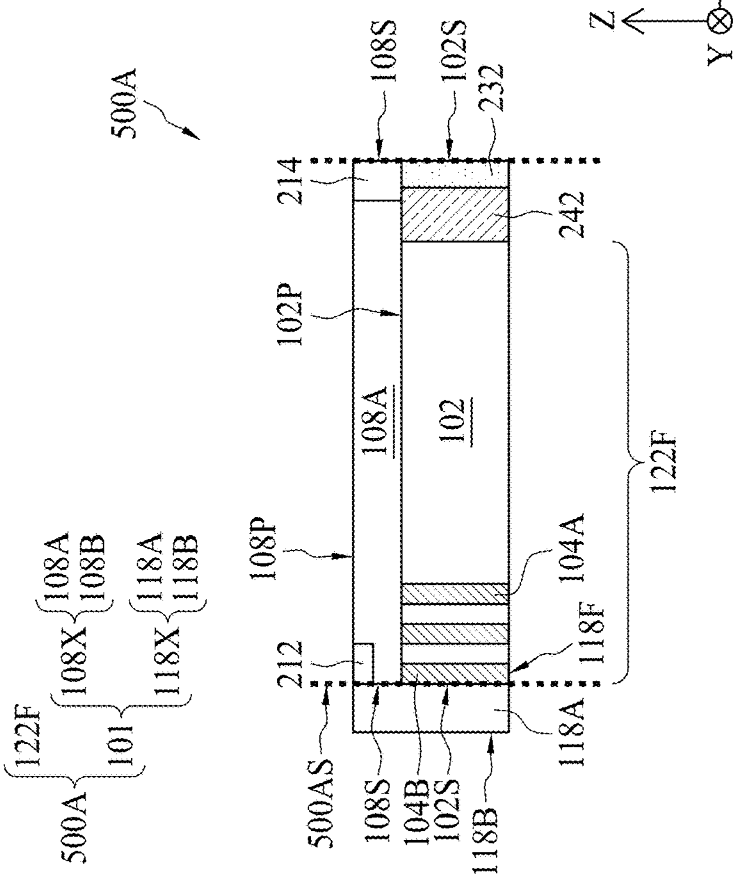

FIG. 5A shows a cross-sectional view of an IC structure 500A, in accordance with various embodiments of the present disclosure. A body of the IC structure 500A comprises a semiconductor die 122F, a TMV 232 and a potting material 242. The semiconductor die 122F may include at least one of a CPU die, a GPU die, a TPU die, a MEMS die, an AP die, an FPGA die, an ASIC die, a memory die, a transceiver die, a network interface die, an integrated photonics die, a packet buffer/router die or another suitable die. The semiconductor die 122F is similar to the semiconductor die 122D1 shown in FIG. 3F, except that the edge conductive pad 222 of the semiconductor die 122D1 is replaced with a plurality of TSVs 104 (including interior TSVs 104A and edge TSVs 104B), in which one edge TSV 104B is exposed through a secondary plane 500AS of the IC structure 500A. Further, in contrast to the IC structures described previously, the IC structure 500A further includes a secondary RDL 118A arranged on the secondary plane 500AS of the IC structure 500A and electrically connected to the primary RDL 108A.

Figure 5C:
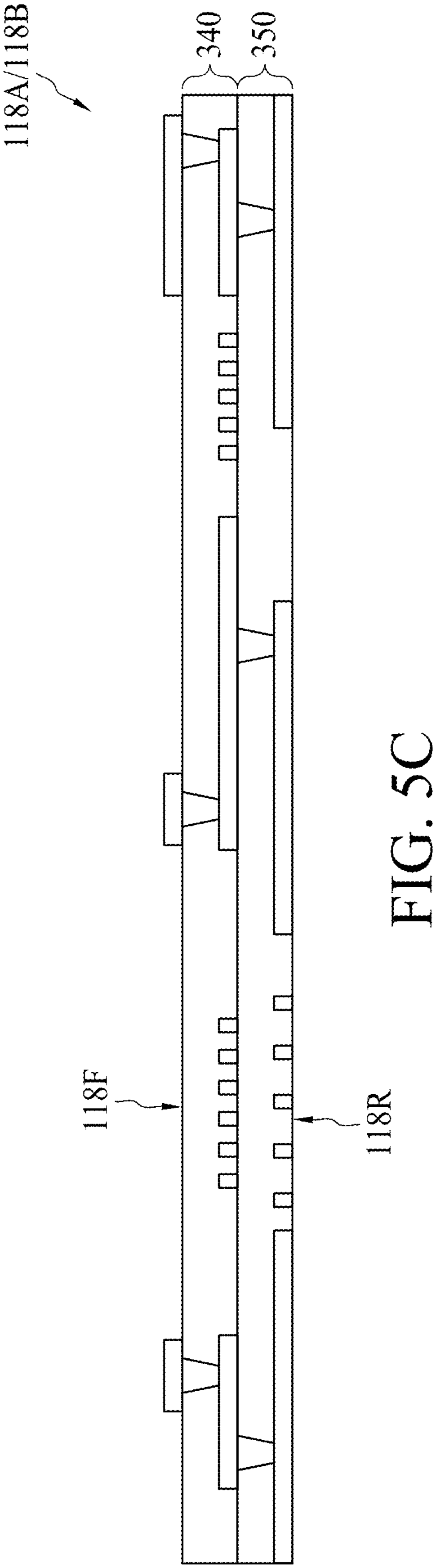
FIG. 5C shows a cross-sectional view of an interconnect structure of the IC structure shown in FIGS. 5A and 5B, in accordance with various embodiments of the present disclosure.

FIG. 5C shows a cross-sectional view in greater detail of the secondary RDL 118A of the IC structure 500A shown in FIG. 5A, in accordance with various embodiments of the present disclosure. The secondary RDL 118A is similar to the primary RDL 108, e.g., the primary RDL 108A or 108B, described with reference to FIG. 2G. The secondary RDL 118A shown in FIG. 5C includes two major conductive line/via layers 340, 350 similar to the first and second major conductive line/via layers, 240 and 250, of the primary RDL 108A or 108B in FIG. 2G. Referring to FIG. 5C, the secondary RDL 118A includes a front interconnect surface 118F and a back interconnect surface 118R opposite to the front interconnect surface 118F. The secondary RDL 118A is electrically connected to an edge interconnect structure 118X, e.g., the edge TSV 104B of the semiconductor die 122F or an edge conductive pad 212 of the primary RDL 108A, of the IC structure 500A. According to some embodiments, the secondary RDL 118A is considered part of the edge interconnect structure 118X of the IC structure 500A. With such configuration, the primary RDL 108A can be electrically connected to the semiconductor die 122F not only through an interior interconnect structure 108X via a primary surface 102P of a substrate 102 of the IC structure 500A and a primary surface 108P of the primary RDL 108A facing the substrate 102, but also through the edge interconnect structure 118X including the edge TSV 104B and the secondary RDL 118A via a side surface (secondary plane) 102S of the body of the IC structure 500A and a front interconnect surface 118F of the secondary RDL 118A. A routing capacity and design flexibility of the IC structure 500A provided for the semiconductor die 122F is therefore increased as compared to IC structures without the secondary RDL 118A and other edge interconnections.

FIG. 5B shows a cross-sectional view of an IC structure 500B, in accordance with various embodiments of the present disclosure. The IC structure 500B is substantially similar to the IC structure 500A in many aspects, and therefore descriptions of similar features are not repeated for brevity. A main difference between the IC structure 500B and the IC structure 500A is that, in addition to the secondary RDL 118A arranged on a left-side secondary plane 500BS1 of the IC structure 500B, the IC structure 500B further includes a secondary RDL 118B arranged on a right-side secondary plane 500BS2 of the IC structure 500B opposite to the secondary RDL 118A. A material and a configuration of the secondary RDL 118B may be similar to those of the secondary RDL 118A, as illustrated in FIG. 5C. However, other configurations and numbers of major conductive line/via layers for the secondary RDLs, 118A and 118B, are also within the contemplated scope of the present disclosure. The secondary RDL 118B is thus also considered part of the edge interconnect structure 118X of the IC structure 500B and can be electrically connected to the primary RDL 108A.

Figure 6B:
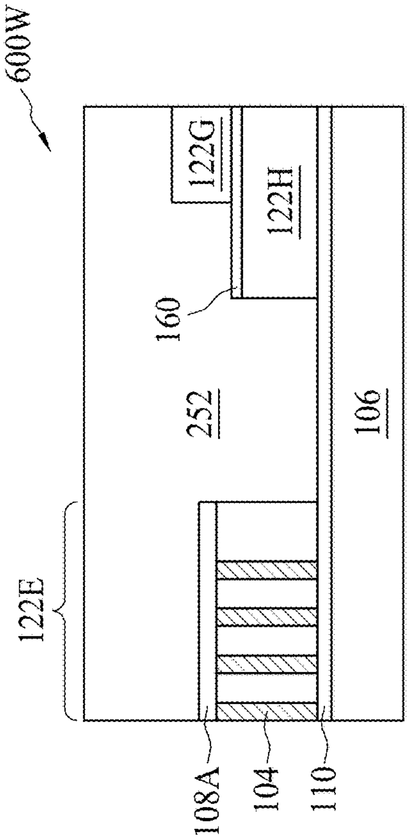
FIGS. 6A to 6E show cross-sectional views of structures in different stages of a method of manufacturing a semiconductor package, in accordance with various embodiments of the present disclosure.
Figure 6D:
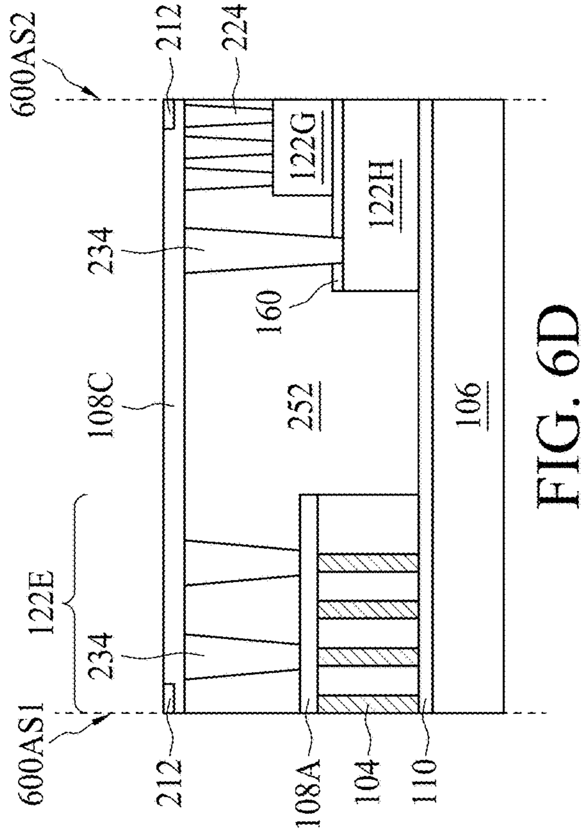
Figure 6A:
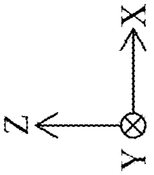
Figure 6A:
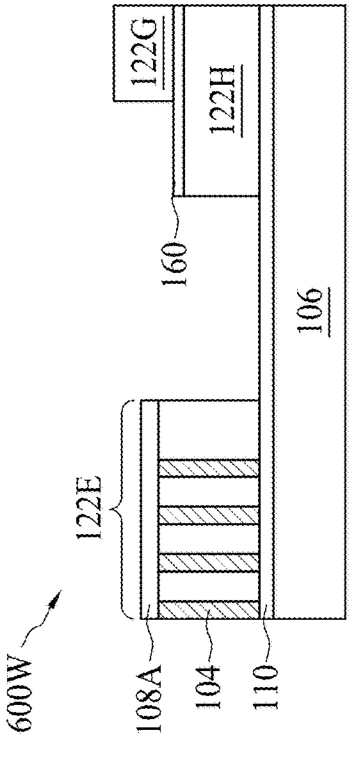
Figure 6C:
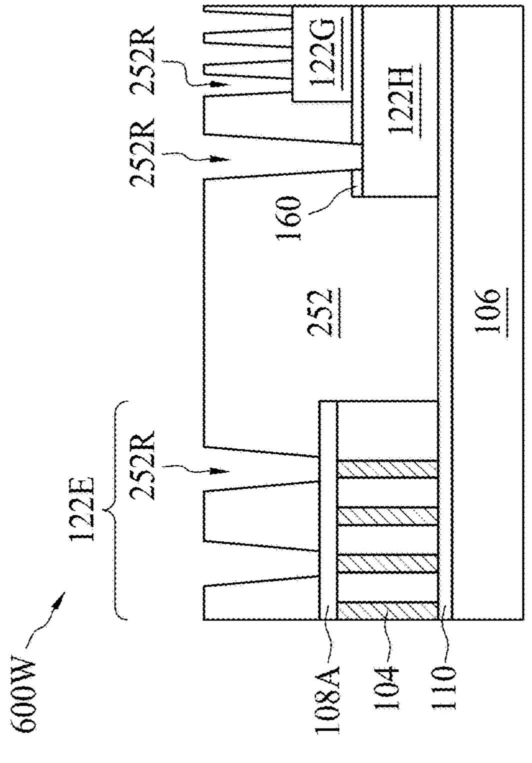
Figure 6E:
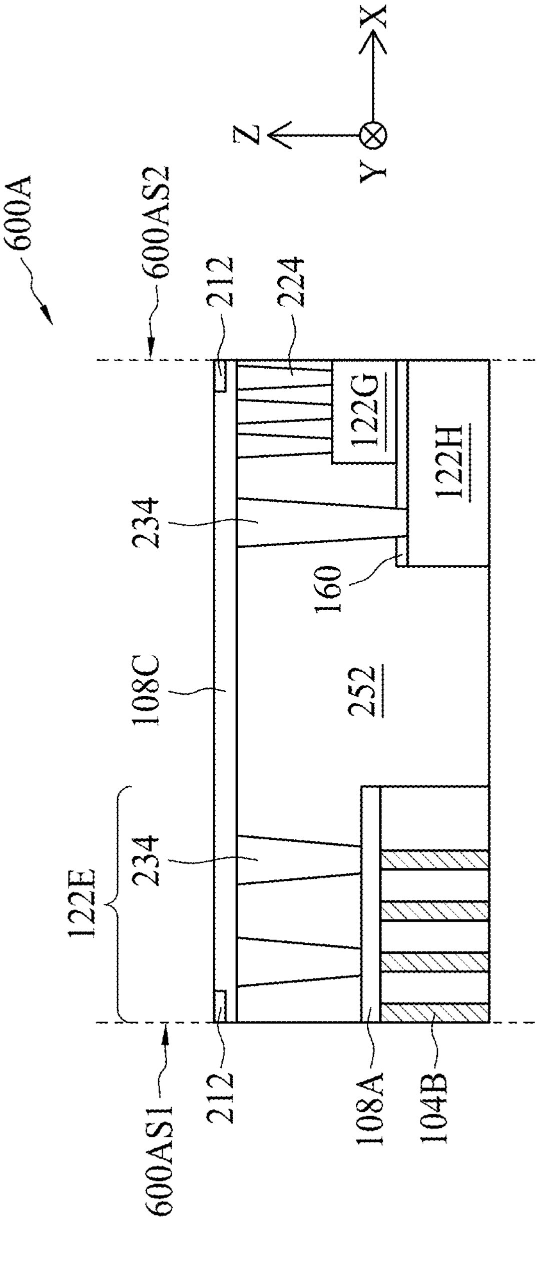

FIGS. 6A to 6E show cross-sectional views of structures in different stages of a method of manufacturing a semiconductor package 600A, in accordance with various embodiments of the present disclosure. According to some embodiments, the IC structure 600A shown in FIG. 6E is a semiconductor package device. The IC structure 600A may be formed from a semiconductor device 600W, which is a wafer-level device, wherein the IC structure 600A in FIG. 6E is formed by separating the semiconductor device 600W using a singulation or dicing process.

Referring to FIG. 6A, a carrier substrate 106 is provided or received. A release layer 110 is formed over an upper surface of the carrier substrate 106. A plurality of semiconductor dies, e.g., semiconductor dies, 122E, 122G and 122H, are prepared. A TSV die 122E may be replaced with semiconductor dies described above, such as the semiconductor dies 100A, 100B, 100C, 300A, 300B, 300C, and 400A to 400H. The TSV die 122E includes a plurality of TSVs 104 and a primary RDL 108A on an upper surface of the TSVs 104. According to some embodiments, the semiconductor die 122G or 122H can be at least one of a CPU die, a GPU die, a TPU die, a MEMS die, an AP die, an FPGA die, an ASIC die, a memory die, a transceiver die, a network interface die, an integrated photonics die, a packet buffer/router die, another suitable die or any of the semiconductor dies described above.

Sizes or dimensions of the semiconductor dies 122E, 122G and 122H may be similar or different. For example, the semiconductor dies 122E, 122G and 122H may have substantially equal or different heights, lengths or widths.

A pick-and-place process is performed to pick known good dies (KGDs) of the semiconductor dies 122E, 122G and 122H, and bond the KGDs over the release layer 110. A bonding or die attachment layer 160 is formed on the semiconductor die 122H after the semiconductor die 122H is placed over the release layer 110. The bonding layer 160 may aid in attachment of the semiconductor die 122G to the semiconductor die 122H. According to some embodiments, the bonding layer 160 is a die attachment film, an array of micro-bumps configured to perform flip-chip bonding, a direct bonding layer or a hybrid bonding layer configured to generate bonds. According to some embodiments, the semiconductor dies 122G and 122H are vertically stacked. The semiconductor die 122E may be arranged side-by-side adjacent to the stacked semiconductor dies, 122G and 122H, in a same package layer. The semiconductor dies 122E, 122G and 122H may be of substantially the same or different sizes.

Referring to FIG. 6B, the semiconductor device 600W is molded or encapsulated using a potting material or a suitable material 252. A material and a configuration of the potting material 252 are similar to those of the potting material 242 and can include molding compound and thick-film photoresists. A molding or deposition process is performed to deposit the potting material 252 in between the semiconductor dies 122E, 122G and 122H and embed the semiconductor dies 122E, 122G and 122H. The potting material 252 may have a height greater than that of the semiconductor dies 122E, 122G and 122H. According to some embodiments, a planarization process, e.g., CMP, grinding, etching (dry and/or wet) or another suitable etching operation, is performed to remove excess potting material 252 and generate a uniform upper surface of the potting material 252 (sec FIG. 6B).

FIG. 6C illustrates a formation of a plurality of via holes 252R in the potting material 252. The holes may be created by laser ablation. Alternatively, if a thick film photoresist is used as the encapsulation material, it can be laminated on, patterned and developed to create the holes that extend from the upper surface of the potting material 252 to the bonding pads with proper surface finishes of the semiconductor dies 122E, 122G and 122H with the pads exposed under the via holes 252R.

Referring to FIG. 6D, a conductive material with proper passivation is deposited in the via holes 252R, e.g., by PVD, CVD, ALD, plating, or the like. The conductive material may include at least one of tungsten, copper, titanium, molybdenum, cobalt, ruthenium, tantalum, aluminum, silver, gold, and other suitable materials. One or more conductive pillars 224 are thus formed over and electrically connected to the semiconductor die 122G. At least one conductive pillar 224, formed on a secondary plane 600AS2 (at the present time such secondary plane 600AS2 is still a hypothetical plane before the dicing process) of the semiconductor device 600W, is configured as an edge conductive pillar 224. Further, one or more conductive plugs 234 are formed over and electrically connected to the TSV die 122E and/or the semiconductor die 122H. As a result, a body of the IC structure 600A includes the semiconductor dies, 122E, 122H and 122G, the primary RDL 108A, the bonding layer 160, the potting material 252, the conductive vias 104, the interior conductive pillars 224, the conductive plugs 234 and the edge conductive pillar 224. According to some embodiments, the TSVs 104, the conductive pillars 224, and the conductive plugs 334 are of substantially the same or different lengths.

Another primary RDL 108C is formed over the upper surface of the potting material 252 and electrically connected to the semiconductor dies 122E, 122G and 122H. According to some embodiments, the primary RDL 108C at least includes an edge conductive pad 212 on a secondary plane, 600AS1 or 600AS2 (at the present time the secondary planes 600AS1 and 600AS2 are still hypothetical planes before the dicing process) of the semiconductor wafer 600W.

Subsequently, following wafer mounting, the carrier substrate 106 is removed or detached from the semiconductor device 600W by removing or releasing the release layer 110 from the semiconductor device 600W. FIG. 6E shows an individual IC structure 600A formed using a singulation or a dicing process to separate the semiconductor device 600W into individual IC structures 600A. Through appropriate arrangement, the edge conductive pads 212, the edge TSV 104B and the edge conductive pillar 224 can be formed and exposed through at least one of the secondary planes, 600AS1 and 600AS2, of the IC structure 600A. The primary RDL 108C is configured to be electrically connected to the semiconductor dies 122E, 122G and 122H through an interior interconnect structure 108X, e.g., the conductive plugs 234 and interior conductive copper pillars 224. Further, the primary RDL 108C is configured to be electrically connected to the semiconductor dies 122E, 122G and 122H through an edge interconnect structure 118X, e.g., the edge TSV 104 and the edge conductive pillar 224. A routing distance can thus be reduced with the help of the edge interconnect structure 118X.

Referring to FIG. 6E and FIGS. 5A and 5B, according to some embodiments, the secondary RDLs 118A and 118B of the IC structures 500A and 500B are applicable to the IC structure 600A. In other words, although not separately shown, the secondary RDL 118A or 118B can be arranged on the secondary surfaces 600AS1 and 600AS2, respectively, to be electrically connected to conductive elements 202 of the primary RDL 108C, the edge TSV 104 (in FIG. 6E use 104 instead of 104B to be consistent with FIG. 6D), and/or the edge conductive pillars 224. According to some embodiments where the IC structure 600A includes an edge conductive plug 234, the secondary RDL 118A or 118B can be electrically connected to such edge conductive plug 234.

The embodiments of the present disclosure discussed above provide advantages. The collective edge conductive element 202 can appear in a form of edge conductive pads 212, in a form of edge conductive vias 214, in a form of edge TSVs 104, or in a form of edge TMVs 224 as shown in FIG. 6E. Further, the primary RDLs, 108A and 108C, or the secondary RDLs 118A and 118B (see FIG. 5B) may be formed with or without the edge conductive pads 212, with or without the edge conductive vias 214, with or without the edge TSVs 104, with or without the edge conductive via 222 (see FIGS. 2F and 3F), with or without the edge TMVs 232 (FIG. 5B), with or without the edge conductive pillars 224, and with or without the edge conductive plugs 234. The edge conductive elements 202 can be disposed at a periphery of the IC structures or at a periphery of the RDLs. Further, the edge conductive vias 222 can cover an entirety or a part of a thickness of the body of the respective IC structure. Moreover, the edge TSVs 104, the edge TMVs 232, the edge conductive pillars 224 and the edge conductive plugs 234 can appear inside the IC structures to facilitate interior interconnection of the IC structures in different stacked layers in addition to the edge interconnection arranged on the side faces.

The conductive pillars 224 the conductive plugs 234 and the TMVs 232 (FIG. 5B) are formed based on hole opening and hole filling process steps, and they can be created by a number of methods which include a bonded vertical wire (e.g., palladium, Pd, coated Cu) approach and a laser via approach and through-photosensitive-thick-film (TPTF) approach. The bonded vertical wire approach follows the tall copper pillar process steps with wire bonding replacing the tall copper pillar formation steps. When Pd-coated Cu wire is used, thin gold (Au) can be used as the bonding pad. In the laser via approach, the ICs are first bonded to the carrier substrate 106, followed by for instance, overmolding, planarization, laser via hole opening, via hole sidewall Cu plating, via hole plating or plugging with a photosensitive polymer or a solder, planarization, RDL creation, carrier release and dicing. The TPTF process flow consists of sequentially laminating a thick photosensitive film on the bonded ICs, multiple or single exposure and development to create TMV holes (i.e., through-photosensitive-thick-film via holes), barrier/seed layer deposition, Cu plating, via hole plugging as needed, back-grinding/planarization, RDL creation, carrier release and dicing. The ICs here can have RDLs and TSVs. Multiple exposure provides process freedom to form vias with different sizes and depths. The TMV related processes can accommodate multiple ICs both in the x-y plane and in the vertical z direction as illustrated in FIG. 6E. Moreover, the semiconductor dies, 122E, 122H and/or 122G, in FIG. 6E can be pre-bumped with solder bumps or copper pillar micro-bumps prior to bonding them to the carrier substrate 106 in FIG. 6A. Following die bonding, overmolding can ensue followed by planarization and RDL creation.

Figure 7B:
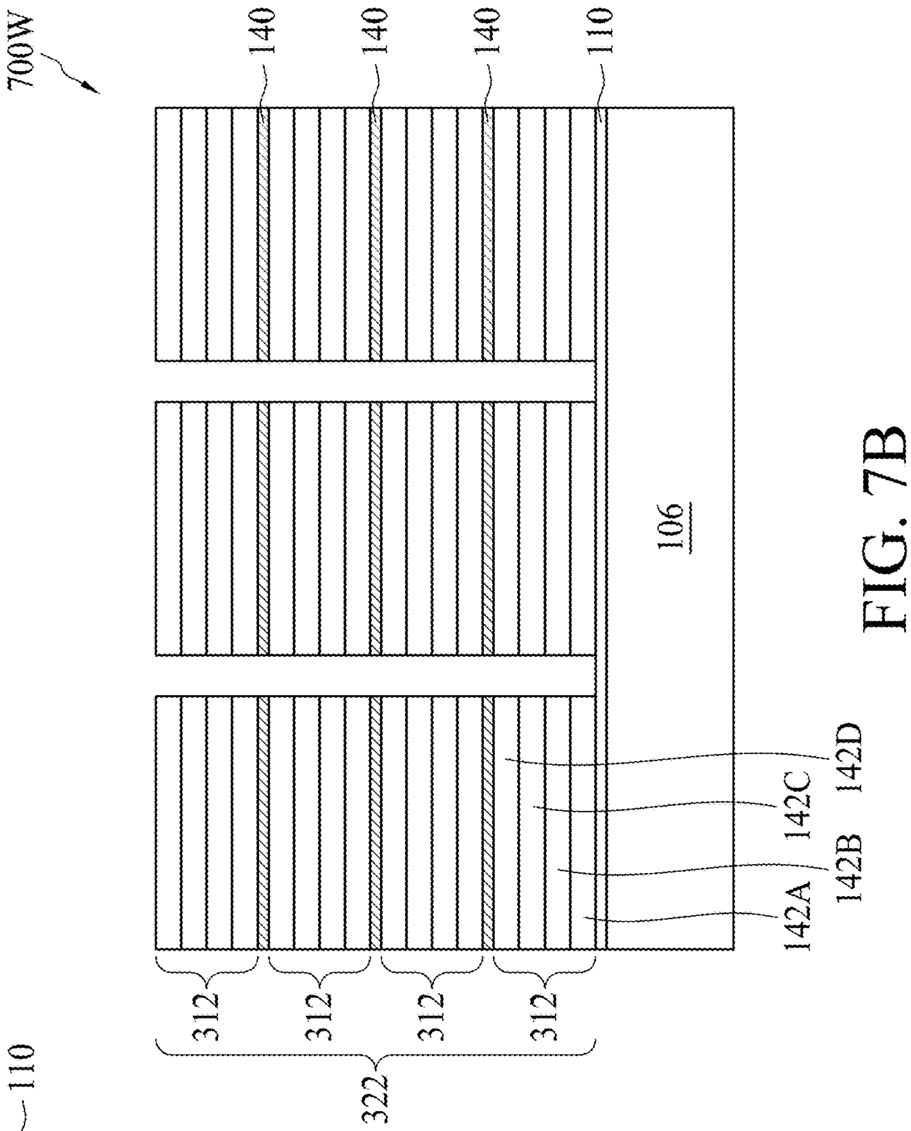
FIGS. 7A to 7H show cross-sectional views of structures in different stages of a method of manufacturing a semiconductor package, in accordance with various embodiments of the present disclosure.
Figure 7A:
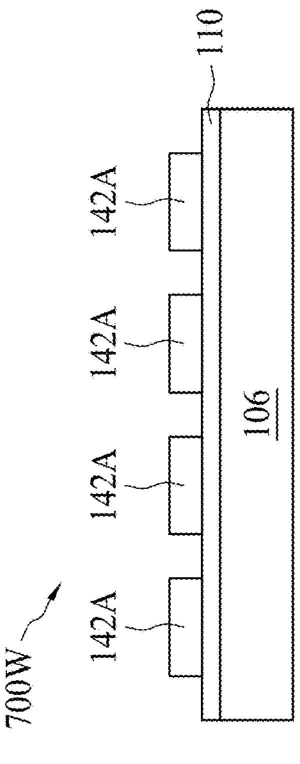
Figure 7C:
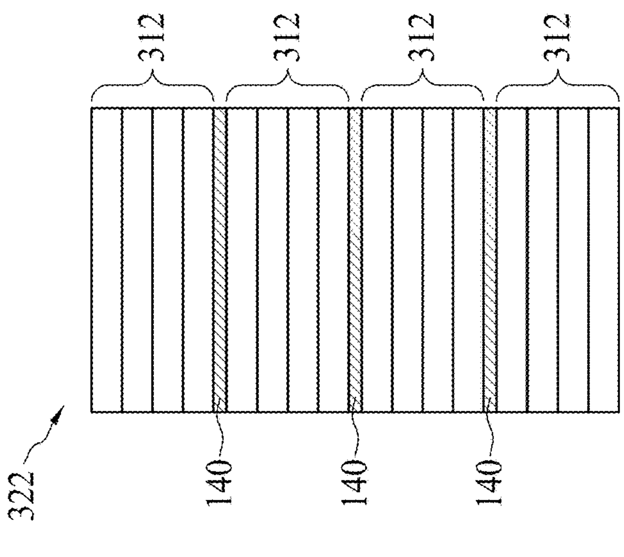
Figure 7E:
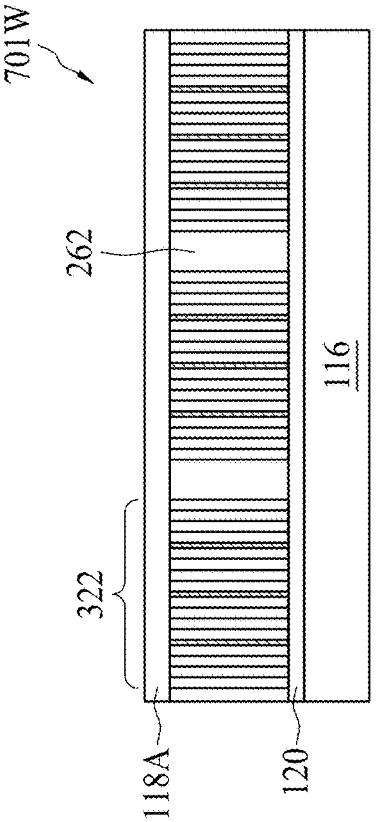
Figure 7H:
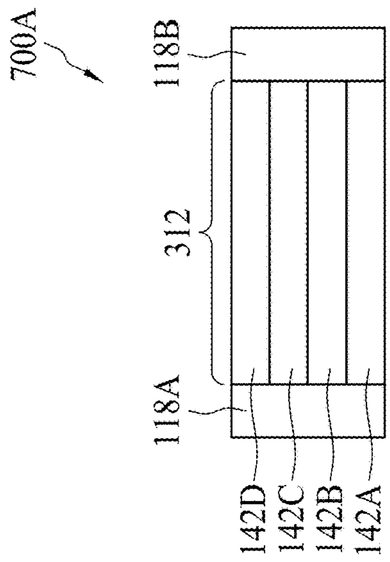

FIGS. 7A to 7H show cross-sectional views of structures in different stages of a method of manufacturing a semiconductor package 700A, in accordance with various embodiments of the present disclosure. According to some embodiments, the semiconductor package 700A shown in FIG. 7H is a semiconductor package device. The semiconductor package 700A may be formed from semiconductor devices 700W and 701W, which are wafer-level devices, wherein the semiconductor package 700A is formed by separating the semiconductor device 701W using a singulation or dicing process.

FIG. 7A to FIG. 7C illustrate formation of a plurality of tall IC stacks 322 from a plurality of IC structures 142. Referring to FIG. 7A, a carrier substrate or a supporting substrate 106 is provided or received. A release layer 110 is formed over an upper surface of the carrier substrate 106. A pick-and-place process is performed to pick and bond a plurality of known-good IC structures 142, e.g., IC structures 142A with the help of a bonding layer to form the first tier of short IC stacks 312 as shown in FIG. 7A over the release layer 110 with a suitable pitch to enhance yield. According to some embodiments, the IC structures 142 can be made up of IC structures 400A, 400B, 400C, 400D, 400E, 400F, 400G, 400H, 500A, 500B, and/or 600A; however, other types of IC structures, e.g., the IC structure 100A, 100B, 100C, 300A, 300B, 300C and/or the like, are also possible. The IC structures 142 covering 142A, 142B, 142C and 142D as illustrated in FIG. 7B for demonstration may include memory and/or processor analog dies. The IC structures 142 may also cover MEMS devices, passives as well as analog, mixed-signal and digital signal processing ICs.

Referring to FIG. 7B, another plurality of IC structures 142, e.g., IC structures 142B, are bonded to the corresponding IC structures 142A to form the second tier of the short IC stacks 312. The bonding of IC structures 142B to IC structures 142A may be achieved using thermo-compression bonding (TCB), flip-chip bonding, hybrid bonding, direct bonding, bonding via glue layers (e.g., Ti/Au), a die attachment film or paste, or other suitable bonding processes. A process of forming the short IC stacks 312 may continue until a predetermined tier number (total number of tiers) K is achieved, wherein the tier number K is a natural number. In the depicted example in FIG. 7B, the tier number K is four. That means each short IC stack 312 is constructed by four stacked IC structures 142A, 142B, 142C and 142D. This process generates known-good short IC stacks. Alternatively, the short IC stacks 312 can be formed by bonding of a plurality of 142D to a plurality of 142C with the resultant structures further processed as needed and then released, the known-good structures picked, the known-good structures bonded to a plurality of known-good 142B, etc. and the process is repeated until the short IC stacks 312 are formed in FIG. 7B.

After the first short IC stacks 312 are completed, a release (or bonding) layer 140 of a suitable thickness is formed over each short IC stack 312. A material of the release layer 140 may be different from that of the release layer 110 to avoid interference with each other during the respective release processes. Subsequently, another set of known-good short IC stacks 312 is formed over the release layers 140 of first known-good short IC stacks 312. As shown in FIG. 7B, the formation of the short IC stacks 312 and the formation of the release layers 140 are proceeded alternately until a predetermined number L of short IC stacks is achieved to form the tall IC stacks 322 in FIG. 7C, wherein the short IC stack number L (i.e., total number of short IC stacks) is a natural number. In the depicted example, the short IC stack number L is four. As a result, the short IC stacks 312 are stacked to form tall IC stacks 322 through the release layers 140.

Referring to FIG. 7C, each tall IC stack 322 is released from the carrier substrate 106 by releasing the release layer 110. As a result, four short IC stacks 312 are alternately arranged with three release layers 140 to form a column of the tall IC stack 322. In the depicted example, there are three columns of the tall IC stacks 322 in the semiconductor device 700W. The numbers K, L, and a column number introduced above are used for illustrative purposes. Other numbers are also within the contemplated scope of the present disclosure.

Figure 7G:
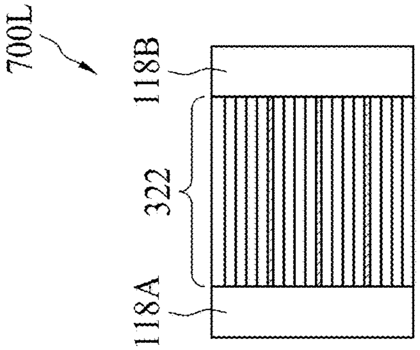
Figure 7D:
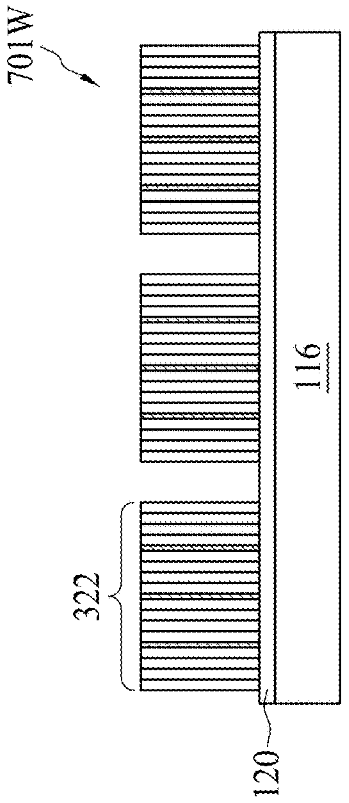

FIG. 7D to FIG. 7H illustrate formation of the semiconductor package 700A from the plurality of tall IC stacks 322. Referring to FIG. 7D, a carrier substrate 116 is provided or received. A release layer 120 is formed over an upper surface of the carrier substrate 116. A pick-and-place process is performed to pick and bond a plurality of known-good tall IC stacks 322 and arrange them over the release layer 120 with a suitable pitch to enhance yield. The tall IC stacks 322 are reconstituted on the carrier substrate 116 and bonded to the release layer 120 through their side surfaces. In other words, the tall IC stacks 322 are lying down such that the vertically-stacked IC structures 142 in the tall IC stack 322 are positioned upright in the x-y plane or IC length and width direction with one of their four side surfaces bonded to the release layer 120.

Referring to FIG. 7E, the reconstituted tall IC stacks 322 of the semiconductor device 701W are molded or encapsulated using a potting material 262. A material and a configuration of the potting material 262 are similar to those of the potting material 242 or 252. A molding or deposition process is performed to deposit the potting material 262 in between the laid-down tall IC stacks 322. According to some embodiments, a planarization process, e.g., CMP, grinding, etching (dry and/or wet) or another suitable etching operation, is performed to remove excess potting material 262 and planarize an upper surface of the potting material 262 and have it flush with a side surface of the tall IC stacks 322. Subsequently, an edge interconnect structure, RDL 118A is formed over or bonded to at least an edge interconnect of the side surface (secondary plane) of the tall IC stacks 322.

Figure 7F:
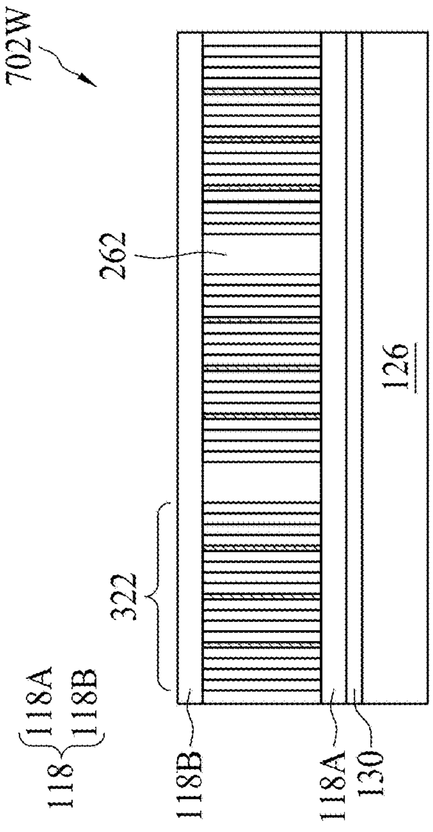

FIG. 7F illustrates formation of another edge interconnect structure, RDL 118B, on another side surface of the tall IC stacks 322 opposite to the secondary RDL 118A. Another carrier substrate 126 is provided or received in another semiconductor device 702W. Another release layer 130 is formed over the carrier substrate 126 to facilitate the creation of 118B. Materials, configurations, and methods of forming the carrier substrate 126 and the secondary RDLs, 118A and 118B, are similar to the secondary RDLs, 108A and 108B described in FIG. 5B and the primary RDLs, 108A and 108B, in FIG. 2C, and therefore details of such similar features are not repeated for brevity. A material of the release layer 130 may be different from that of the release layer 120 to avoid interference with each other during respective release processes. Subsequently, the carrier substrate 116 is removed from the semiconductor device 701W by removing the release layer 120 after the semiconductor structure 701W in FIG. 7E is bonded to the second carrier 126 on the side of RDL 118A. The edge interconnect RDL structure 118B is formed or bonded to a lower secondary surface of the tall IC stacks 322 opposite to an upper secondary surface of the tall IC stacks 322.

Referring to FIG. 7G, a singulation or dicing process is performed to separate the semiconductor device 701W into tall IC stack structures 700L. The singulation or dicing process may be performed to cut through the semiconductor device 701W at locations of the potting material 262 with the potting material 262 cleaned by, for instance, dry and/or wet etching while taking care to keep each tall IC stack 322 intact during the dicing process. According to some embodiments, a wet etching or cleaning process is performed to remove residual potting materials 262 left on the tall IC stacks structures 700L.

FIG. 7H illustrates formation of the individual semiconductor packages 700A, i.e., the short IC stack structures, from the respective IC structures, i.e., the tall IC stack structures 700L. A release process, a singulation process and/or a dicing process is performed to detach the release layers 140 (FIG. 7B) from each of the tall IC stack structures 700L such that the different semiconductor packages 700A, i.e., the respective short IC stacks 312 containing the edge interconnect RDL structures, 118A and 118B, are separated from each other. According to some embodiments, an etching or dicing process is performed to aid in the release process, e.g., by dicing, a continuous-wave laser beam, dry etching (e.g., by plasma) and/or wet etching to cut through the secondary RDLs 118A and 118B, at the locations of the release layers 140. As illustrated in FIG. 7H, the semiconductor package 700A includes a stack of short IC stack structures 142 and two secondary RDLs, 118A and 118B, arranged on two side surfaces of the short IC stack 142. The secondary RDLs, 118A and 118B, can help increase a routing area of the IC structures 142, reduce a routing distance, and improve routing capacity and design flexibility of the semiconductor package 700A.

Figure 7I:
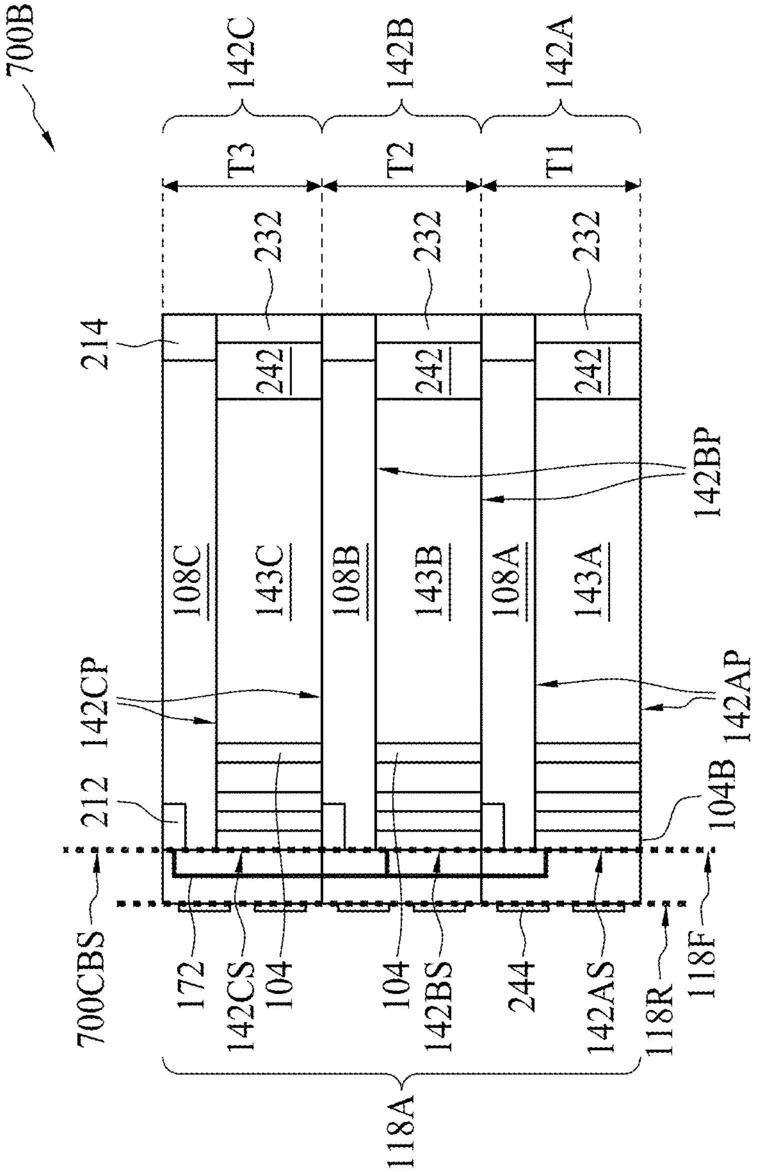
FIGS. 7I and 7J show cross-sectional views of semiconductor packages, in accordance with various embodiments of the present disclosure.
Figure 7J:
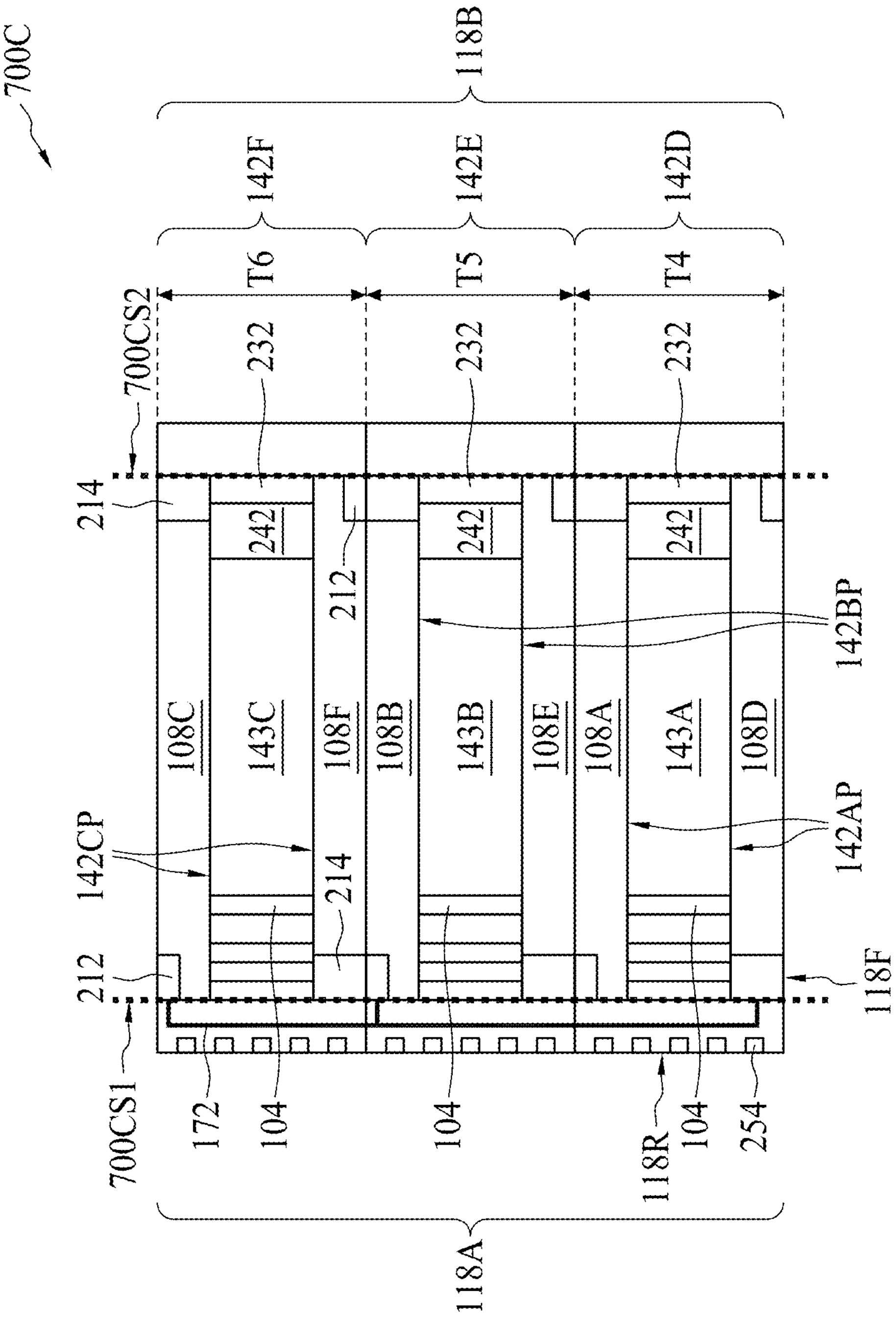
Figure 8A:
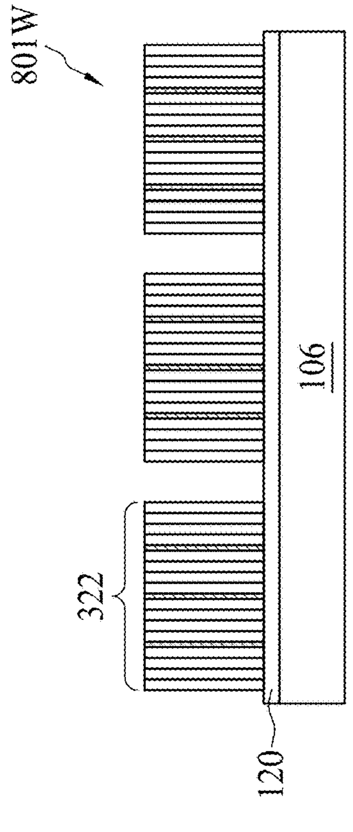
FIGS. 8A to 8E show cross-sectional views of structures in different stages of a method of manufacturing a semiconductor package, in accordance with various embodiments of the present disclosure.
Figure 8B:
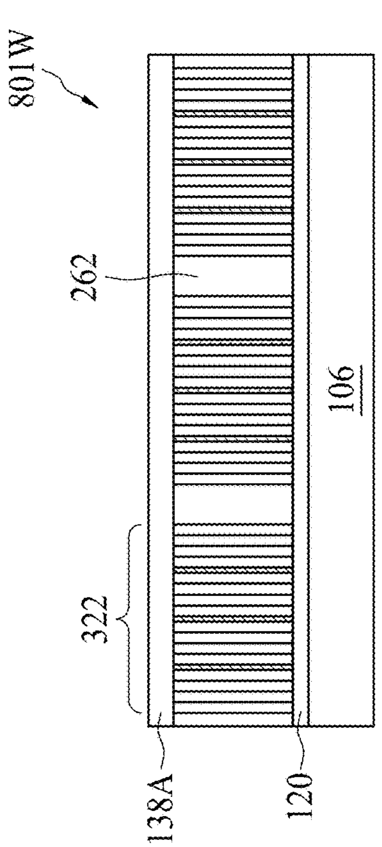
Figure 8C:
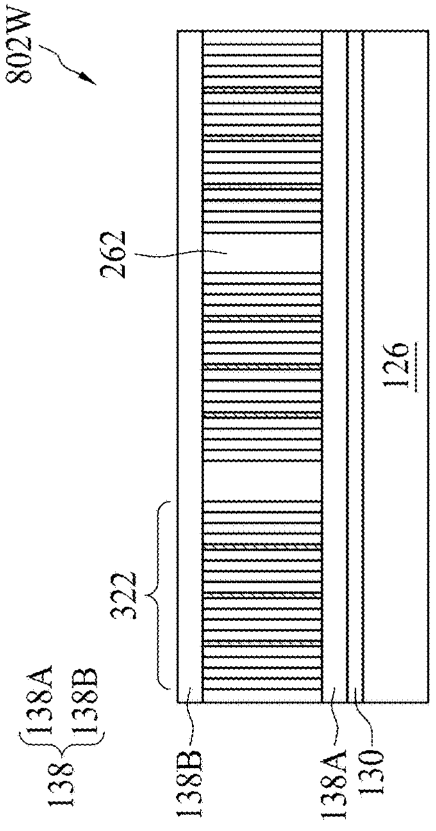
Figure 8D:
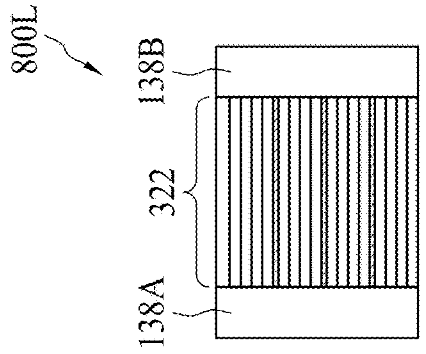
Figure 8E:
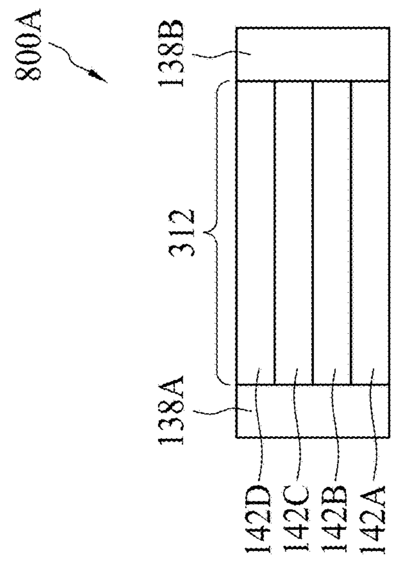

FIGS. 7I and 7J show cross-sectional views of semiconductor packages, 700B and 700C, in accordance with various embodiments of the present disclosure. The semiconductor packages, 700B and 700C, can be seen as detailed versions of the semiconductor package 700A with some minor changes. For example, referring to FIG. 7I, the semiconductor package 700B includes three IC structures, 142A, 142B and 142C, in a vertical stack, wherein each IC structure 142A, 142B or 142C, comprises a respective body and a respective primary RDL 108A, 108B or 108C on its top side, arranged on the respective upper primary surfaces, 142AP, 142BP or 142CP. The body of the IC structure 142A comprises a semiconductor die 143A, the edge TMV 232, the edge TSV 104 and the potting material 242, wherein the semiconductor die 143A includes a plurality of TSVs 104 and a plurality of TMVs 232. Moreover, the body of the IC structure 142B comprises a semiconductor die 143B, the edge TMV 232 and the potting material 242, wherein the semiconductor die 143B includes a plurality of TSVs 104 and a plurality of TMVs 232. Likewise, the body of the IC structure 142C comprises a semiconductor die 143C, the edge TMV 232 and the potting material 242, wherein the semiconductor die 143C includes a plurality of TSVs 104 and a plurality of TMVs 232. IC structures 142A, 142B and 142C can be different sizes and can contain a wide variety of combinations in terms of interior and edge interconnects covering TSVs and TMVs. According to some embodiments, the semiconductor die, 143A, 143B or 143C, can be at least one of a CPU die, a GPU die, a TPU die, a MEMS die, an AP die, an FPGA die, an ASIC die, a memory die, a transceiver die, a network interface die, an integrated photonics die, a packet buffer/router die or another suitable die (e.g., an interconnect die such as an interposer). According to some embodiments, the semiconductor package 700B only includes a single secondary RDL 118A arranged on a left-side secondary plane 700BS of the semiconductor package 700B.

According to some embodiments, the IC structures, 142A, 142B and 142C, are characterized by substantially equal or unequal thicknesses T1, T2 and T3, respectively. Each IC structure, 142A, 142B or 142C, may include a thickness in a range between about 30 μm and about 775 μm.

The secondary RDL 118A includes a front interconnect surface 118F and a back interconnect surface 118R opposite to the front interconnect surface 118F. The secondary RDL 118A is electrically connected to the secondary plane 700BS through the front interconnect surface 118F to aid in routing efficiency and flexibility. For example, the secondary RDL 118A includes a conductive trace or wire 172 extending along a longitudinal axis of the secondary RDL 118A and electrically connecting the edge conductive pad 212 of the primary RDL 108C and the edge TSV 104B of the semiconductor die 143C and 143A while bypassing the bodies of the IC structures 142A, 142B and 142C. Further, the secondary RDL 118A can be used to connect other circuits through the back interconnect surface 118R. For example, the secondary RDL 118A includes one or more conductive bumps, micro-bumps, or a bump pad array 244 (all of which referred to as external connections of the secondary RDL 118A) on the back interconnect surface 118R, wherein the conductive bump 244 is configured to electrically connect the secondary RDL 118A to circuits or layers adjacent to the secondary RDL 118A.

Referring to FIG. 7J, the semiconductor package 700C is similar to the semiconductor package 700B in many aspects, and descriptions of such similar features are not repeated for brevity. According to some embodiments, the semiconductor package 700C includes three IC structures, 142D, 142E and 142F, in a stack, wherein each IC structure, 142D, 142E or 142F, comprises a respective body and two respective primary RDLs, 108A/108D, 108B/108E and 108C/108F, arranged on respective upper and lower primary surfaces, 142AP, 142BP and 142CP.

The semiconductor package 700C differs from the semiconductor package 700B further in that, in the case of 700C, the secondary RDL 118A arranged on a secondary plane 700CS1 of the semiconductor package 700C includes an array of conductive pads 254 on the back interconnect surface 118R of the secondary RDL 118A. According to some embodiments, the conductive pads 254 have upper surfaces that are coplanar with the back interconnect surface 118R of the secondary RDL 118A. Such coplanar arrangement of the secondary RDL 118A is helpful in performing hybrid bonding with other circuits or layers. Additionally, in contrast to the semiconductor package 700B, the semiconductor package 700C further includes another secondary RDL 118B arranged on a secondary plane 700CS2. A configuration of interconnections in the secondary RDL 118B may be similar to or different from that in the secondary RDL 118A. The secondary RDL 118B may include external connections such as micro-bumps, hybrid bonding layers, direct bonding layers, a flexible circuit connector (details thereof are provided below with reference to FIG. 9A), a combination thereof, or the like. Further, the secondary RDL 118A (or 118B) includes a conductive trace or wire 172 extending in the longitudinal axis of the secondary RDL 118A and electrically connecting the edge conductive pads 212 of the primary RDLs 108C and 108B and the edge conductive via 214 of the primary RDL 108D while bypassing the bodies of the IC structure 142D, 142E and 142F to enable skip-die and multi-sided power supply and signaling.

According to some embodiments, the IC structures, 142D, 142E and 142F, are of substantially equal or unequal thicknesses, T4, T5 and T6, respectively. Each IC structure, 142D, 142E or 142F, may include a thickness in a range between about 30 μm and about 775 μm.

Semiconductor packages, 700A, 700B and 700C, allow for skip-die and multi-sided power supply and signaling through interior interconnect structures 108X covering TMVs, primary RDLs 108 and TSVs, skip-die and multi-sided power supply and signaling through edge interconnect structures 118X covering secondary RDLs 118 and edge interconnects, as well as skip-die and multi-sided power supply and signaling through both the interior interconnect structure 108X and edge interconnect structure 118X. These semiconductor packages endowed with multi-sided power supply and signaling enable "PPAC optimization per cubic millimeter" of 3D ICs (exemplified herein by short IC stacks) to be accomplished, wherein a vertical dimension of the 3D ICs can be expanded to cover ICs, interposer, IC package substrate, IC package and system PCB (see, for instance, FIGS. 7I, 7J, 12C, 13C, 14A and 14B).

FIGS. 8A to 8E show cross-sectional views of structures in different stages of a method of manufacturing a semiconductor package 800A, in accordance with various embodiments of the present disclosure. The steps shown in FIGS. 8A to 8E are similar to those shown in FIGS. 7D to 7H in many aspects, and descriptions of such similar features are not repeated for brevity. A main difference between the steps shown in FIGS. 8A to 8E and those shown in FIGS. 7D to 7H is that the edge interconnect RDL structures, 118A and 118B in FIGS. 7D to 7H are replaced with edge interconnect RDL structures, 138A and 138B, which, are formed by bonding flexible printed circuits (Flexes) to side surfaces of the short and tall IC stacks. The Flex may be formed of a plurality of conductive line layers (not separately shown), wherein each conductive line layer includes conductive lines and materials of an IMD layer, e.g., polyimide or benzocyclobutene (BCB), for electrically insulating conductive lines. The Flex may further include bonding pads (not separately shown) formed of gold, solder, or other suitable bonding materials. The Flex provides advantages of being bendable and having high-density, fine-pitch bonding pads (with a pitch down to about 10 μm), and therefore the Flex is suitable for the secondary RDLs, 138A and 138B, for an edge interconnect structure 118X.

Figure 9B:
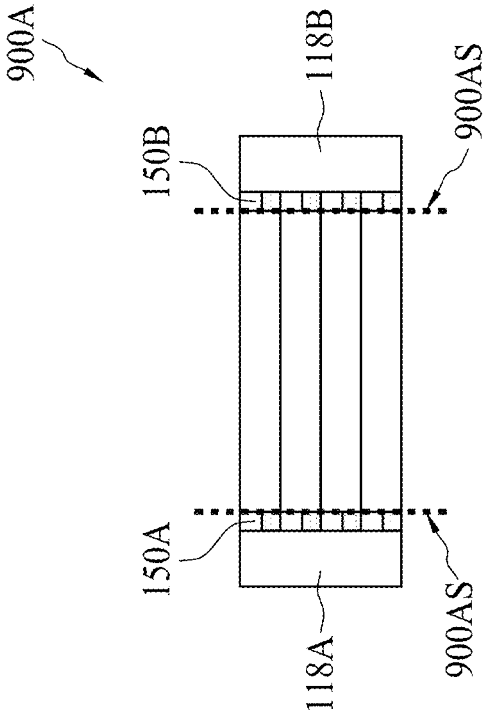
FIGS. 9A and 9B show cross-sectional views of structures in different stages of a method of manufacturing a semiconductor package, in accordance with various embodiments of the present disclosure.
Figure 9A:
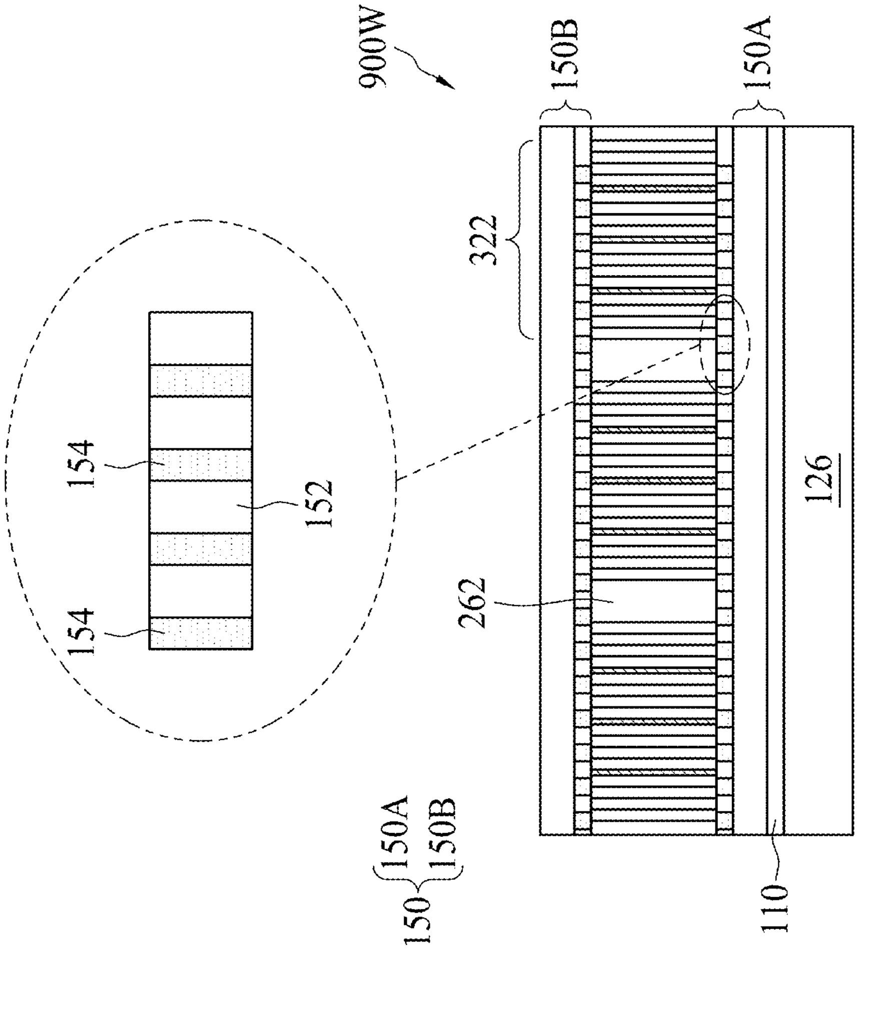

FIG. 9A shows a cross-sectional view of an structure in different stages of a method of manufacturing a semiconductor package 900A, in accordance with various embodiments of the present disclosure. The cross-sectional view of a semiconductor device 900W is a detailed representation of the semiconductor device 802W shown in FIG. 8C. In FIG. 9A, the semiconductor device 900W can be seen to include two connection layers 150, e.g., a first connection layer 150A arranged between molded tall IC stacks 322 and the edge interconnect structure 118A, and a second connection layer 150B arranged between the molded tall IC stacks 322 and the edge interconnect structure 118B. According to some embodiments, the connection layer, 150A or 150B, may include an array of flexible circuit connectors 154 and a non-conductive filler 152 encapsulating the flexible circuit connectors 154. The flexible circuit connectors 154 are bonded to the secondary planes 900AS of short IC stacks 312 (FIG. 9B). The flexible circuit connectors 154 may include conductive materials such as copper, tin, gold, or other conductive materials suitable for bonding. The non-conductive filler 152 may be an encapsulant such as a non-conductive adhesive (NCA), a non-conductive film, a non-conductive paste (NCP) or an encapsulant used in chip-on-film (CoF) packaging of driver ICs for display applications The encapsulant or the non-conductive filler 152 may fill spaces between the flexible circuit connectors 154 and between the secondary planes 900AS and the respective connection layers, 150A and 150B. Referring to FIG. 9B, after a singulation or dicing process, individual short IC stack structures 900A are formed from the semiconductor device 900W.

Flexes based on polyimide dielectric with multiple, say, 2 metal (copper, Cu) layers can be good interconnect solutions for high-speed applications. Flexes can also be used for interconnecting metal pads not just on one side face but also metal pads on multiple side faces because Flexes are mechanically formable and bendable. Flexes can provide high-density interconnects (with pitches down to 20 μm and even to 10 μm), DC power distribution, integrated I/Os (inputs and outputs), power distribution, decoupling and electromagnetic compatibility. All the above good attributes coupled with that Flexes can be tested known-good prior to bonding make Flexes (particularly, adhesive-less Flexes) ideal candidates for 3D IC edge interconnection covering one side face or more. Take chip-on-film (COF) bonding for liquid crystal display applications for instance, adhesive-less Flexes with Cu leads (which can be pre-plated with tin, Sn) are bonded using thermo-compression bonding (TCB) to, for instance, gold bumps, Sn bumps or tin/copper (Sn/Cu) bumps on glass for applications such as mobiles. A solventless epoxy based underfill can be applied following bonding to avoid air bubbles that can be associated with solvent based underfills if not baked properly. Alternatively, a non-conductive adhesive (NCA) or non-conductive paste (NCP) can be applied prior to bonding to glass followed by TCB, in a way similar to fine-pitch flip chip micro-bump assembly. For edge interconnection of short 3D IC structure stacks using Flexes, one can first create the bumps on the edge pads, edge vias, edge TSVs and/or edge TMVs and then proceed to bond Flexes using thermo-compression bonding and NCA onto the bumps on one side face or more. Pre-baking the circuitry prior to Flex bonding can be performed to ensure delamination will not occur. Flexes can also be used to interconnect metal pads and RDLs on different side faces of the short 3D IC structure stack. Metal pads on the bonded Flexes residing on different side faces can be interconnected using, for instance, Flexes with leads/pads containing palladium (Pd) passivation for Flex-to-Flex bonding at low-temperatures such as 140° C.

Figure 10B:
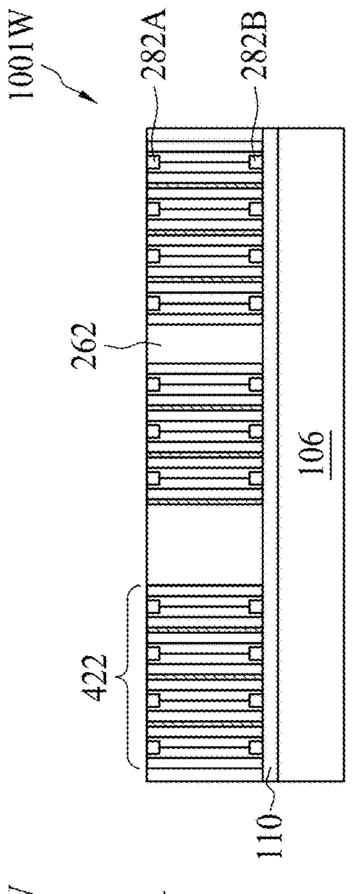
FIGS. 10A to 10H show cross-sectional views of structures in different stages of a method of manufacturing a semiconductor package, in accordance with various embodiments of the present disclosure.
Figure 10D:
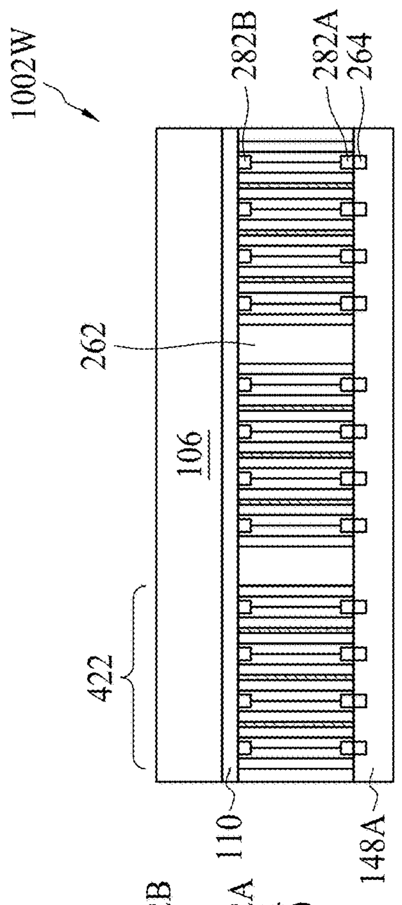
Figure 10A:
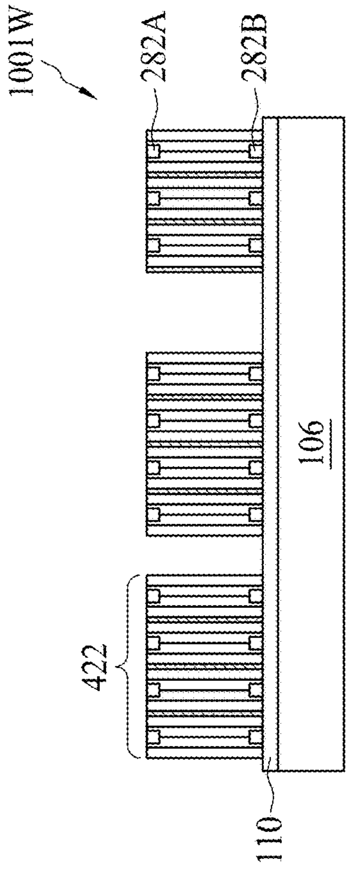

FIGS. 10A to 10H show cross-sectional views of structures in different stages of a method of manufacturing a semiconductor package 1000A, in accordance with various embodiments of the present disclosure. The steps shown in FIGS. 10A to 10H are similar to those shown in FIGS. 7D to 7H in many aspects, and descriptions of such similar features are not repeated for brevity. Referring to FIG. 10A, a semiconductor device 1001W is provided. The semiconductor device 1001W includes a carrier substrate 106 and a release layer 110 over the carrier substrate 106. A plurality of tall IC stacks 422 are prepared and arranged on the release layer 110. Each tall IC stack 422 is formed in a manner similar to the steps described with reference to FIGS. 7A to 7C. In other words, each tall IC stack 422 includes a plurality of short IC stacks 1000A (see FIG. 10H) arranged alternately with a plurality of release layers 140 (see FIG. 10G). Further, each short IC stack 1000A includes a plurality of IC structures 162 (e.g., IC structures 162A, 162B, 162C and 162D shown in FIG. 10H). A main difference between the IC structures 162 and the IC structures 142 in FIGS. 7D to 7H is that the IC structures 162 include edge conductive pads 282, e.g., edge conductive pads, 282A and 282B (FIG. 10B), arranged on two side surfaces of the respective IC structures 162. The edge conductive pads, 282A and 282B, may be arranged in the respective IC structures 162 in a manner similar to those of the edge TSV 104B, the edge conductive vias 214 or the edge conductive pads 212 in the IC structure 100A (FIG. 2D), of the edge TMVs 232 in the IC structure 300C (FIG. 3F), or the like.

Figure 10C:
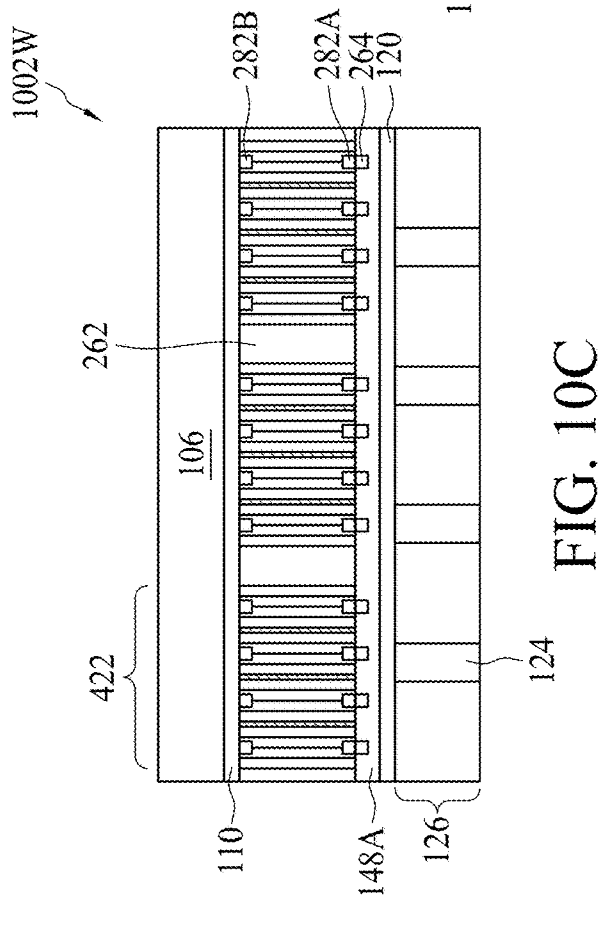

Referring to FIG. 10B, the semiconductor device 1001W, i.e., the tall IC stacks 422, is molded or encapsulated using a potting material 262 in a manner similar to that shown in FIG. 7E and is planarized. Referring to FIG. 10C, another carrier substrate 126 is provided in a semiconductor device 1002W, and another release layer or a sacrificial layer 120 is formed over the carrier substrate 126. A secondary RDL 148A is formed over the release layer or sacrificial layer 120, wherein the secondary RDL 148A includes an array of conductive pads 264 on an upper surface of the secondary RDL 148A. According to some embodiments, the semiconductor device 1001W is bonded to RDL 148A supported by the carrier substrate 126, forming the semiconductor device 1002W through a hybrid or flip chip bonding process. The semiconductor device 1001W may include a bonding surface formed of metallic surfaces of the conductive pads 282A and dielectric surfaces substantially similar to or different from those of the secondary RDL 148A. Similarly, the secondary RDL 148A includes a bonding surface formed of metallic surfaces of matching conductive pads 264 and dielectric surfaces of an IMD layer of the secondary RDL 148A. Hybrid bonding is performed to form metal-to-metal bonds and dielectric-to-dielectric bonds at an interface of the bonding surfaces of the semiconductor device 1001W and the secondary RDL 148A.

Referring to FIG. 10D, the carrier substrate 126 is removed or detached from the semiconductor device 1002W by releasing the release layer 120. According to some embodiments, referring to FIG. 10C, the carrier substrate 126 includes a plurality of holes 124 extending through a thickness of the carrier substrate 126. The holes 124 may facilitate the release of the carrier substrate 126 from the semiconductor device 1002W by wet chemical treatments.

The release or sacrificial layer 120 in FIG. 10C can be made of a mixture of metal and a non-metal. Metal candidates here can include nickel (Ni), chromium (Cr), titanium (Ti), copper (Cu), manganese (Mn), iron (Fc), cobalt (Co), tungsten (W), molybdenum (Mo) and tantalum (Ta), whereas non-metal candidates can include oxides, phosphates and chromates of the metals. Preferred mixtures include chromium and chromium oxide, and nickel and nickel oxide. Methods of deposition include vapor deposition, sputtering, electroplating and immersion plating. Many types of sacrificial layers used in MEMS processing can also be considered: metallic materials such as Cu, Al (aluminum), Ti and Cr, and also non-metallic materials such as silicon dioxide, poly-silicon, and polymers such as poly (methyl methacrylate), polyimide and photoresists (including photosensitive polyimides). The release layer can be quite thin, for instance, less than 0.3 μm in thickness. Chromium oxide, $Cr_2O_3$, has many desirable attributes as a sacrificial layer: it can be sputter deposited to form stress controlled films of several hundred nanometers thick, it adheres well to both dielectric and metal surfaces, it is resistant to most acids and bases, it etches rapidly in standard chromium etchants, and it has minimal tendencies to react with other commonly used materials even at high temperatures. To facilitate subsequent removal through etching, through holes can be created in the substrate to expose the release layers to speed up wet chemical removal.

Figure 10F:
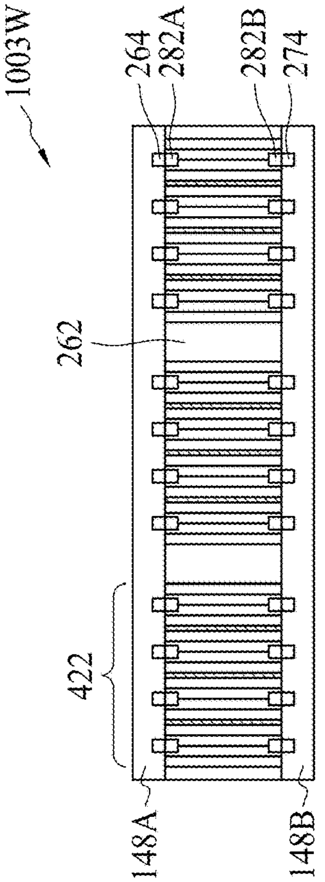
Figure 10E:
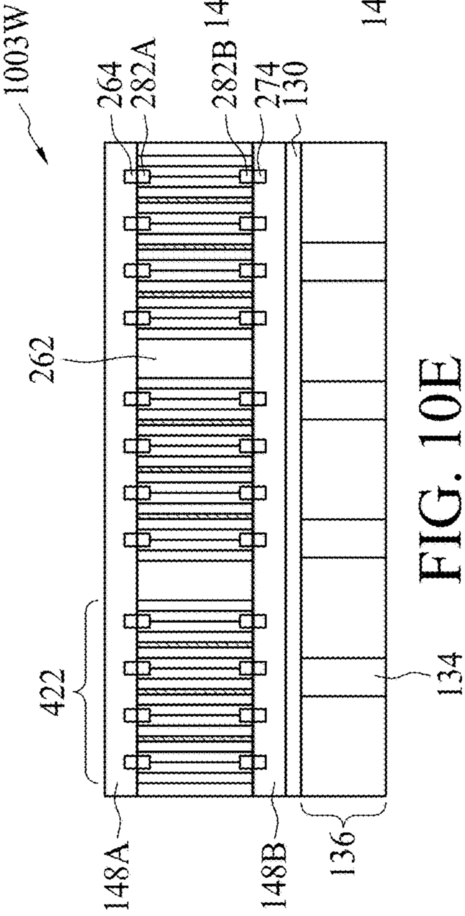

FIG. 10E illustrates formation of a secondary RDL 148B. Another carrier substrate 136 with holes 134 is provided in a semiconductor device 1003W, and another release or sacrificial layer 130 is formed over the carrier substrate 136. The secondary RDL 148B is formed over the release layer 130, wherein the secondary RDL 148B includes an array of conductive pads 274 on an upper surface of the secondary RDL 148B. The semiconductor device 1002W, following bonding to the carrier substrate 136 with the help of the release layer 130 as in the case of 1001W, and release of the carrier substrate 106, is bonded to the semiconductor device 1003W while being supported by the carrier substrate 116 with a wafer-level bonding through a hybrid bonding process. The semiconductor device 1003W includes a bonding surface formed of metallic surfaces of the conductive pads 282B and dielectric surfaces substantially similar to or different from those of the secondary RDL 148B. Similarly, the secondary RDL 148B includes a bonding surface formed of metallic surfaces of the conductive pads 274 and matching dielectric surfaces of an IMD layer of the secondary RDL 148B. Hybrid bonding is performed to form metal-to-metal bonds and dielectric-to-dielectric bonds at an interface of the bonding surfaces of the semiconductor device 1003W and the secondary RDL 148B. Following bonding, the carrier substrate 136 is released from the semiconductor structure 1003W (see FIG. 10F), and the semiconductor structure 1003W is wafer mounted, and the carrier substrate 136 is removed leaving the semiconductor structure 1003W as shown in FIG. 10F mounted on the wafer mount frame ready for singulation or dicing from the semiconductor device 1003W.

Figure 10H:
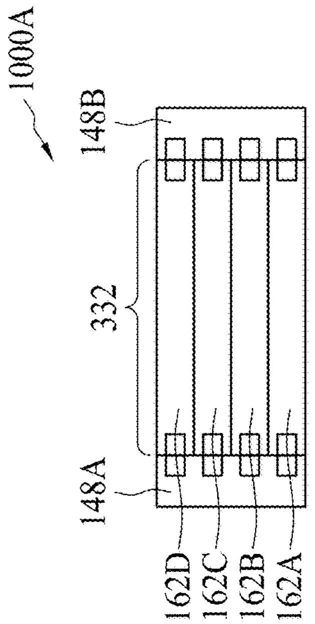
Figure 10G:
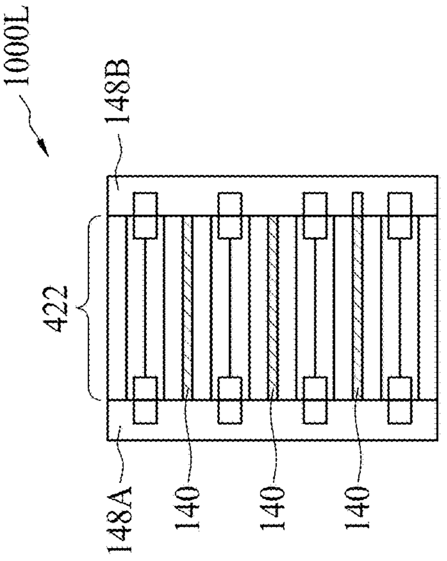

Referring to FIG. 10G, a singulation or dicing process is then performed to separate the semiconductor device 1003W into individual IC structures 1000L, i.e., the tall IC stacks. The singulation or dicing process involving dicing, laser ablation, plasma etching, dry etch, wet etch (e.g., an acid etch), wet cleaning, or a combination thereof may be performed to cut through the semiconductor device 1003W at locations of the potting material 262 to free the tall IC stacks 422 (FIG. 10G) from the semiconductor structure 1003W (FIG. 10F). The secondary RDLs, 148A and 148B, may be formed such that they are absent at the release layers 140 on the dicing or singulation streets between adjacent short IC stacks to facilitate singulation.

FIG. 10H illustrates formation of individual semiconductor packages 1000A, i.e., the short IC stacks, from the respective IC structures 1000L. A release process is performed to remove the release layers 140 from each of the IC structures 1000L such that the semiconductor packages 1000A, i.e., the short IC stacks 332 containing secondary RDLs, 148A and 148B, are separated from each other.

According to some embodiments, a singulation or dicing process involving laser irradiation, thermos-mechanical shearing, dicing, laser ablation, plasma etching, dry etch, wet etch (e.g., an acid etch), wet cleaning, or a combination thereof is performed to aid in the release process by cutting through the secondary RDLs, 148A and 148B, at locations of the release layers 140. The secondary RDLs may be formed such that they are absent at the release layers 140 on the dicing streets between adjacent short IC stacks to facilitate singulation. As illustrated in FIG. 10H, the semiconductor package 1000A includes a stack of IC structures 162 and two secondary RDLs 148A and 148B arranged on two side surfaces of the stack of IC structures 162. The secondary RDLs, 148A and 148B, can help increase a routing area of the IC structures 162, reduce a routing distance, and improve a routing capacity and flexibility of the semiconductor package 1000A.

Figure 11B:
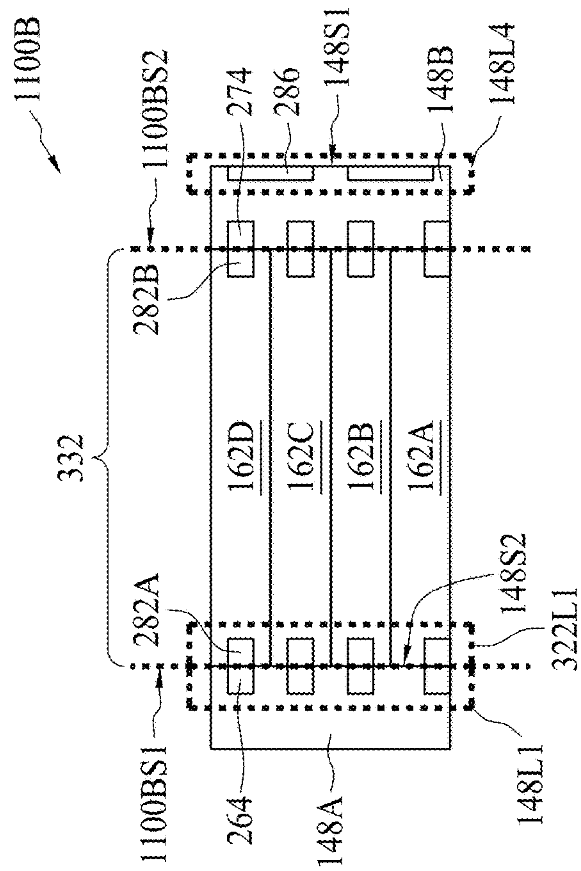
FIGS. 11A and 11B show cross-sectional views of a semiconductor package, in accordance with various embodiments of the present disclosure.
Figure 11A:
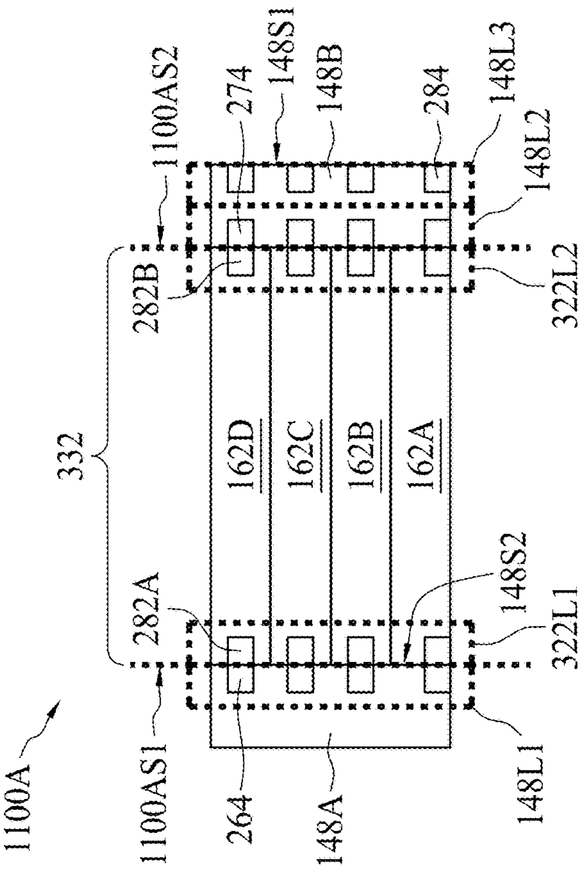

FIG. 11A shows a cross-sectional view of a semiconductor package 1100A, in accordance with various embodiments of the present disclosure. The semiconductor package 1100A is similar to the semiconductor package 1000A in many aspects, and such similar features are not repeated for brevity. The semiconductor package 1100A includes IC structures, 162A, 162B, 162C and 162D, and secondary RDLs 148A and 148B. The semiconductor package 1100A further includes a first bonding layer 322L1 and a second bonding layer 322L2 arranged on two opposite secondary planes 1100AS1 and 1100AS2, respectively, for performing edge interconnection. The first bonding layer 322L1 includes a first bonding surface on the secondary plane 1100AS1. The second bonding layer 322L2 includes a second bonding surface on the secondary plane 1100AS2. The secondary RDL 148A faces the secondary plane 1100AS1, wherein the secondary RDL 148A includes a first bonding layer 148L1 configured to be bonded to the first bonding layer 322L1. Similarly, the secondary RDL 148B faces the secondary plane 1100AS2, wherein the secondary RDL 148B includes a second bonding layer 148L2 configured to be bonded to the second bonding layer 322L2.

According to some embodiments, the first bonding layer 322L1 is bonded to the first bonding layer 148L1 via hybrid bonding. The first bonding layer 322L1 includes a bonding surface formed of metallic surfaces of conductive pads 282A and dielectric surfaces of a dielectric material of the first bonding layer 322L1, e.g., an IMD layer in the first bonding layer 322L1. Similarly, the secondary RDL 148A includes a first bonding surface formed of metallic surfaces of conductive pads 264 and dielectric surfaces of an IMD layer of the secondary RDL 148A. Hybrid bonding is performed to form metal-to-metal bonds and dielectric-to-dielectric (e.g., oxide-to-oxide or polyimide-to-polyimide) bonds at an interface of the first bonding surfaces of the first bonding layer 322L1 and the first bonding layer 148L1. In scenarios where hybrid bonding is adopted, the first bonding layers, 322L1 and 148L1, are referred to herein as hybrid bonding layers.

Likewise, according to some embodiments, the second bonding layer 322L2 is bonded to the second bonding layer 148L2 via hybrid bonding. The second bonding layer 322L2 includes a second bonding surface formed of metallic surfaces of conductive pads 282B and dielectric surfaces of a dielectric material of the second bonding layer 322L2, e.g., an IMD layer in the second bonding layer 322L2. Similarly, the secondary RDL 148B includes a second bonding surface formed of metallic surfaces of conductive pads 274 and dielectric surfaces of an IMD layer of the secondary RDL 148B. Hybrid bonding is performed to form metal-to-metal bonds and dielectric-to-dielectric (e.g., oxide-to-oxide or polyimide-to-polyimide) bonds at an interface of the second bonding surfaces of the second bonding layer 322L2 and the second bonding layer 148L2. In scenarios where hybrid bonding is adopted, the second bonding layers 322L2 and 148L2 are referred to herein as hybrid bonding layers.

According to some embodiments, the first bonding layer 322L1 includes an array of micro-bumps 282A protruding from the bonding surface of the first bonding layer 322L1, and the first bonding layer 148L1 includes an array of bonding pads (or micro-bumps) 264 or bonding pads protruding from the first bonding surface of the first bonding layer 148L1 with the bonding pads matching those of the micro-bumps 282A. The first bonding layer 322L1 is bonded to the first bonding layer 148L1 via flip-chip bonding. An underfill material, e.g., an epoxy-based material, a non-conductive paste or a non-conductive film may be dispensed between the first bonding layers 322L1 and 148L1 to fill the spaces between micro-bumps 282A and bonding pads 264. Similarly, according to some embodiments, the second bonding layer 322L2 includes an array of micro-bumps 282B protruding from the second bonding surface of the second bonding layer 322L2, and the second bonding layer 148L2 includes an array of bonding pads (or micro-bumps) 274 corresponding to the micro-bumps 282B. The second bonding layer 322L2 is bonded to the second bonding layer 148L2 via flip-chip bonding. An underfill material, e.g., an epoxy-based material, a non-conductive paste, or a non-conductive film may be dispensed between the second bonding layers 322L2 and 148L2 to fill the spaces between micro-bumps 282B and bonding pads 274. In scenarios where flip-chip bonding is adopted, the first bonding layers 322L1, 148L1 and the second bonding layers 322L2, 148L2 are referred to herein as flip-chip bonding layers.

According to some embodiments, at least one of the secondary RDLs, 148A and 148B, includes a third bonding layer 148L3 (FIG. 11A only illustrates one third bonding layer 148L3 in the secondary RDL 148B) on a third bonding surface 148S1 opposite to the secondary planes, 1100AS1 and 1100AS2, or the first/second bonding surfaces mentioned above. The third bonding layer 148L3 may include conductive pads 284 or micro-bumps 284 on the third bonding surface 148S1 with configurations similar to those of the first bonding layer 148L1 or the second bonding layer 148L2 depending upon applications, and the third bonding layer 148L3 is configured for hybrid bonding, flip-chip or flex bonding to another circuit or device where appropriate.

FIG. 11B shows a cross-sectional view of a semiconductor package 1100B, in accordance with various embodiments of the present disclosure. The semiconductor package 1100B is similar to the semiconductor package 1100A in many aspects, and such similar features are not repeated for brevity. A main difference between the semiconductor package 1100B and the semiconductor package 1100A is that the semiconductor package 1100B includes a fourth bonding layer 148L4 in place of the third bonding layer 148L3 of the semiconductor package 1100A. The fourth bonding layer 148L4 may be arranged in the secondary RDL 148A or 148B on the bonding surface 148S1 with bonding pads protruding out from the surface 148S1, opposite to a secondary plane, 1100BS1 or 1100BS2. Further, the fourth bonding layer 148L4 includes an array of bond pads 286 arranged on the bonding surface 148S1 of the secondary RDL 148B. The bond pad array of the fourth bonding layer 148L4 may be used to perform flip-chip bonding or other suitable bonding processes with adjacent circuits or devices. The third bonding layer 148L3 or the fourth bonding layer 148L4 is referred to as a hybrid bonding layer or a flip-chip bonding layer depending upon the bonding scenario.

Figure 12A:
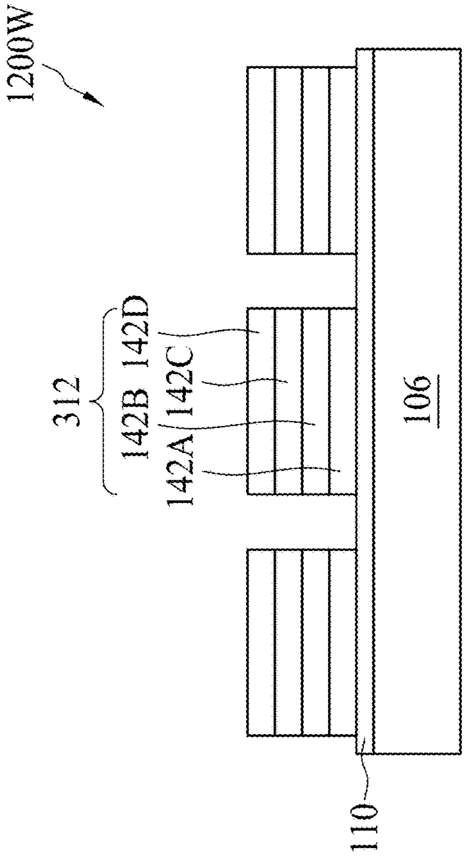
FIGS. 12A to 12C show cross-sectional views of structures in different stages of a method of manufacturing a semiconductor package, in accordance with various embodiments of the present disclosure.
Figure 12B:
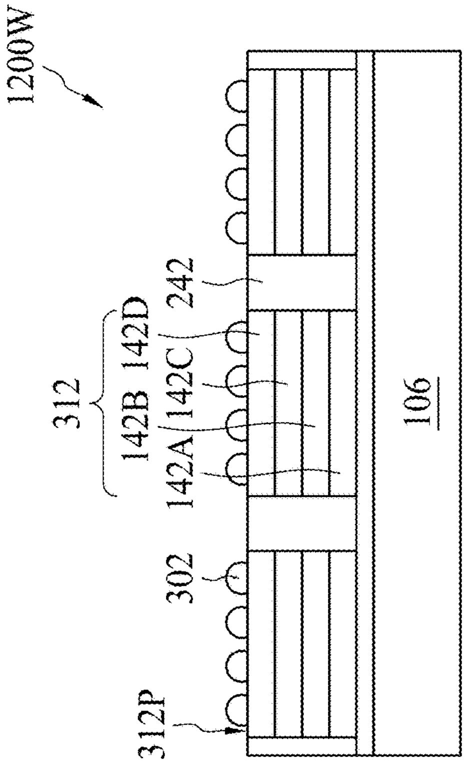
Figure 12C:
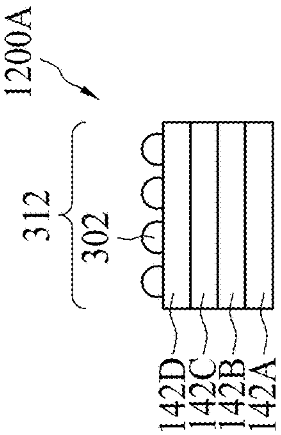

FIGS. 12A to 12C show cross-sectional views of structures in different stages of a method of manufacturing a semiconductor package 1200A, in accordance with various embodiments of the present disclosure. Referring to FIG. 12A, a carrier substrate 106 is provided or received in a semiconductor device 1200W. A release layer 110 is formed over an upper surface of the carrier substrate 106. A pick-and-place process is performed to pick and bond a plurality of known-good IC structures 142, e.g., IC structures 142A, and arrange them in a first tier of respective short IC stacks 312 over the release layer 110 with a suitable pitch. According to some embodiments, the IC structures 142 can be the IC structure 500A, 500B or 600A; however, other types of IC structures, e.g., IC structures 100A, 100B, 100C, 300A, 300B, 300C or the like, are also possible. Another plurality of IC structures 142, e.g., IC structures 142B, are bonded to the corresponding IC structures 142A to form the IC structures 142 in a second tier of the respective short IC stacks 312. The bonding between the IC structures 142A and 142B may be performed using flip-chip bonding, hybrid bonding, die attachment or another suitable bonding process. The process of forming the short IC stacks 312 may continue until a predetermined tier number K is achieved, wherein the tier number K is a natural number. In the depicted example, the tier number K is four. That means that each short IC stack 312 comprises four stacked IC structures, 142A, 142B, 142C and 142D.

Referring to FIG. 12B, the semiconductor device 1200W is molded or encapsulated using a potting material 242. A molding or deposition process is performed to deposit the potting materials 242 in between the short IC stacks 312. According to some embodiments, a planarization process, e.g., CMP, grinding, etch (dry, e.g., by RIE and/or wet) and/or another suitable etching operation, is performed to remove excess potting material 242 and planarize an upper surface of the potting material 242 to flush with primary surfaces of the short IC stacks 312. Subsequently, an array of micro-bumps 302 is formed over the primary surfaces of the short IC stacks 312 or the top die, e.g., the IC structure 142D, serving as part of an interior interconnect structure 108X of the short IC stacks 312.

Referring to FIG. 12C, a singulation or dicing process is performed to separate the semiconductor device 1200W into individual semiconductor packages 1200A. The singulation or dicing process may be performed to cut through the semiconductor device 1200W at locations of the potting material 242 while keeping each short IC stack 312 intact during the dicing process. According to some embodiments, a wet etching or cleaning process is performed to remove residual potting material 242 left on the semiconductor package 1200A.

Figure 13B:
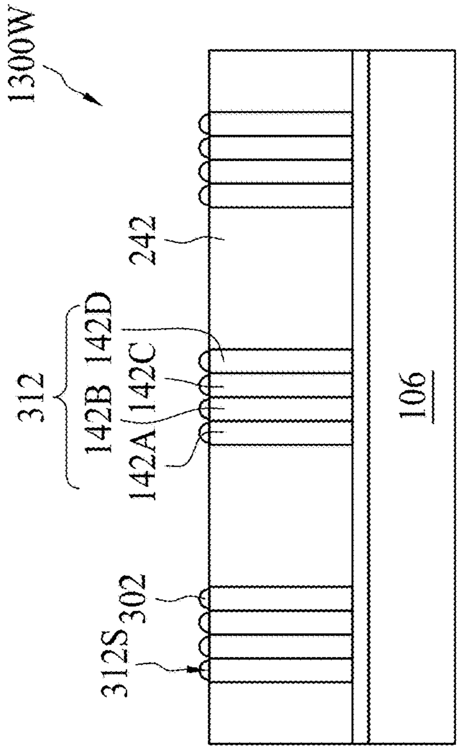
FIGS. 13A to 13C show cross-sectional views of structures in different stages of a method of manufacturing a semiconductor package, in accordance with various embodiments of the present disclosure.
Figure 13A:
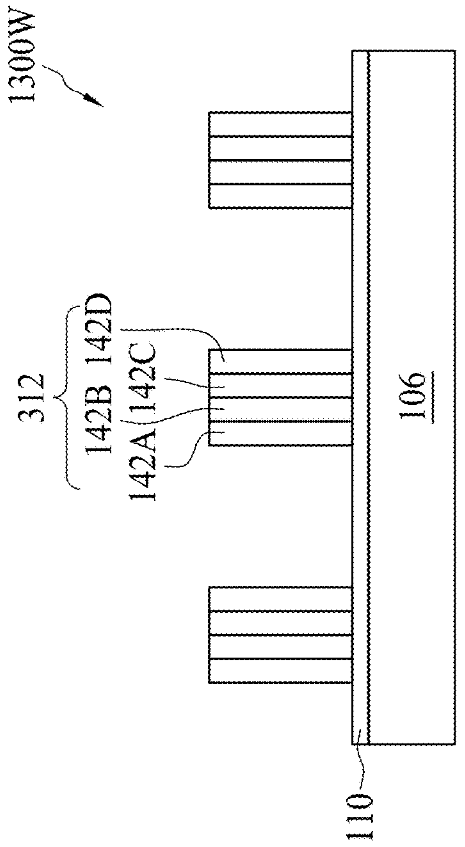
Figure 13C:
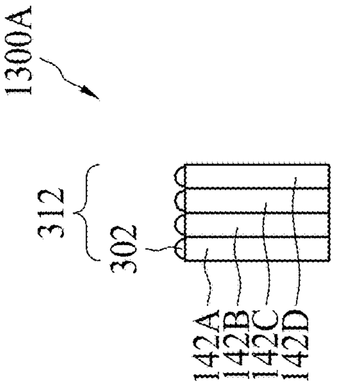

FIGS. 13A to 13C show cross-sectional views of structures in different stages of a method of manufacturing a semiconductor package 1300A, in accordance with various embodiments of the present disclosure. Referring to FIG. 13A, a carrier substrate 106 is provided or received in a semiconductor device 1300W. A release layer 110 is formed over upper surface of the carrier substrate 106. A plurality of short IC stacks 312 are prepared in a separate process, wherein each of the short IC stacks 312 comprises, e.g., four stacked IC structures, 142A, 142B, 142C and 142D, and the short IC stacks 312 is formed through the aforementioned processes. The short IC stacks 312 are arranged on the release layer 110 with a suitable pitch. A main difference between the steps for manufacturing the semiconductor package 1300A and those for manufacturing the semiconductor package 1200A is that the short IC stacks 312 shown in FIG. 13A are arranged in an upright orientation with one side surface exposed facing upward in FIGS. 13A and 13B. In other words, primary surfaces of the ICs in the short IC stacks 312 face each other in a horizontal direction.

Referring to FIG. 13B, the semiconductor device 1300W is molded or encapsulated using a potting material 242, in a manner similar to that described with reference to FIG. 12B. Subsequently, an array of micro-bumps 302 is formed over the side surfaces of the short IC stacks 312 to serve as part of an edge interconnect structure 118X of the short IC stacks 312.

Referring to FIG. 13C, a singulation or dicing process is performed to separate the semiconductor device 1300W into individual semiconductor packages 1300A. The singulation or dicing process may be performed to cut through the semiconductor device 1300W at locations of the potting material 242 in order to free short IC stacks 312 from the potting material 242. According to some embodiments, a wet etching or cleaning process is performed to remove residual potting material 242 left on the semiconductor package 1300A.

Figure 13D:
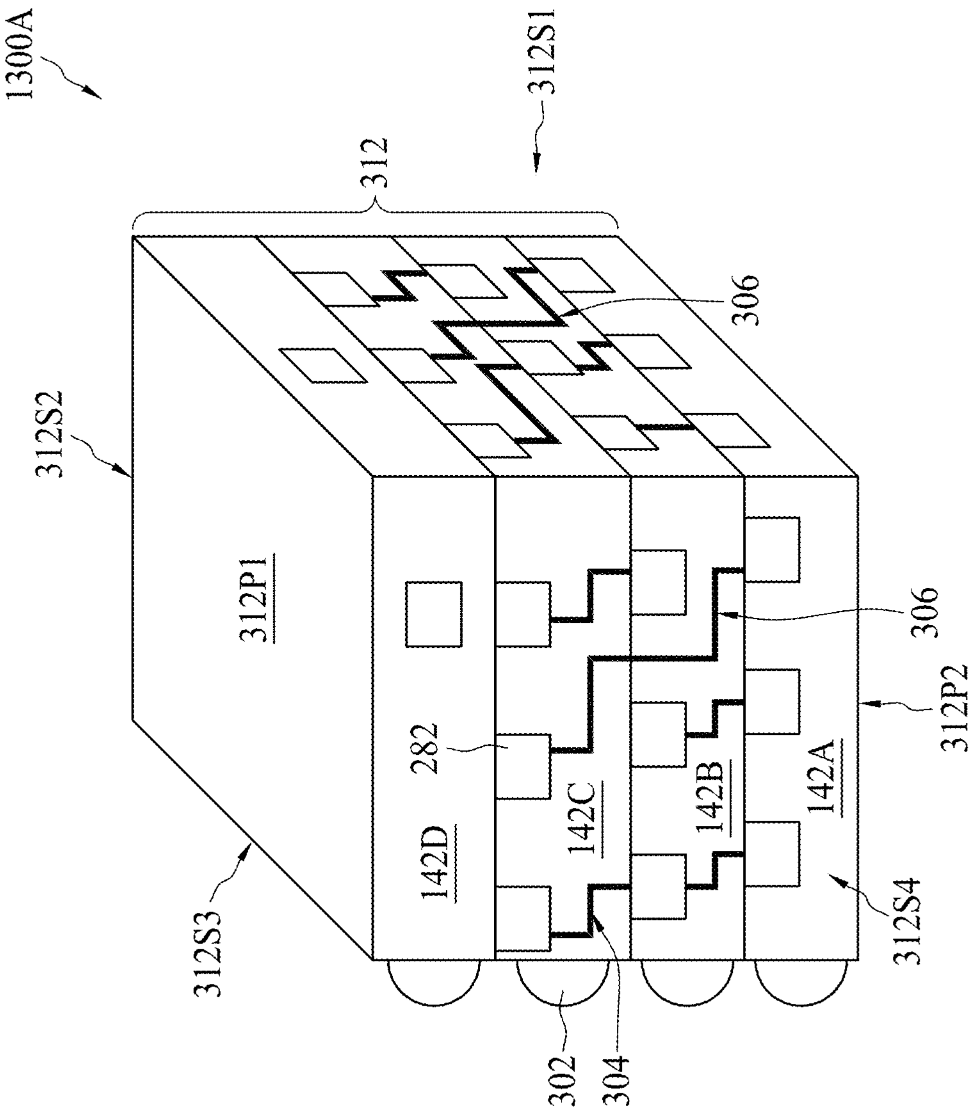
FIG. 13D shows a perspective view of the semiconductor package shown in FIG. 13C, in accordance with various embodiments of the present disclosure.

FIG. 13D shows a perspective view of the semiconductor package 1300A shown in FIG. 13C, in accordance with various embodiments of the present disclosure. The semiconductor package 1300A is an exemplary short IC stack structure that has six side surfaces, which include an upper primary surface 312P1, a lower primary surface 312P2, and four lateral side surfaces, 312S1, 312S2, 312S3 and 312S4, between the two primary surfaces, 312P1 and 312P2. The semiconductor package 1300A further includes edge conductive elements 302, e.g., edge conductive pads, edge conductive vias, edge conductive bumps, micro-bumps and/or hybrid bonding pads, distributed on the side surfaces of the four IC structures, 142A, 142B, 142C and 142D. The semiconductor package 1300A also includes edge conductive traces or wires 304 and 306. The conductive trace 304 may be configured to serve as an adjacent-die interconnect line and used to interconnect edge conductive elements of adjacent IC structures 142, e.g., IC structures 142B and 142C. Further, the conductive trace 306 may be configured as a skip-die interconnect line and used to interconnect edge conductive elements of non-adjacent IC structures 142, e.g., IC structures, 142A and 142C, while bypassing the body of the IC structure 142B. With such configuration, the semiconductor package 1300A can provide shorter routing distances, greater routing efficiency and greater flexibility than existing semiconductor packages which lack the edge interconnect structure 118X.

Figure 14A:
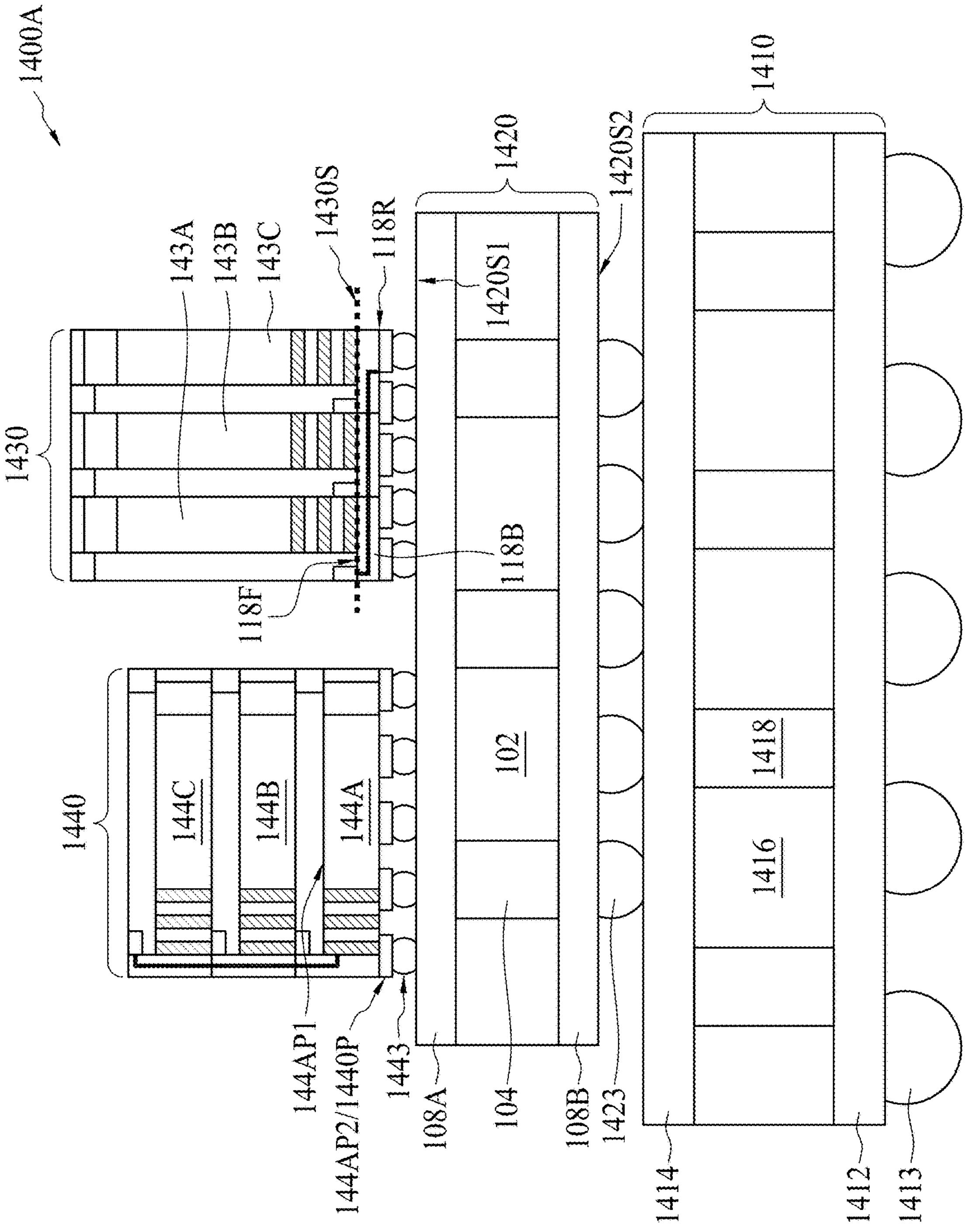
FIGS. 14A and 14B show cross-sectional views of a semiconductor package assembly, in accordance with various embodiments of the present disclosure.

FIG. 14A shows a cross-sectional view of a semiconductor package assembly 1400A, in accordance with various embodiments of the present disclosure. The semiconductor package assembly 1400A includes a substrate 1410, a carrier 1420, a first semiconductor package 1430 and a second semiconductor package 1440, all bonded to each other.

According to some embodiments, the carrier 1420 can be a silicon interposer or a laminate substrate and the substrate 1410 a laminate substrate or a printed circuit board (PCB). The substrate 1410 may be formed of a first buildup layer 1412, a second buildup layer 1414 and a core layer 1416 sandwiched between the first buildup layer 1412 and the second buildup layer 1414. Each of the first buildup layer 1412 and the second buildup layer 1414 is formed of one or more conductive/dielectric layers containing copper or other suitable conductive materials. The conductive materials are insulated from each other by insulating materials, e.g., BT, ABF, polyimide, FR-4, or the like. The core layer 1416 may be formed of one or more dielectric materials, e.g., glass, resin, or the like. The core layer 1416 may include plated through holes 1418 which are formed of conductive materials, e.g., copper, and are configured to be electrically connected to the first buildup layer 1412 and the second buildup layer 1414. The semiconductor package assembly 1400A further includes external electrical connections 1413 for connection to the next-level substrate (not shown). The external connections 1413 may be micro-bumps, solder bumps, ball grid array balls, land grid array pads, or other suitable interconnections.

According to some embodiments, the carrier 1420 is an aforementioned IC structure, an interposer or the like. The carrier 1420 may be configured to support the first semiconductor package 1430 and the second semiconductor package 1440, and to electrically connect the first semiconductor package 1430 to the second semiconductor package 1440, or to electrically connect the first semiconductor package 1430 and the second semiconductor package 1440 to the substrate 1410. According to some embodiments, the carrier 1420 includes a substrate 102 and a plurality of TSVs 104 in the substrate 102. Materials, configurations and methods of forming the substrate 102 and the TSVs 104 are similar to those described with reference to the IC structure 100A shown in FIG. 2D or other suitable IC structures mentioned above. The carrier 1420 further includes a first primary RDL 108A arranged on an upper side of the substrate 102 and a second primary RDL 108B arranged on a bottom side of the substrate 102. The first primary RDL 108A may be electrically connected to the secondary RDL 108B through the TSVs 104. The first primary RDL 108A includes an interconnect surface 1420S1 electrically bonded to the first semiconductor package 1430 and the second semiconductor package 1440. Likewise, the second primary RDL 108B includes an interconnect surface 1420S2 electrically bonded to the substrate 1410. The semiconductor package assembly 1400A may include external connections 1423 electrically connecting the substrate 1410 to the carrier 1420 through a flip-chip bonding process. The external connections 1423 may include micro-bumps, solder bumps, ball grid array balls or other suitable connectors.

According to some embodiments, a structural configuration of the first semiconductor package 1430 is similar to those of the semiconductor packages, 1300A, 700B, 700C, and 1100A, as shown in FIGS. 13C, 7I, 7J, 11A, respectively. Therefore, details of the first semiconductor package 1430 can be found by referring to descriptions of these semiconductor packages. Referring to FIG. 11A and FIG. 14A, the first semiconductor package 1430 includes a secondary RDL 118B formed on a lower secondary plane 1430S of the first semiconductor package 1430. Further, as shown in FIG. 14A, the secondary RDL 118B includes a front interconnect surface 118F facing the IC structures, 143A, 143B, and 143C, and a back interconnect surface 118R opposite to the front interconnect surface 118F. The back interconnect surface 118R is electrically bonded to the interconnect surface 1420S1 of the carrier 1420. As a result, the first semiconductor package 1430 is bonded to the carrier 1420 through an edge interconnect structure 118X of the first semiconductor package 1430. According to some embodiments, the back interconnect surface 118R includes a first bond pad array, and the interconnect surface 1420S1 includes a second bond pad array corresponding to the first bond pad array. The first bond pad array and the second bond pad array are joined via flip chip bonding and jointly form a flip-chip assembly by performing flip-chip bonding.

According to some embodiments, a structural configuration of the second semiconductor package 1440 is similar to that of the semiconductor package 1200A and 700C shown in FIGS. 12C and 7J. Therefore, details of the second semiconductor package 1440 can be found by referring to the semiconductor package 700C. Referring to FIG. 7I and FIG. 14A, the second semiconductor package 1440 includes three bodies including IC structures, 144A, 144B and 144C. The body of the IC structure 144A includes an upper primary surface 144AP1 and a lower primary surface 144AP2 coincident with the lower primary surface 1440P of the second semiconductor package 1440, and therefore the lower primary surface 1440P serves as an interconnect surface of the second semiconductor package 1440. The semiconductor package assembly 1400A further includes external connections 1443 between and electrically connecting the second semiconductor package 1440 and the carrier 1420. According to some embodiments, the external connections 1443 include micro-bumps, solder bumps, or other suitable connectors. The carrier 1420 is bonded to the second semiconductor package 1440 through the first interconnect surface 1420S1 of the carrier 1420 and the interconnect surface of the lower primary surface 1440P of the second semiconductor package 1440 via a flip-chip bonding process. According to some embodiments, the interconnect surface of the lower primary surface 1440P includes a third bond pad array, and the interconnect surface 1420S1 includes the second bond pad array corresponding to the third bond pad array. The second bond pad array and the third bond pad array jointly form a flip-chip assembly by performing flip-chip bonding.

Figure 14B:
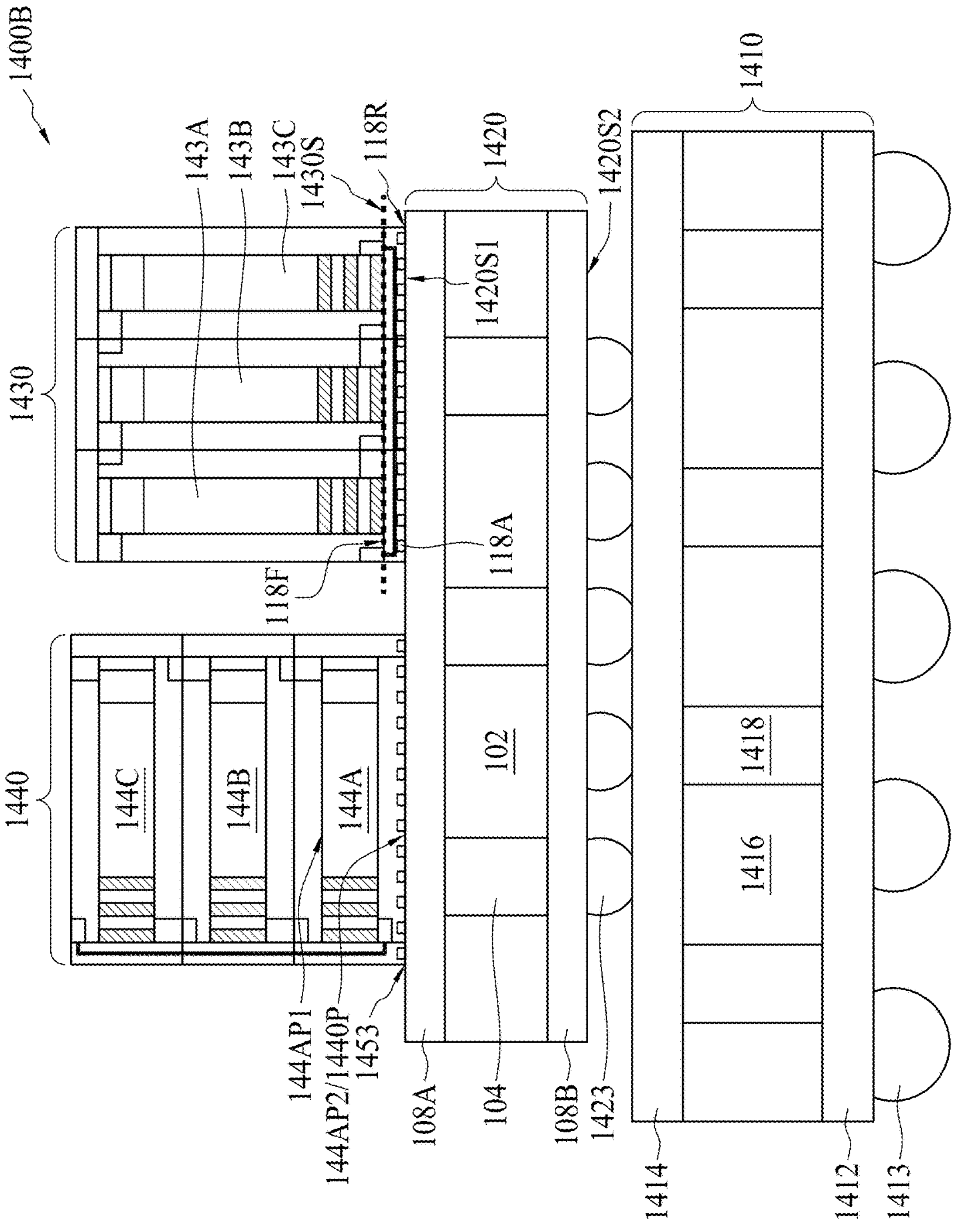

FIG. 14B shows a cross-sectional view of a semiconductor package assembly 1400B, in accordance with various embodiments of the present disclosure. The semiconductor package assembly 1400B is similar to the semiconductor package assembly 1400A in many aspects, and such similar aspects are not repeated for brevity. Referring to FIG. 7J and FIG. 14B, the first semiconductor package 1430 includes a secondary RDL 118A bonded to a lower secondary plane 1430S of the first semiconductor package 1430. Further, the secondary RDL 118A includes a front interconnect surface 118F facing the IC structures, 143A, 143B and 143C, and a back interconnect surface 118R opposite to the front interconnect surface 118F. The back interconnect surface 118R is electrically bonded to the interconnect surface 1420S1 of the carrier 1420. As a result, the first semiconductor package 1430 is bonded to the carrier 1420 through an edge interconnect structure 118X of the first semiconductor package 1430. According to some embodiments, the secondary RDL 118A includes a first bonding layer 118L1 bonded to a first bonding layer of a first primary RDL 108A through a hybrid bonding process. According to some embodiments, the back interconnect surface 118R includes a first hybrid bonding layer, and the interconnect surface 1420S1 includes a second hybrid bonding layer corresponding to the first hybrid bonding layer for performing hybrid bonding.

According to some embodiments, a structural configuration of the second semiconductor package 1440 shown in FIG. 14B is similar to that of the semiconductor package 700B shown in FIG. 7I. Referring to FIG. 7I and FIG. 14A, the second semiconductor package 1440 includes three bodies including IC structures, 144A, 144B and 144C. The body of the IC structure 144A includes an upper primary surface 144AP1 and a lower primary surface 144AP2 coincident with the lower primary surface 1440P of the second semiconductor package 1440, and therefore the lower primary surface 1440P is an interconnect surface of the second semiconductor package 1440. The IC structure 144A further includes a bonding layer facing the carrier 1420, and the first primary RDL 108A further includes a bonding layer facing the second semiconductor package 1440. The carrier 1420 is bonded to the second semiconductor package 1440 through the first interconnect surface 1420S1 and the interconnect surface 1440P of the semiconductor package 1440 via a hybrid-bonding process. According to some embodiments, the interconnect surface of the lower primary surface 1440P includes a third hybrid bonding layer, and the interconnect surface 1420SI includes the second hybrid bonding layer corresponding to the third hybrid bonding layer for performing hybrid bonding.

The embodiments discussed above are described with scenarios of 3D ICs as examples. However, the present disclosure is not limited thereto. The methodologies, processes and structures discussed in the present disclosure can also be applied to other advanced systems-in-a-package (SiPs) comprising fan-out, embedded SiP, silicon photonics and their combinations, e.g., the embodiments shown in FIGS. 1A, 1B, 1C, 1D, 1E and 1F, wherein the SiPs involving die stacking in the thickness direction are employed.

According to some embodiments, the IC structures 100A, 300A to 300C and 400A to 400H, can be based on a silicon substrate 102 or other types of substrate 102 such as SiC.

Referring to FIGS. 7A and 7B, according to some embodiments, the carrier substrate 106 can be a 12" wafer carrier or a larger panel carrier in order to increase carrier utilization. Referring to FIG. 7B, the release layer 140 can also be a permanent bonding layer such as a die attach film (DAF) used in stacked-die packaging-similar to that used in bonding the dies (IC structures, 142A to 142D) together to form the short 3D IC stacks 312—wherein the film is pre-applied to backside of the dies, 142A to 142B, while still in wafer form and the die/film combos are picked up for die bonding from wafer tape following wafer saw.

Referring to FIG. 7E, as discussed previously, the reconstituted tall IC stacks 322 of the semiconductor device 701W are molded or encapsulated using a potting material 262. A material and a configuration of the potting material 262 are similar to those of the potting material 242 or 252. A molding or deposition process is performed to deposit the potting material 262 in between the laid-down tall IC stacks 322. According to some embodiments, an overmolding operation is performed to deposit the potting material 262. According to some embodiments, the potting material 262 can also be a permanent bonding layer such as a molding compound or an encapsulant. According to some embodiments, a planarization process, e.g., CMP, grinding, etching (dry and/or wet) or another suitable etching operation, is performed to remove excess potting material 262 and planarize an upper surface of the potting material 262 and have it flush with a side surface of the tall IC stacks 322 which is also planarized simultaneously with the potting material 262. Subsequently, an edge interconnect structure, RDL 118A is formed over or bonded to at least an edge interconnect of the side surface (secondary plane) of the tall IC stacks 322. According to some embodiments, a bumping operation is performed for die-edge interconnection, in which a plurality of bonding pads are formed on one side of the tall IC stacks 322 or the RDL 118A to electrically connect the tall IC stacks 322 to the RDL 118A.

Referring to FIG. 7F, another carrier substrate 126 is provided or received in another semiconductor device 702W. Another release layer 130 is formed over the carrier substrate 126 to facilitate the creation of RDL 118B. The semiconductor device 701W in FIG. 7E is bonded to the second carrier 126 on the side of RDL 118A. Subsequently, the carrier substrate 116 is released from the semiconductor device 701W by releasing the release layer 120. According to some embodiments, a planarization operation is performed on an exposed secondary surface of the tall IC stacks 322 and the potting material 262 after the carrier substrate 116 is removed and before RDL 118B is formed. The edge interconnect RDL structure 118B is formed or bonded to the lower secondary surface of the tall IC stacks 322 opposite to an upper secondary surface of the tall IC stacks 322.

Referring to FIG. 7G, the carrier substrate 126 is removed or detached from the semiconductor device 702W by releasing the release layer 130. A singulation or dicing process is performed to separate the semiconductor device 702W into tall IC stack structures 700L. The singulation or dicing process may be performed to cut through the semiconductor device 702W at locations of the potting material 262 which can be devoid of metal wiring and even dielectric passivation to facilitate clean separation of the etching or dicing operation with the potting material 262 cleaned by, for instance, dry and/or wet etching while taking care to keep each tall IC stack structure 700L intact during the dicing process. According to some embodiments, a wet etching or cleaning process is performed to remove residual potting materials 262 left on the tall IC stacks structures 700L. According to some embodiments, a planarization operation is performed on the exposed primary surface of the tall IC stack structures 700L to remove the residual potting materials 262.

Referring to FIG. 7H, the individual semiconductor packages 700A, i.e., the short IC stack structures 312, are formed from the respective IC structures, i.e., the tall IC stack structures 700L. A release process, a singulation process and/or a dicing process is performed to detach the release layers 140 (FIG. 7B) from each of the tall IC stack structures 700L such that the different semiconductor packages 700A, i.e., the respective short IC stacks 312 containing the edge interconnect RDL structures, 118A and 118B, are separated from each other. According to some embodiments, an etching or dicing process is performed to aid in the release process, e.g., by dicing, a continuous-wave laser beam, dry etching (e.g., by plasma) and/or wet etching to cut through the secondary RDLs 118A and 118B, at the locations of the release layers 140 which can be devoid of metal wiring and even dielectric passivation to facilitate clean separation of the etching or dicing operation. According to some embodiments, a combination of the wet etching operation, a dicing operation and a planarization operation is performed.

FIGS. 8A to 8E show cross-sectional views of structures in different stages of a method of manufacturing a semiconductor package 800A, in accordance with various embodiments of the present disclosure. The steps shown in FIGS. 8A to 8E are similar to those shown in FIGS. 7D to 7H in many aspects as mentioned in the paragraphs above, and descriptions of such similar features are not repeated for brevity. A main difference between the steps shown in FIGS. 8A to 8E and those shown in FIGS. 7D to 7H is that the edge interconnect RDL structures, 118A and 118B in FIGS. 7D to 7H, are replaced with edge interconnect RDL structures, 138A and 138B, which, are formed by bonding flexible printed circuits (Flexes) to side surfaces of the short and tall IC stacks.

Referring to FIG. 10B, the semiconductor device 1001W, i.e., the tall IC stacks 422, is molded, overmolded or encapsulated using a potting material 262 in a manner similar to that shown in FIG. 7E and is planarized.

FIG. 10E illustrates formation of a secondary RDL 148B. Another support substrate 136 with holes 134 is provided in a semiconductor device 1003W, and another release or sacrificial layer 130 is formed over the support substrate 136. The secondary RDL 148B is formed over the release layer 130, wherein the secondary RDL 148B includes an array of conductive pads 274 on an upper surface of the secondary RDL 148B. The carrier substrate 106 is released from the semiconductor device 1002W by releasing the release layer 110 followed by a planarization operation, e.g., CMP, grinding, etching (dry and/or wet) or another suitable etching operation. The semiconductor device 1002W is then bonded to the support substrate 136 to form semiconductor device 1003W with a wafer-level bonding process such as a hybrid bonding process.

Referring to FIG. 10G, a singulation or dicing process is then performed to separate the semiconductor device 1003W into individual IC structures 1000L, i.e., the tall IC stacks. The singulation or dicing process involving dicing, laser ablation, plasma etching, dry etch, wet etch (e.g., an acid etch), wet cleaning, or a combination thereof may be performed to cut through the semiconductor device 1003W at locations of the potting material 262 which can be devoid of metal wiring and even dielectric passivation to facilitate clean separation of the etching or dicing operation to free the tall IC stacks 422 (FIG. 10G) from the semiconductor structure 1003W (FIG. 10F). The secondary RDLs, 148A and 148B, may be formed such that they are absent at the release layers 140 on the dicing or singulation streets between adjacent short IC stacks to facilitate singulation. According to some embodiments, a planarization process, e.g., CMP, grinding, etching (dry and/or wet) or another suitable etching operation, is performed to remove the potting material 262 (see FIG. 10G) or the release layer 140 (see FIG. 10H), planarize an upper surface of the secondary RDLs, 148A and 148B and have them flush with a side surface of the tall IC stacks 422 (see FIG. 10G) or the tall IC stacks 322 (see FIG. 10H).

More process options/refinements and IC options beyond what were described above are highlighted below. In the building block structures 100A, 300A to 300C and 400A to 400H shown in FIGS. 2C, 3D, 3E, 3F, 4G, 4H, 4I, 4J, 4K, 4L, 4M and 4N:

(a) An active IC, e.g., the IC structures 100A, 300A to 300C and 400A to 400H, can be based on a silicon substrate or a high-thermal-conductivity (HTC), low-coefficient-of-thermal-expansion coefficient substrate (HTCC substrate) such as diamond, aluminum nitride, boron nitride or silicon carbide;

(b) An IC, e.g., the IC structures 100A, 300A to 300C and 400A to 400H, can also be an interconnect spacer (e.g., a passive or an active silicon interposer) with HTC RDLs on both sides or with a single-sided RDL and with or without through vias in order to help conduct heat away from adjoining chips and route more I/Os to 3D IC side surfaces (using the additional side surface areas provided by the spacer), wherein the substrate material of the interconnect spacer can be an HTC material such as diamond, aluminum nitride, boron nitride, silicon carbide or a metal material such as Cu with proper isolation as needed, or an HTCC material such as diamond, aluminum nitride, boron nitride, silicon carbide or a clad metal such as Cu/Invar/Cu or Cu/Mo/Cu;

(c) An IC, e.g., the IC structures 100A, 300A to 300C and 400A to 400H, can also be an HTCC or HTC spacer as mentioned directly above containing only HTC RDLs without through vias to help conduct heat away from adjoining chips and to route more I/Os to IC side surfaces; and (d) An RDL (redistribution layers) structure 108A, 108B, 108C, 108D, 108E, 108F, 118A, 118B, 138A, 138B, 148A, 148B, or the like, can be based on an HTCC or an HTC dielectric with metal wiring such as Cu or a suitable metal such as tungsten (W).

Figure 15A:
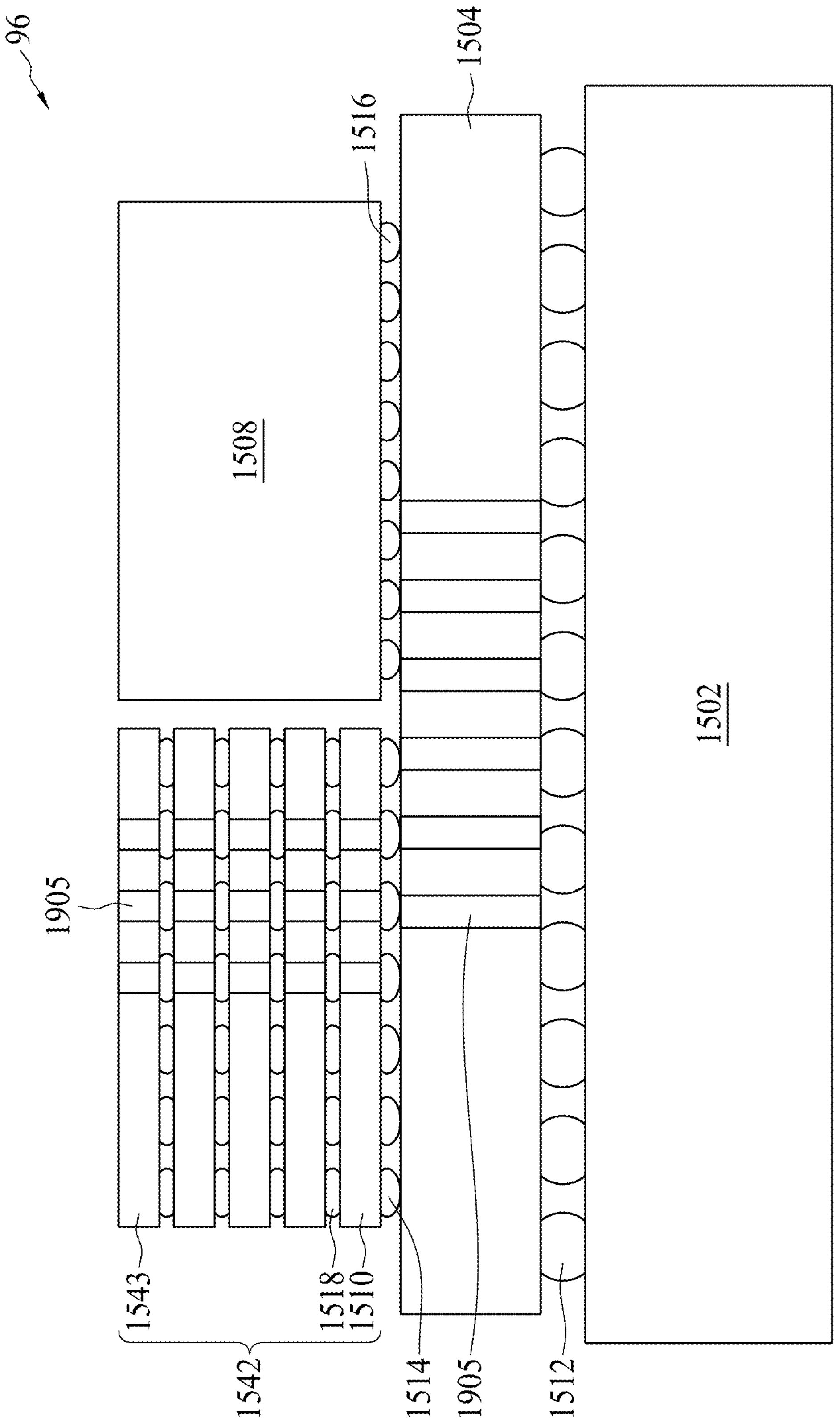
FIG. 15A shows a cross-sectional view of a semiconductor package assembly, in accordance with a comparative example of the present disclosure.

FIG. 15A shows a cross-sectional view of a conventional semiconductor package assembly 96. The semiconductor package assembly 96 includes a laminate substrate 1502, an interposer 1504, a first semiconductor HBM stack 1542, a second semiconductor logic die 1508 and a logic memory control chip 1510 (also referred to as a controller or a controller die). The first HBM semiconductor stack 1542 is a stack of memory dies 1543 stacked on the primary surfaces thereof. The second logic semiconductor die 1508 is one of a CPU die, a GPU die, a TPU die, a MEMS die, an AP die, an FPGA die, an ASIC die, a transceiver die, a network interface die, an integrated photonics die, a packet buffer/router die or another suitable die. However, issues confronting the next-generation HBM, i.e., HBM4, include:

(a) Extreme costs pertaining to lack of known-good die, low yields and large numbers of TSVs;

(b) Monopoly of HBMs by the big three, SK Hynix, Samsung and Micron;

(c) Lack of support from the big three on customization or memory optimization:

(d) Possible migration of advanced packaging from flip chip based on copper pillar micro-bumps to very costly copper hybrid bonding, which is still in its nascent stage and can dramatically increase the cost;

(e) Advanced packaging capability and capacity are often the bottleneck which together with low yields impact steady HBM supply; and (f) Overheating concern with regard to middle memory tiers and bottom memory tiers in the HBM stacks (because cooling is taking place from the backside of the top-tier DRAM) particularly as the number of DRAM increases from 12 in HBM3 to 16 in HBM4.

The above issues will be exacerbated as HBM goes beyond HBM4 involving more than 16 DRAM dies. Even if copper hybrid bonding is not implemented in HBM4, the consensus is that it will be in HBM5 with a higher number DRAM tiers.

Figure 15B:
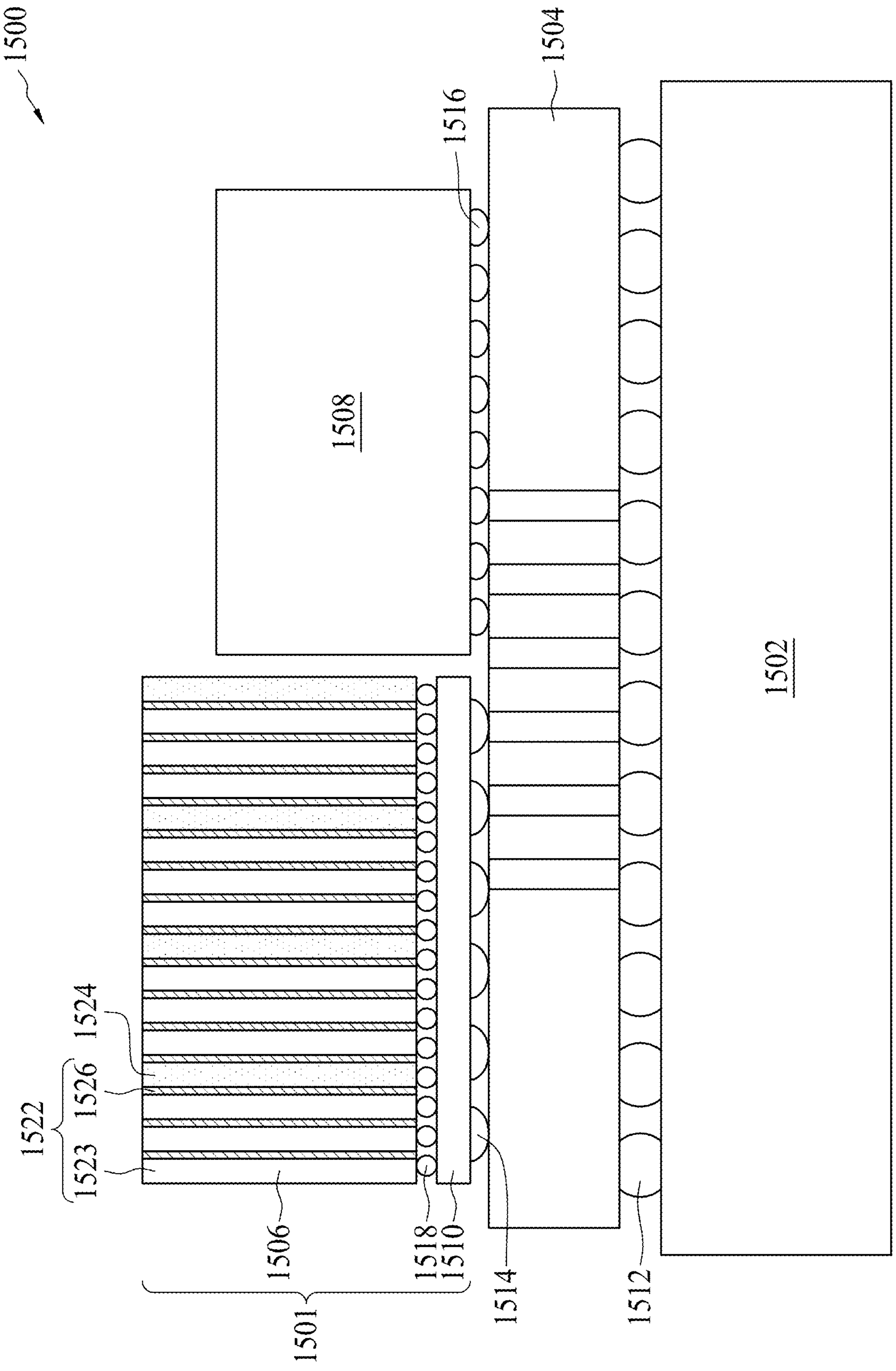
FIG. 15B shows a cross-sectional view of a semiconductor package assembly, in accordance with various embodiments of the present disclosure.

One or more of the four chip-side-surface (CSS) interconnections described above (see FIG. 13D) can be used to resolve issues facing the scaling of HBM from HBM3 (12+1 dies) to HBM4 (16+1 dies) and beyond and possibly revolutionize the field of HBM. Using a 2.5D IC containing side-surface bonded memory stacks as an example (although only interconnections on one side surface are shown, these interconnections can be connected to chip-side-surface interconnections on other chip side surfaces in support of high I/O counts) as shown in FIG. 15B, almost all of the above issues can be resolved (or mitigated) as explained below:

(a) Every memory die can be known-good die prior to assembly and as needed only a smaller number of TSVs and/or edge vias are needed in comparison with HBM stacks, leading to substantially reduce costs;

(b) Smaller memory players (in DRAM, SRAM, etc.) can join the race with the big three using more readily accessible RDL and flip chip technologies from OSATS;

(c) Opportunity to work with more players besides the big three on customization or memory optimization;

(d) No need to use the costly copper hybrid bonding;

(e) Overheating in middle memory tiers and bottom memory tiers in the HBM stacks (because cooling is taking place from the backside of the top-tier DRAM) can be prevented as heat will now be conducted through silicon with a thermal conductivity greater than 100 times of that of silicon dioxide (rather than a combination of silicon and the poorly heat dissipating silicon dioxide in conventional HBM stacks) and with the use as needed of HTCC substrates/interposers and/or HTC spacers—this also allows the number of DRAM or a suitable memory device to increase from 12 in HBM3 to 16 in HBM4 and beyond 16 in the future with having to worry about the overheating effects; and (f) Most importantly, easy scalability to more memory dies in comparison with conventional HBM technologies whose total heights are set at about the height of the GPU (see FIG. 15B) at around 750 μm. As the number of DRAM dies increases from 12 to 16 and beyond, the requirements involving thinner DRAM dies and their interconnection further aggravate the aforementioned technical, manufacturing, cost and supply chain challenges.

In one embodiment of the present invention, using an HBM2E DRAM (10.5 mm in length×9.5 mm in width) as a reference while assuming a length of 5.25 mm (at half of HBM2E length), a width of 9.5 mm and a thickness of 500 μm, a total of 16 semiconductor structures 1522 (a combination of 16 DDR dies and/or spacers/interconnects of the same thickness, 500 μm) connected on one chip side surface in the width direction (see FIG. 15B) to the control die 1510 will provide a total chip side surface area of 76 $mm^2$ (without counting the thicknesses of the bonding layers in between dies). Assuming a DRAM bump pitch of 60 μm (57 μm or 29 μm in HBM2E; 60 μm is assumed here) and a DRAM bonding pad diameter of 14.6 μm as in HBM2E, a surface area of 76 $mm^2$ can support a maximum I/O count of 87,040 which is far more than needed. Moreover, besides the bonding pads located over an edge or a sidewall of a DRAM chip, additional bonding pads could be located over the edge or sidewall of another integrated circuit (IC) structure, an interconnect spacer, a potting or molding compound layer, or a high thermal conductivity layer (which is adjacent to the DRAM chip as shown in FIGS. 2C, 3D to 3F, 4G to 4N and 6A to 6E). Thus, the present invention could provide adjustable or extendable bonding pads over the edge or sidewall of one semiconductor structure in FIGS. 2C, 3D to 3F, 4H to 4N and 6A to 6E) (such as 1200~1500, or 1500~2400, etc.), and the set of semiconductor structures then can offer more than ten times bonding pads (such as 12000~15000, or 15000~24000, etc.) over the edges or sidewalls of the set of semiconductor structures.

As shown in FIG. 15B, the semiconductor package assembly 1500 includes an IC stack 1501 including a first semiconductor stack 1506 and a logic control chip 1510, a laminate substrate 1502, an interposer 1504 and a second semiconductor die 1508. According to some embodiments, the first semiconductor stack 1506 is a memory stack structure, and the second semiconductor die 1508 is one of a CPU die, a GPU die, a TPU die, a MEMS die, an AP die, an FPGA die, an ASIC die, a transceiver die, a network interface die, an integrated photonics die, a packet buffer/router die or another suitable die. According to some embodiments, the first semiconductor stack 1506 includes a plurality of semiconductor structures 1522 including a plurality of IC structures 1523 (which are short IC stacks 312), a plurality of support substrates 1524, and a plurality of bonding or adhesive layers 1526 between adjacent IC structures 1523 or between one IC structure 1523 and a support substrate 1524. According to some embodiments, the adhesive layer 1526 may further include a HTC layer with a thermal conductivity higher than that of silicon or $SiO_2$. According to some embodiments, the support substrate 1524 is an HTCC (High Temperature Co-fired Ceramic) interposer, an HTCC substrate, an HTC substrate, or the like.

According to some embodiments, the support substrate 1524 is arranged as a high thermal conductivity layer adjacent to the semiconductor structure 1522, which is used to conduct away a large amount of heat generated by the IC structures 1523 of the semiconductor structures 1522. The semiconductor structures 1522 can prevent a DRAM overheating environment and ensure DRAM operation under normal conditions. External connectors 1518 are over an edge of the IC structure 1523 and an edge of the neighboring structure 1524.

Figure 16C:
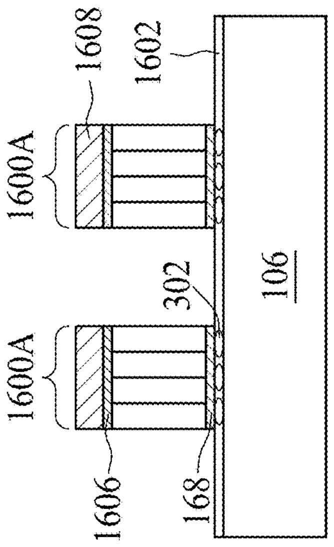
FIGS. 16A to 16E show cross-sectional views of structures in different stages of a method of manufacturing a semiconductor package, in accordance with various embodiments of the present disclosure.
Figure 16B:
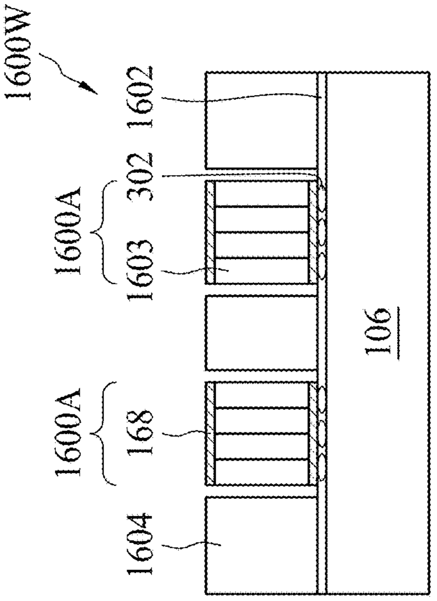
Figure 16A:
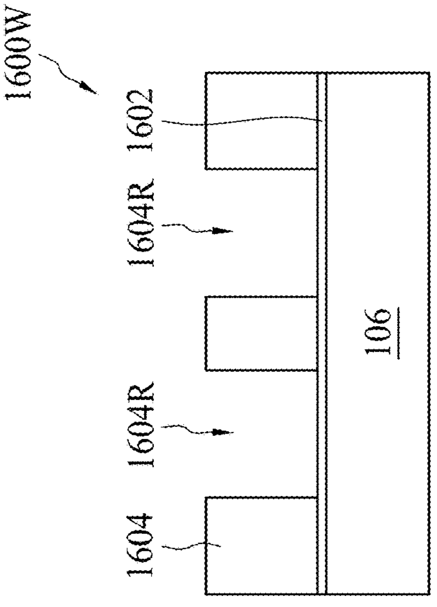

FIGS. 16A to 16E show cross-sectional views in different stages of a method of manufacturing a semiconductor package 1600A, in accordance with various embodiments of the present disclosure. Referring to FIG. 16A, a carrier substrate 106 is received or provided. A release layer 1602 is deposited on or attached to the carrier substrate 106. According to some embodiments, the release layer 1602 is an UV releaseable layer or a thermal release tape. A defining layer 1604 is deposited over the carrier substrate 106 and including a plurality of recesses 1604R, in which the recesses 1604R expose the release layer 1602.

Referring to FIG. 16B, a plurality of semiconductor dies 1600A are prepared or formed. Each of the semiconductor dies 1600A may be similar to a previously mentioned short IC stacks 312 or other IC stacks including a plurality of IC structures 1603 arranged in a stack. According to some embodiments, the semiconductor die 1600A may further include external connectors 302 or bonding pads on a side surface of the short IC stack 312 on RDL 168.

Referring to FIG. 16C, a thermal interfacial material (TIM) 1606 and a heat spreader 1608 are successively deposited or formed over the exposed side surface of each of the semiconductor dies 1600A. According to some embodiments, a lateral side of the TIM 1606 or the heat spreader 1608 is aligned with a primary surface of the semiconductor die 1600A. According to some embodiments, the TIM 1606 is pre-coated on the heat spreader 1608 and is deposited on the side surface of the semiconductor die 1600A along with the attachment or deposition of the heat spreader 1608 on the semiconductor die 1600A.

Figure 16D:
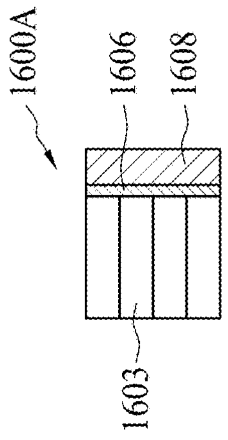
Figure 16E:
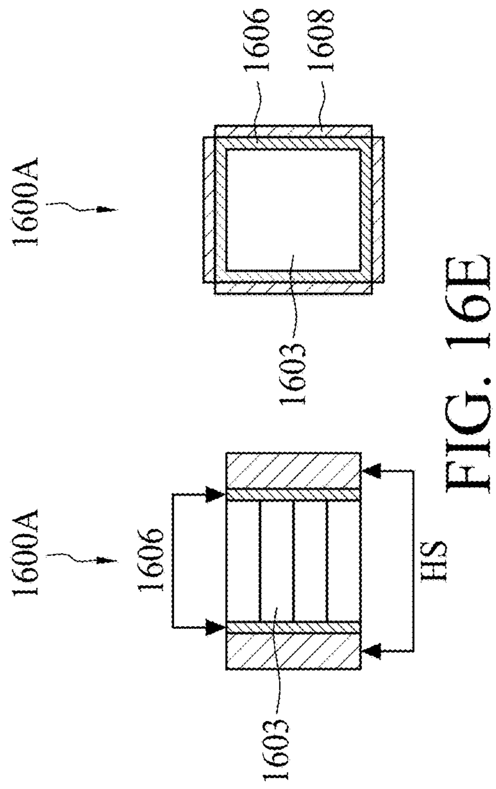

Referring to FIG. 16D, the semiconductor dies 1600A is removed from the carrier substrate 106 through release of the release layer 1602. The semiconductor dies 1600A are turned successively, one surface at a time, to the two other side surfaces and two primary surfaces of the short IC stack and repeat the processes illustrated in FIGS. 16A to 16C under the TIM/heat spreader combos are formed on all five surfaces of the short IC stack with the exception of the side surface which is left for edge interconnection.

Figure 17:
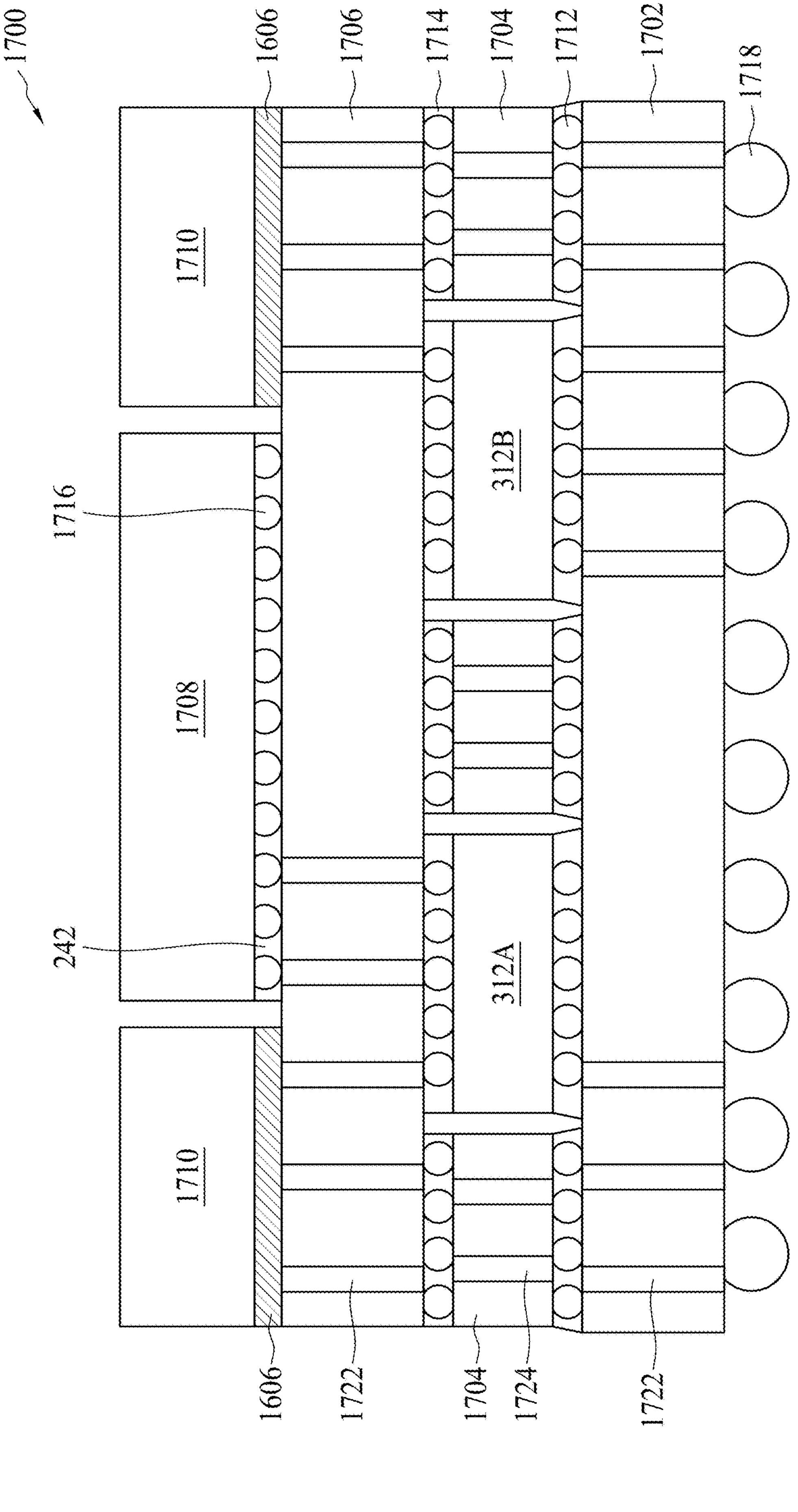
FIG. 17 shows a cross-sectional view of a semiconductor package assembly, in accordance with various embodiments of the present disclosure.

FIG. 17 shows a cross-sectional view of a semiconductor package assembly 1700, in accordance with various embodiments of the present disclosure. The semiconductor package assembly 1700 includes a first interposer 1702, a first semiconductor structure 312A, a second semiconductor structure 312B, three bridge dies 1704, a second interposer 1706, a third semiconductor die 1708, and two heat spreader plates 1710.

According to some embodiments, the first semiconductor structure 312A and the second semiconductor structure 312B include memory dies, and the third semiconductor die 1708 is one of a CPU die, a GPU die, a TPU die, a MEMS die, an AP die, an FPGA die, an ASIC die, a transceiver die, a network interface die, an integrated photonics die, a packet buffer/router die or another suitable die. According to some embodiments, each of the first semiconductor structure 312A and the second semiconductor structure 312B includes a plurality of short memory IC stacks 312 (e.g., 3D IC structure stack 1901 that is described with reference to FIG. 19A or 19B) or other IC stacks. According to some embodiments, the first interposer 1702 or the second interposer 1706 include a plurality of TSVs (through-silicon vias or through vias in case a substrate material other than silicon is used) 1722 electrically connecting the first interposer 1702 or the second interposer 1706 to adjacent circuits. According to some embodiments, the bridge die 1704 includes a plurality of TSVs 1724 electrically connecting the first interposer 1702 to the second interposer 1706.

According to some embodiments, the first interposer 1702 is based on silicon, is an HTC material, or is a lower-thermal conductivity material (e.g., glass). The first interposer 1702 can be bonded to an IC laminate substrate or a printed circuit board. According to some embodiments, the second interposer 1706 includes an HTC substrate. According to some embodiments, the bridge die 1704 is used to power up the third semiconductor die 1708 and provide additional signal paths for the third semiconductor die 1708.

According to some embodiments, thermal management of the semiconductor package assembly 1700 is accomplished through direct-to-chip liquid cooling involving fluidic micro-channels and/or jet flows impinging on backside of the third semiconductor die 1708 as needed, or through liquid immersion cooling involving a dielectric coolant or water which requires the use of a conformal coating material such as parylene to protect the circuits of the semiconductor package assembly 1700.

According to some embodiments, the semiconductor package assembly 1700 further includes a plurality of external connectors 1712 on an upper surface of the first interposer 1702 and electrically connecting the first interposer 1702 to the first semiconductor die 312A, the second semiconductor die 312B and the bridge dies 1704. The semiconductor package assembly 1700 may further include a plurality of external connectors 1714 on an upper surface of the first semiconductor die 312A, the second semiconductor die 312B and the bridge dies 1704, and electrically connecting the first semiconductor die 312A, the second semiconductor die 312B and the bridge dies 1704 to the second interposer 1706, and a plurality of external connectors 1716 on an upper surface of the second interposer 1706 and electrically connecting the second interposer 1706 to the third semiconductor die 1708. An encapsulating material 242 is arranged between the plurality of external connectors 1712, 1714 and 1716. According to some embodiments, the semiconductor package assembly 1700 further includes a plurality of external connectors 1718 on a lower surface of the first interposer 1702 and electrically connecting the first interposer 1702 to an external circuit.

As shown in FIGS. 16A to 16E, the top side or back side of the side-surface-connected 3D memory (such as first semiconductor die 1506 shown in FIG. 15B) can be attached with an HTC material to promote heat dissipation. Similar concepts underlying FIGS. 15B and 16A to 16E on chip-side-surface interconnections can also be applied to the 3D ICs in FIG. 17 wherein the short 3D IC stacks, 312A and 312B, are memory devices connected on either one chip side surface or two chip side surfaces involving the use of thermal metamaterials to minimize thermal cross-talks between a GPU (e.g., third semiconductor die 1708) and the HTC interposers (e.g., the second interposer 1706), and between the first interposer 1702 and the short 3D IC structures that is the new 3D memory structures.

In the conventional 2.5D IC packaging shown in FIG. 15A, cooling is achieved using direct-to-chip liquid cooling involving the attachment of a combination of thermal interface materials, heat spreader and cold plate to the backside of the top DRAM and the GPU. In the new 3D memory stack structure shown in FIG. 15B, cooling of the GPU (e.g., the second semiconductor die 1508) and the 3D memory (e.g., the first semiconductor die 1506) can also be done by direct-to-chip liquid cooling or a combination of direct-to-chip cooling for the GPU and air cooling for the lower-power-dissipating 3D memory. Moreover, both the structures shown in FIGS. 15A and 15B can be cooled using liquid immersion cooling.

As mentioned in the present disclosure, the side surface(s) of 3D IC stacks are used for interconnecting dies in the 3D IC stack to allow for skip-die signal and power distribution, i.e., power and signal can now be supplied from the bottom die (or the interposer supporting the bottom die) on the front-side to not just the die directly above but also directly to all other dies in the 3D IC stack. Moreover, the HTC material is disposed between two adjacent semiconductor dies and thermally coupled to another HTC material covering other side face of 3D IC stack.

In one embodiment, the 3D IC stack includes a plurality of semiconductor dies or IC chip structures, wherein the semiconductor die or IC chip structure, e.g., the die or chip structure has a shape of rectangular cuboid as represented by the structure 108A shown in FIG. 2D and has a top surface 108P1, a bottom surface 108P2, and four sidewalls, 108S1, 108S2, 108S3, and 108S4, wherein the area of the top surface/bottom surface 108P1/108P2 is far larger than those of the sidewalls 108S1 to 108S4 (as shown in FIG. 2D). There are "edge pads/vias" in the form of peripheral pads residing at the periphery, side surfaces or sidewalls (such as one or more sidewalls 108S1 to 108S4) of the semiconductor die or IC chip structure shown in FIG. 2D, and/or pads/vias in the RDL structure of the semiconductor die. Moreover, "edge TSV (through silicon via)" in the semiconductor die can be available as well traversing the entire thickness of the semiconductor die or part of it, as shown in FIG. 2D. To enlarge the area for edge connection on the sidewalls or side surfaces, the edge pad in the RDL structure could be connected to an edge TSV. Those TSVs could penetrate a portion and/or all of the semiconductor die from the top surface 108P1.

Figure 18B:
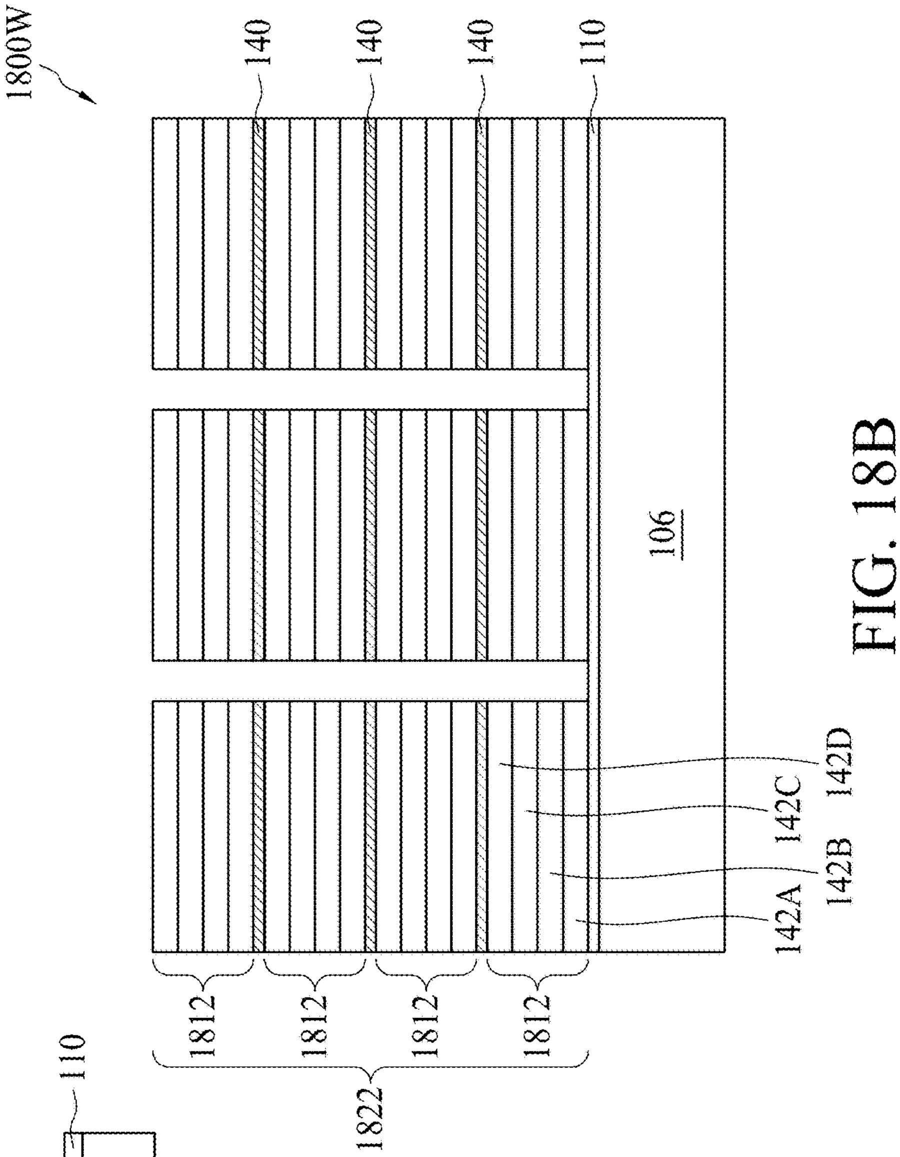
FIGS. 18A to 18H show cross-sectional views of structures in different stages of a method of manufacturing a semiconductor package, in accordance with various embodiments of the present disclosure.
Figure 18A:
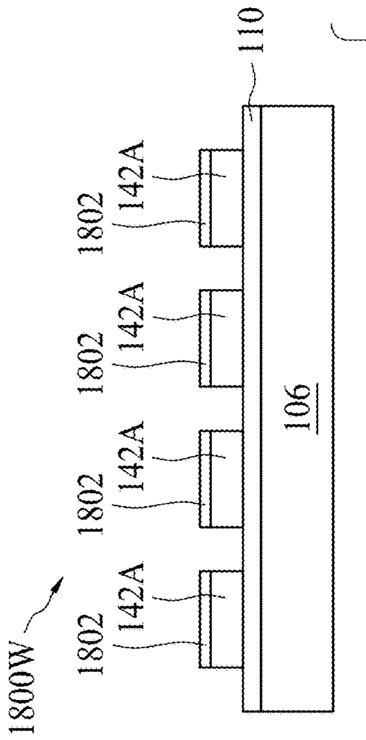
Figure 18C:
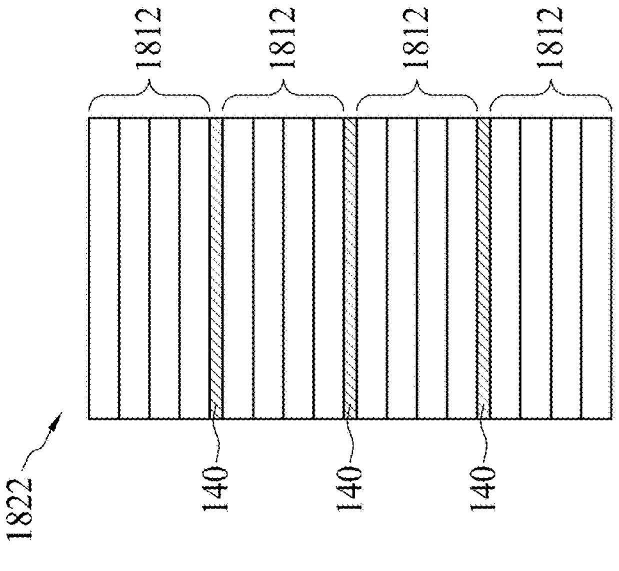

FIGS. 18A to 18H show cross-sectional views of structures in different stages of a method of manufacturing a semiconductor package 1800A, in accordance with various embodiments of the present disclosure. To form short IC stack 1812, as shown in FIGS. 18A to 18C, the IC structures 142A of the short IC stack 1812 can be bonded to a carrier 106, followed by:

(a) Stacking more IC structures 142, e.g., 142B, 142C and 142D, of the same sizes on top of the bottom IC structure 142A to first form the short IC stack 1812 (i.e., the final 3D IC package structure to be interconnected on the side surface(s)), wherein a HTC material (such as AlN/BN/W/Cu/SiC . . . ) 1802 is inserted between two adjacent IC structures 142 (or cover all surfaces between two adjacent IC structures 142). In one embodiment, the thermal conductivity of the HTC layer 1802 is higher than that of Si or $SiO_2$. Alternatively or additionally, a thermoplastic adhesive (not separately shown), for instance, can be released by heating the adhesive to its softening temperature and applying a shear force to slide off one short IC stack 1812 from the other, followed by wet chemical cleaning or etching of the short IC stacks 1812 after release.

(b) Inserting a release layer 140 on top of the short IC stack 1812, and (c) Repeating the above process to build tall 3D IC stacks 1822 (see FIG. 18B) which are thick enough for ease of subsequent processing.

It is more economical to process tall 3D IC stacks 1822 on side faces than a short IC stack 1812. Short IC stacks 1812 tend to be thin, say, on the order of 100 μm, formation of tall IC stacks 1822 allows one to use existing commercial precision equipment to create edge interconnection for short IC stacks 1812 at higher yields. Take today's state-of-the-art 3D IC (with ICs in the IC structure configuration of FIG. 2C), i.e., HBM3 DRAM, for instance, it can support 12 dies. The individual DRAM IC thickness can be around 30~50 μm which is near the practical limits of back grinding. This means a 3D HBM3 DRAM stack containing 12 DRAM ICs and the base logic die can be around 500 μm (about 0.5 mm) in thickness. Stacking 10 of the HBM3 stacks (or short IC stacks 1812 based on the IC structure configuration of FIG. 2C) leads to a total of 120 dies (in the tall IC stack 1822) and a total thickness of about 5,000 μm, i.e., 5 mm, which is more handle-able in manufacturing compared to 0.5 mm.

Figure 18D:
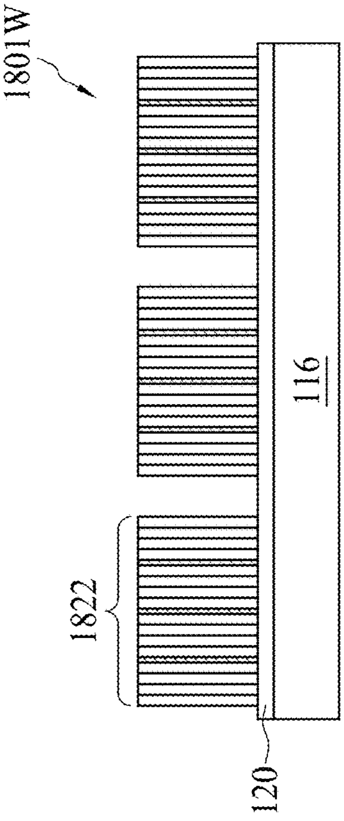
Figure 18E:
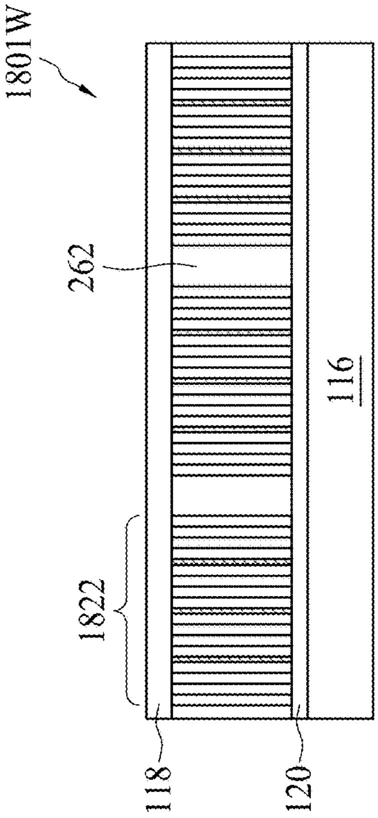
Figure 18F:
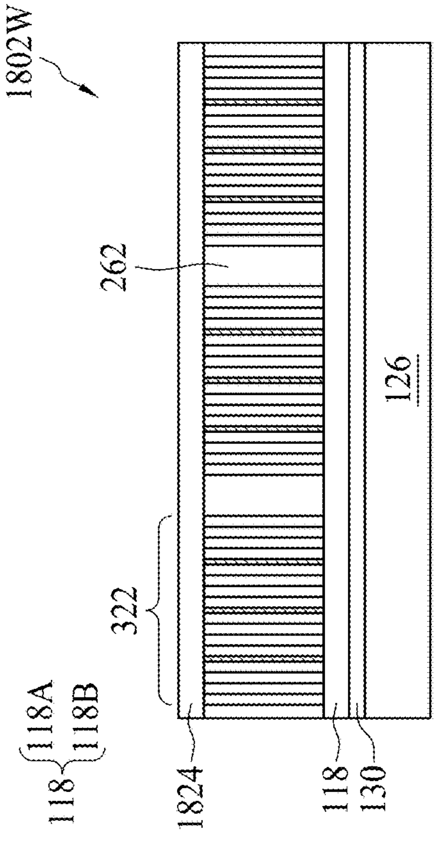
Figure 18G:
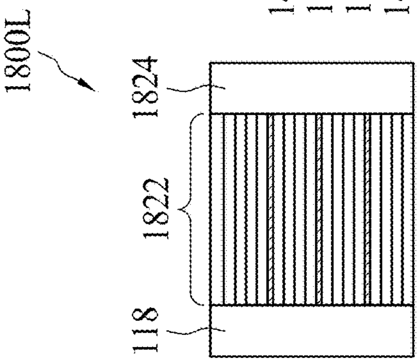
Figure 18H:
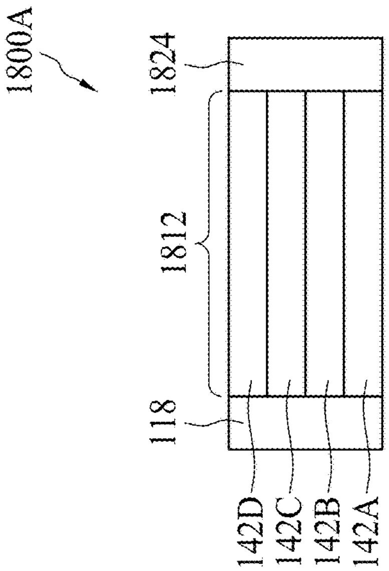

With the tall IC stacks 1822 at hand, one can then bond them sideways to another carrier substrate 116 shown in FIG. 18D and pot them using a polymer material 262 as shown in FIG. 18E such as the Epotek 377 epoxy in vacuum and curing the polymer, followed by:

(a) Planarization (and a light etching or lapping to ensure all edge connections are revealed);

(b) Creation of an RDL structure 118 on side surfaces of the long IC stacks 1822 as shown in FIG. 18E;

(c) Bonding to a carrier substrate 126 and Release of the carrier substrate 116 as shown in FIG. 18F;

(d) Planarization (or a light lapping) of the upper surfaces of the long IC stacks 1822;

(e) Creation of a high thermal conductivity layer 1824 as shown in FIG. 18F (or covering of other one/two/three sidewalls of the tall IC stack 1822; or covering of the rest sidewalls of the tall IC stacks 1822 without the RDL layer structures). In one embodiment, the thermal conductivity of the high thermal conductivity layer is higher than that of Si or $SiO_2$ (such as AlN/BN/W/Cu/SiC . . . );

(g) Release of the carrier substrate 126 as shown in FIG. 18G;

(h) Release of multiple tall IC stacks 1822 into individual tall IC stack structures 1800L as shown in FIG. 18F; and finally (i) Release of a tall IC stack 1822 into individual short IC stacks 1812 or semiconductor packages 1800A.

The aforesaid processes could create RDL structures on two or more side faces as well. An RDL structure on another side face can be created by following part of the process shown in FIGS. 18E to 18H. The tall IC stacks 1822 can be released by laser cutting and dicing (while great care must be taken to avoid damaging electrical leads), followed by an acid etch to remove the potting polymer 262.

Following the release of the tall 3D IC structure stacks 1822, the short IC stacks 1812 or the semiconductor packages 1800A can be released by a sequence of steps starting with laser cutting through the RDL structure 118 in between two short IC stacks 1812, followed by one of two approaches: (1) dicing through the release layer 140 between two adjacent short IC stacks 1812 and wet etching, cleaning and/or a light lapping to removal residual materials of the release layer 140; or (2) thermally softening the release layer 140 and mechanically separating the short IC stacks 1812 one at a time with a kit, followed by wet etching, cleaning and/or a light lapping to removal residual materials of the release layer 140.

The short IC stack 1812 or the semiconductor package 1800A may include a plurality of DRAM semiconductor dies to form the HBM structure, or include a set of DRAM semiconductor dies and a set of FLASH or SRAM semiconductor dies, or includes a plurality of logic dies, or any other combination of DRAM/SRAM/FLASH/logic dies.

Figure 19A:
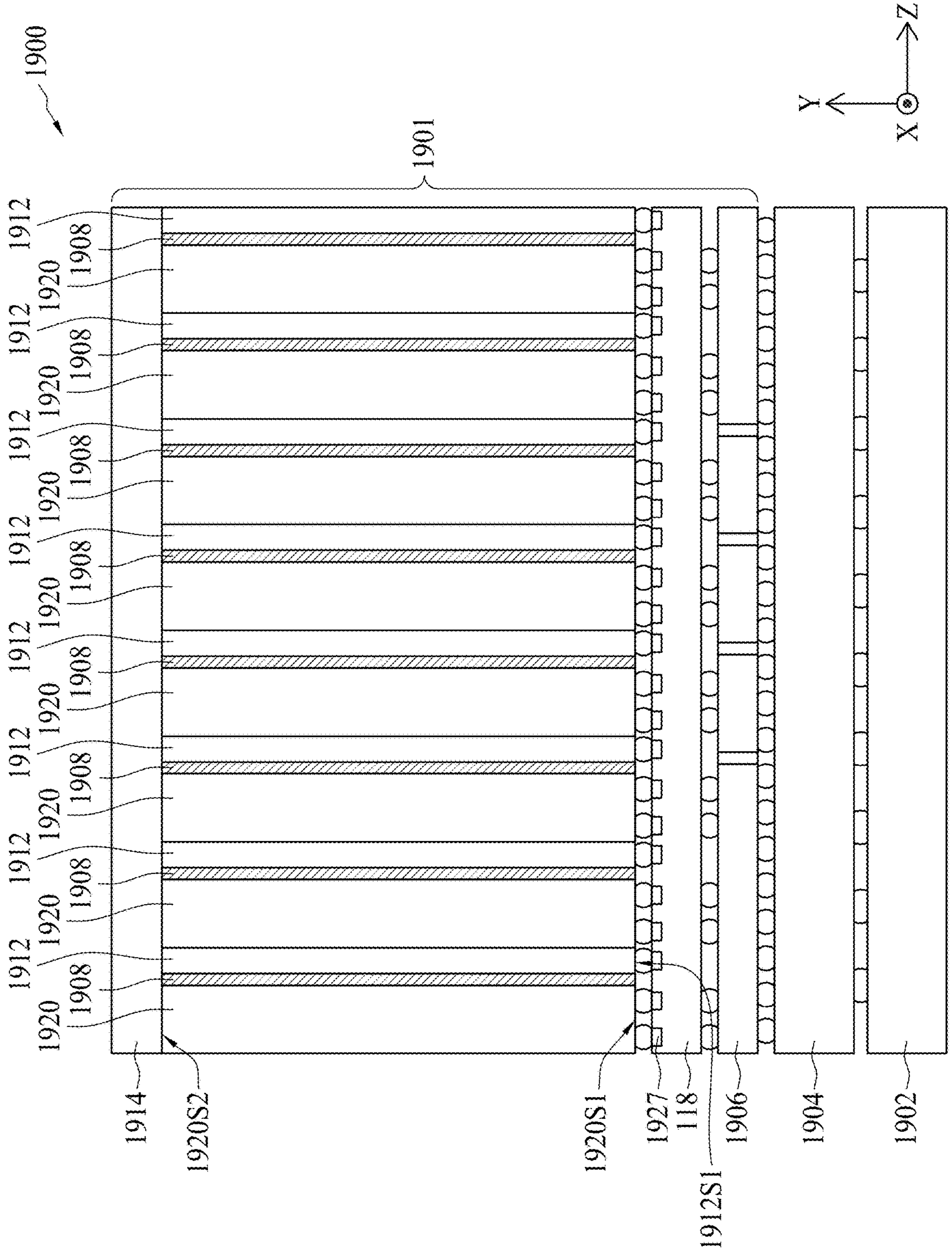
FIGS. 19A and 19B show cross-sectional views of a semiconductor package assembly, in accordance with various embodiments of the present disclosure.

The short IC structure stacks 1812 or the semiconductor packages 1800A then can be bonded to another interposer or IC chip, as shown in FIG. 19A to form a semiconductor package assembly 1900 including a 3D IC structure stack 1901, a substrate 1902, an interposer 1904, and a logic control chip 1906, wherein the 3D IC structure stack 1901 in this embodiment includes a plurality of DRAM semiconductor dies 1920 (or a plurality of DRAM dies and control ICs) and a side RDL 118, and each DRAM semiconductor die 1920 is horizontally separate from the others. The laterally extending RDL structure 118 on the sidewalls of the plurality of DRAM semiconductor dies (or DRAM and control ICs) 1920 is bonded to a logic memory control chip 1906 or the interposer 1904 which is then bonded to the substrate 1902. The power/signaling functions of each DRAM semiconductor die 1920 could be taken care of using the RDL structure 118 which is connected to the logic memory control chip 1906 and the interposer 1904. Unlike conventional HBM structure, in the present invention, each DRAM semiconductor die 1920 can transmit or receive power/signals independently without going through other DRAM semiconductor dies and each DRAM semiconductor die can generate high bandwidth data with low latency, therefore could be properly named HBLM (high bandwidth low latency memory), and the combination of the horizontally separated DRAM semiconductor dies 1920 could be named as HBLM Shelf.

Moreover, since there can exist an inter-(upward extending) high thermal conductivity layer 1912 (such as AlN, BN, W, copper, SiC, etc.) and optionally a HTC adhesive layer 1908 between the primary surfaces of two adjacent DRAM semiconductor dies 1920 which can be connected to a top-(laterally extending) HTC layer 1914 (such as AlN, BN, W, copper, SiC, etc.) on other sidewall(s) of the short 3D IC structure stack 1901, the heat generated from those two DRAM semiconductor dies 1920 could be transmitted from the dies through the inter-high thermal conductivity layer 1912 to the top-high thermal conductivity layer 1914, and then to a heatsinking device (e.g., a cold plate; not shown) thermally coupled to the HTC layer 1914.

According to some embodiments, the RDL 118 further includes a plurality of bonding pads 1927 on an upper surface of the RDL 118 and electrically connecting the interposer 1904 to the DRAM semiconductor dies 1920.

Figure 19B:
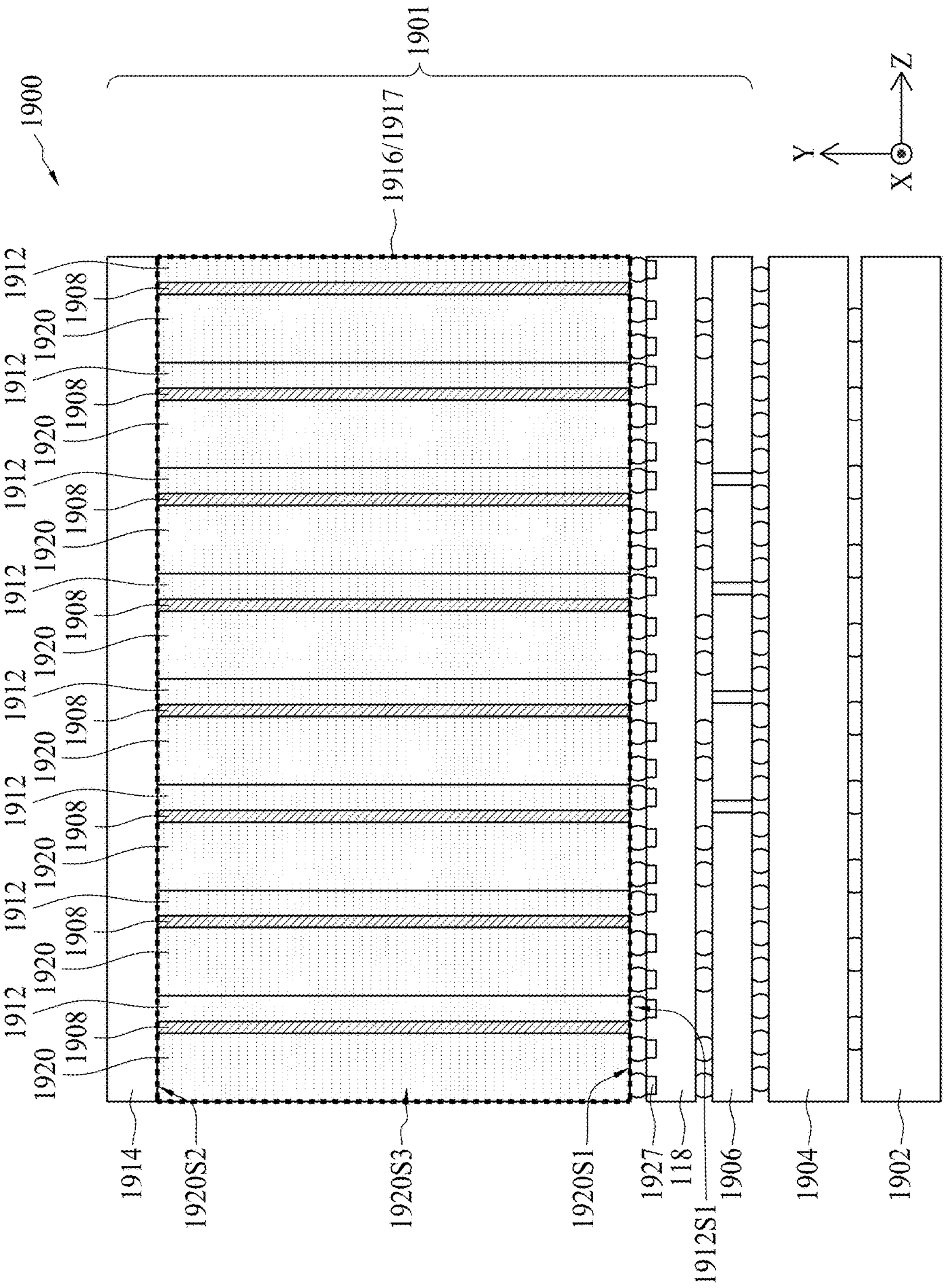

In the event there is a need to have more signals transmission in the plurality of DRAM semiconductor dies 1920, as previously mentioned, more upward extending RDL structures 1916 could be formed on two or more side faces as shown in FIG. 19B, wherein the bottom RDL structure 118 is formed on one side face of the plurality of DRAM semiconductor dies 1920, and another side RDL structure (or side RDL structures) could be formed on other side face(s) of the plurality of DRAM semiconductor dies 1920 opposite or adjacent to the inter-high thermal conductivity layer 1912 with the bottom RDL structure 118 electrically connected to these side RDL structure(s) 1916.

In the event there is a need to have more heat dissipation in the plurality of DRAM semiconductor dies 1920, as previously mentioned, more inter-HTC layers 1917 similar to the inter-HTC 1912 or the top HTC 1914 could be formed on two or more side faces and/or one or two of the primary surfaces, as shown in FIG. 19B, wherein the inter-HTC layer(s) 1917 is (are) thermally coupled to the top HTC 1914 and the inter-HTC 1912. According to some embodiments, the HTC layers, 1912, 1914 and 1917, have a thermal conductivity higher than that of silicon or $SiO_2$.

Figure 20A:
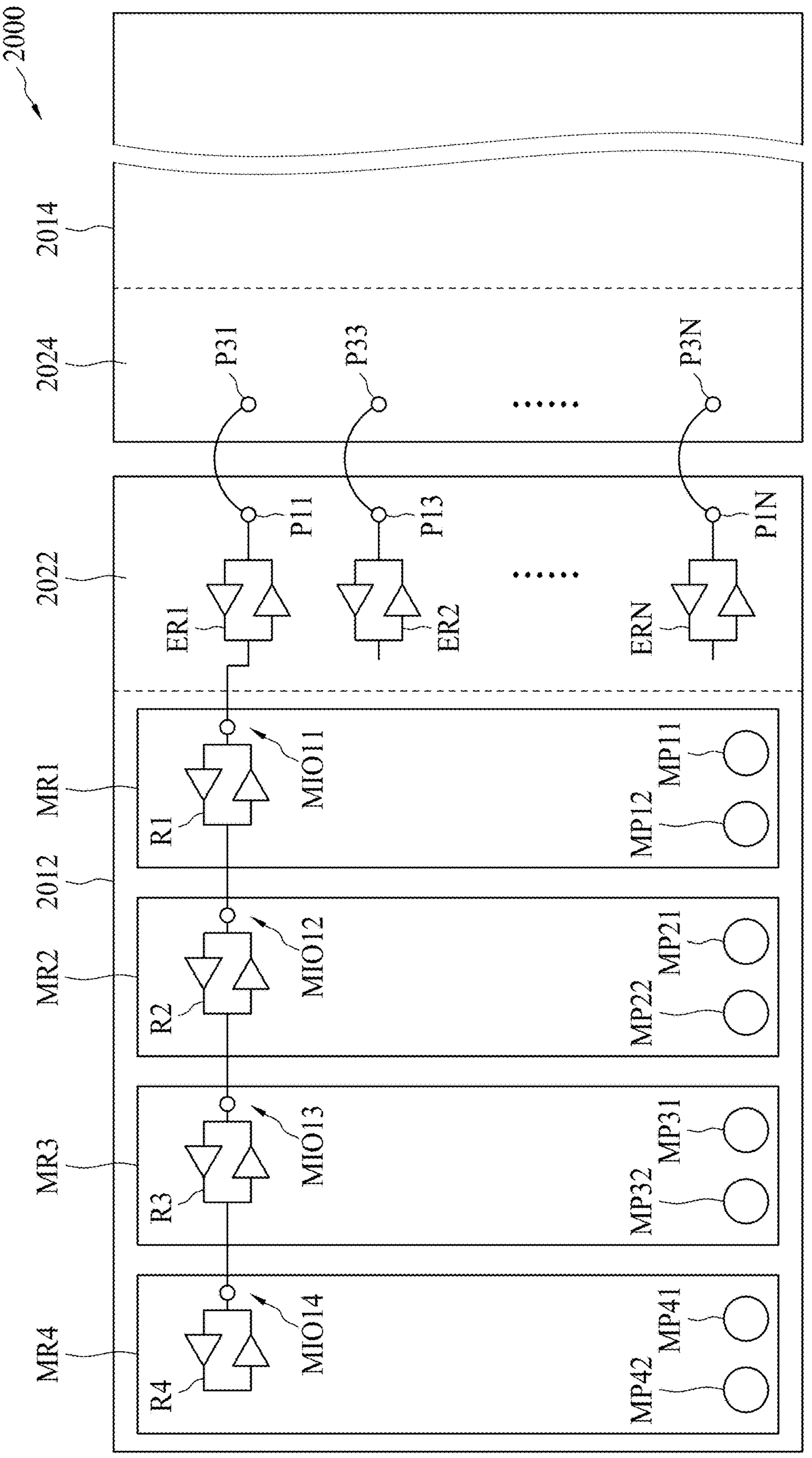
FIGS. 20A and 20B show block diagrams of circuits in a semiconductor package assembly, in accordance with various embodiments of the present disclosure.

The diagram in FIG. 20A illustrates a coupling relationship between a one short 3D IC stack (or HBLM Shelf) 2012 and a logic chip (or logic control chip or a memory control IC) 2014 according to another embodiment of the present invention. The short 3D IC stack 2012 includes multiple DRAM semiconductor dies MR1 to MR4 (or more) to form an HBLM Shelf structure 2012 and a base die 2022, and each DRAM semiconductor die (or HBLM) MR1 to MR4 has multiple data read/written functions therefrom/therein. As mentioned, in this short 3D IC stack 2012, each DRAM semiconductor die MR1 to MR4 is horizontally separate, rather than vertically separate, from the other each. This new memory architecture of HBLM Shelf in the short 3D IC stack 2012 further allows a super-fast random access time.

As shown in FIG. 20A, a logic bridge area 2024 of a logic/SOC chip (or logic control chip) 2014 includes logic I/O pads P31, P33 . . . P3N, wherein the logic I/O pads P31, P33 . . . P3N are electrically coupled to I/O pads P11, P13 . . . P1N of the base die 2022, respectively, wherein N is a positive integer greater than 3. The I/O pads P11, P13 . . . P1N located in the base die 2022 of the short 3D IC stack 2012 are further coupled to external bidirectional repeaters ER1, ER2, . . . , ERN, respectively, in the base die 2022 through metal lines or the aforesaid RDL structure 118 to transmit and amplify data or signals. In addition, each DRAM semiconductor die, MR1, MR2, MR3, or MR4 has the same or substantially the same structure. For example, the DRAM semiconductor die MR1 includes a plurality of first memory I/O pads MIO11, bidirectional repeaters or drivers R1 corresponding to the plurality of memory I/O pads MIO11, and micro pads MP11, MP12. Similarly, other DRAM semiconductor dies, such as MR2, includes a plurality of second memory I/O pads MIO12, bidirectional repeaters or drivers R2 corresponding to the plurality of second memory pads MIO12, and micro pads MP21, MP22, etc. In another embodiment, each DRAM semiconductor die MR1 to MR4 has row address I/O pads (or interface) and column address I/O pads (or interface) physically independent of the row address I/O pads. Such non-multiplexing mode of using a parallel access path of activating both the row address and the column address could be used in this invention.

As previously mentioned, this short 3D IC stack 2012 is a complete HBLM Shelf structure which embodies the following key design attributes: (1) an access mode to activate both row and column data selection paths simultaneously without needing multiplexing required by a conventional packaged DRAM) in a way which resembles the SRAM access mode); (2) incorporation of the aforementioned RDL structures allows for smooth planar surfaces for making simultaneous higher-I/O, higher-bandwidth interconnections, (3) each DRAM semiconductor die, MR1 to MR4, possesses its own complete testing and probing structures for the verification of functionality, yield and performance based on smaller probe pads which are not connected to the environment outside the chip, thereby eliminating the need to include ESD circuities which often occupy large IC real estate, (4) each DRAM semiconductor die, MR1 to MR4, can function on its own in terms of RAM operations such as row and column address inputs, READ and WRITE command inputs, necessary clock and control signal locations and IOs and more importantly signals from each DRAM die can be directly and independently connected to the controlling locations on the control IC (e.g., the base die 2022) equipped with the corresponding bilateral repeaters or drivers R1, R2, . . . RN, high-performance transistors, and high conductance of BEOL structure which are commonplace logic technologies for each DRAM die.

In this embodiment, the bidirectional repeater R1 in the DRAM semiconductor die MR1 is coupled to the external bidirectional repeater ER1 through the metal line(s) of the aforesaid RDL structure 118; the bidirectional repeater R2 is coupled to the bidirectional repeater R1 through other metal line(s) of the aforesaid RDL structure 118; the bidirectional repeater R3 is coupled to the bidirectional repeater R2 through other metal line(s) of the aforesaid RDL structure 118; and the bidirectional repeater R4 is coupled to the bidirectional repeater R3 through other metal line(s) of the aforesaid RDL structure 118. A selection or control signal could be additionally applied to the bidirectional repeater ER1 and/or the bidirectional repeater R1~R4 for data selection.

The operation of the logic chip 2014 plus the short 3D IC stack 2012 (or HBLM Shelf structure) as shown in FIG. 20A is stated in the following. For example, the logic die 2014 sends all the essential signals through its own IO pads P31~P3N (i.e., all related signal pads)—similar to the signal paths defined by JEDEC for HBMs except that these conventional HBMs need to use TSVs to connect all the signals/IOs while the short 3D IC structure stack or HBLM Shelf 2012 may not need TSVs and can conveniently use the aforementioned RDL structures 118 and all proven repeaters/drivers circuits to more easily achieve the same job. Because the signal/IO paths are connected together through the aforementioned RDL structures 118, the operation for receiving and transmitting signals is needed to tap into the controlling signals in FIG. 20A to decide which signal from DRAM semiconductor die MR1, MR2, MR3 and MR4 will be loaded and then received or transmitted. In another embodiment, the bidirectional repeaters ER1, ER2 . . . ERN in the base die 2022 could be removed and the base die 2022 could be the RDL structure or bottom RDL structure 118 described in FIG. 19A or 19B.

Figure 20B:
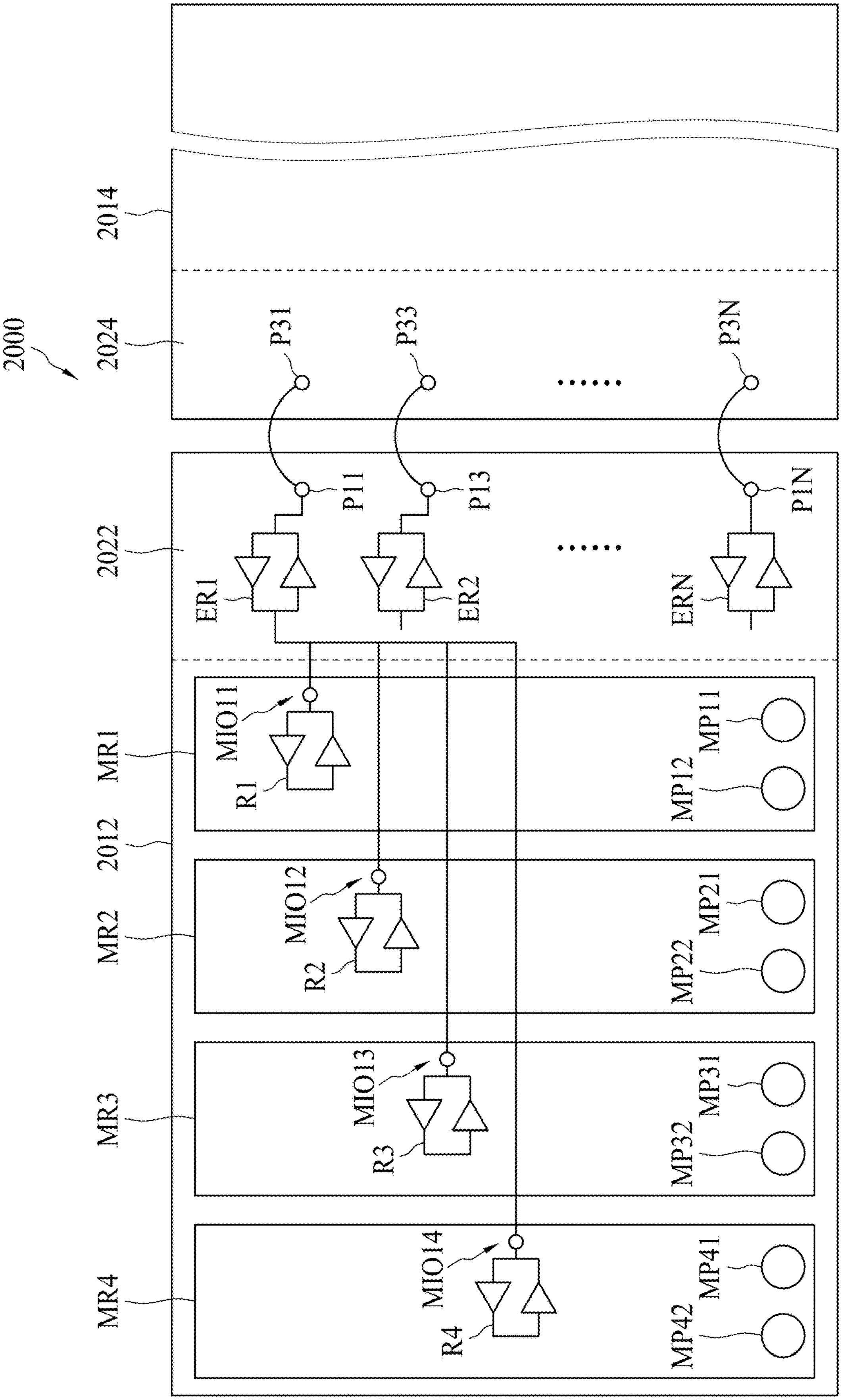

Furthermore, in another embodiment of the logic chip 2014 plus the short 3D IC stack 2012 (or HBLM Shelf structure) as shown in FIG. 20B, each bidirectional repeater of the bidirectional repeaters R1, R2, R3, R4 is coupled to the external bidirectional repeater ER1. Specifically, the bidirectional repeater R1 is coupled to the external bidirectional repeater ER1 through some metal lines of the aforesaid RDL structure 118; the bidirectional repeater R2 is coupled to the external bidirectional repeater ER1 through another metal lines of the aforesaid RDL structure 118; the bidirectional repeater R3 is coupled to the external bidirectional repeater ER1 through other metal lines of the aforesaid RDL structure 118; and the bidirectional repeater R4 is coupled to the external bidirectional repeater ER1 through another metal lines of the aforesaid RDL structure 118. A selecting circuit could be coupled to the bidirectional repeater ER1 and/or the bidirectional repeater R1 to R4 to selectively pick up the desired signals.

In another embodiment of the present invention, the bidirectional repeaters R1 (through MIO11), R2 (through MIO12), R3 (through MIO13), R4 (through MIO14) can be directly coupled to the I/O pad P11, that is, the external bidirectional repeaters ER1, ER2, . . . , ERN as shown can be omitted and the base die 2022 could be the RDL structure or bottom RDL structure 118 described in FIG. 19A or 19B. Furthermore, in another embodiment, the base die 2022 is unnecessary, and all memory I/O pads MIO11 of MR1 can be directly coupled to the corresponding logic I/O pads P11, P13 . . . P1N through the bottom RDL structure 118 but not through MR2~MR4; all memory I/O pads MIO12 of MR2 can be directly coupled to the corresponding logic I/O pads P21, P23 . . . P2N through the bottom RDL structure 118 but not through MR1, MR3~MR4; all memory I/O pads MIO13 of MR3 can be directly coupled to the corresponding logic I/O pads P31, P33 . . . P3N through the bottom RDL structure 118 but not through MR1, MR2, and MR4; and all memory I/O pads MIO14 of MR4 can be directly coupled to the corresponding logic I/O pads P41, P43 . . . P4N through the bottom RDL structure 118 but not through MR1~MR3.

Moreover, the micro pads, MP11 and MP12, could be coupled to external probes (not shown) for testing (e.g. verifying functionalities, yields and performances). According to some embodiments, the micro pads, MP11 and MP12, can be coupled to an environment outside the logic chip 2014 and the short 3D IC structure stack 2012 (or HBLM Shelf structure). In this case, there is a need to include conventional electrostatic discharge (ESD) protection circuits, wherein a size of each of the micro pads, MP11 and MP12, is larger than that of each of the I/O pads P11, P13 . . . P1N or other memory I/O pads MIO11, MIO12 . . . , configured to be coupled internally with the logic chip 2014.

According to some embodiments, referring to FIGS. 19A and 19B, an IC stack 1901 includes a plurality of IC structures 1920 horizontally separate with each other. Each IC structure 1920 can be the semiconductor structure in FIGS. 2C~2F 3D~3F, 4G~4N, and 5A~5B, and has a top surface 108P1, a bottom surface 108P2 opposite to the top surface 108P1, and four sidewalls 108S with a first sidewall 1920S1 or 108S1, a second sidewall 1920S2 or 108S2, a third sidewall 1920S3 or 108S3 (parallel to the paper sheet) and a fourth sidewall (a sidewall opposite the sidewall 1920S3 shown in FIG. 19B and parallel to the paper sheet or the sidewall 108S4 of FIG. 2D). The area of the bottom surface 108P2 or the top surface 108P1 is larger than that of any sidewall 102S of FIG. 2C, e.g., 1920S1 (108S1), 1920S2 (108S2), 1920S3 (108S3) or 108S4. The short 3D IC stack 1901 may further include a laterally extending RDL structure 118 covering the first sidewall 1920S1 of each of the plurality of IC structures 1920.

According to some embodiments, referring to FIGS. 19A, 19B, FIGS. 4G to 4N, 5A to 5B and 6E, each semiconductor structure includes a first integrated circuit (IC) structure, such as the IC structure 1920 in FIG. 19A or 19B or the die 122E in FIGS. 4G to 4N, and a first neighboring structure, such as the high thermal conductivity layer 1912 in FIG. 19A or 19B, or the molding compound layer 242 and/or the die 122D in FIGS. 4G to 4N, physically separate from the first IC structure. The first IC structure and the first neighboring structure are (1) arranged along the first sidewall 1912S1 extending in the Z direction in FIG. 19A or 19B, or (2) arranged along the first sidewall 1912S1 extending in the XZ plane in FIG. 19A or 19B. In condition (2) described above, referring to FIGS. 4K to 4N, the XZ plane of each of the IC structures 400E to 400H may face toward the RDL structure 118 and forming electrical connections therewith. The first IC structure 122E and the first neighboring structure 122D may be arranged on the XZ plane of each of the IC structures 400E to 400H and along the X direction depicted in FIG. 19A or FIG. 19B. According to some embodiments, the laterally extending RDL structure 118 shown in FIGS. 19A and 19B comprises a first plurality of bonding pads 1927 arranged along the first sidewall of the respective semiconductor structure 1920, wherein the first plurality of bonding pads are over or facing an edge of the first IC structure and an edge of the first neighboring structure.

In some embodiments, the first IC structure can contain more than one semiconductor die, e.g., dies 122E, 122G and/or 122H shown in FIGS. 4K to 4N or FIG. 6D. The first neighboring structure 122D could be an active die or an HTC dummy interconnect spacer. The interconnect spacer can be a passive or an active silicon interposer. According to some embodiments, the interconnect spacer is a semiconductor interposer with a set of through-semiconductor vias (TSVs) electrically coupled to a subset of the first plurality of bonding pads or external connectors.

According to some embodiments, the first neighboring structure includes another IC structure, such as the semiconductor die 122D shown in FIGS. 4G to 4N, an interconnect spacer, such as the interposer 122D shown in FIGS. 4G to 4N, a molding compound layer, such as the potting material or molding compound layer 242 shown in FIGS. 4G to 4N, or a high thermal conductivity (HTC) layer, such as the die 122D shown in FIGS. 4G to 4N, with the thermal conductivity higher than that of Si or $SiO_2$ so as to dissipate the heat generated from the adjacent IC structures.

According to some embodiments, the number of the first plurality of bonding pads 1927 is more than 1,300~1,500 per IC structure 1920.

According to some embodiments, referring to FIG. 4G, FIG. 4I, FIG. 4K, FIG. 4M, FIG. 5A and FIG. 5B, the first IC structure 122E or the another IC structure serving as the first neighboring structure includes a set of through-semiconductor vias (TSVs) 104B exposed from the sidewall 102S in the XZ plane and electrically coupled to a subset of the first plurality of bonding pads 1927 of the laterally extending RDL structure 118 of the 3D IC stack 1901 shown in FIG. 19A or FIG. 19B.

According to some embodiments, referring to FIG. 4G, FIG. 4H, FIG. 4K, FIG. 4L, FIG. 5A and FIG. 5B, the molding compound layer 242 includes a set of through-molding vias (TMVs) 232 exposed from a molding sidewall 102S in the XZ plane and electrically coupled to a subset of the first plurality of bonding pads 1927 of the laterally extending RDL structure 118 (e.g., see also the RDL 118A shown in FIG. 5A or 5B) of the 3D IC stack 1901 shown in FIG. 19A or 19B.

According to some embodiments, referring to FIG. 4G, FIG. 4H, FIG. 4K, FIG. 4L, FIG. 5A and FIG. 5B, the first neighboring structure 122D can include an interconnect spacer with or without active components, with a set of through-semiconductor vias (TSVs), similar to the TSVs 104B in the first IC structure 122E, exposed from the sidewall 102S in the XZ plane and electrically coupled to a subset of the first plurality of bonding pads 1927 of the laterally extending RDL structure 118 of the short 3D IC stack 1901 shown in FIG. 19A or 19B.

According to some embodiments, the IC stack 1901 further includes a high thermal conductivity structure, such as the interposer 1702 or 1706 in FIG. 17, between two semiconductor structures 1920, 1912 or next to some of the semiconductor structures 1920, 1912 of the IC stack 1901, e.g., in a manner similar to the inter-high thermal conductivity layer 1912 shown in FIG. 19A or 19B. The thermal conductivity of the high thermal conductivity structure is higher than that of Si or $SiO_2$.

According to some embodiments, each IC structure 1920 can be a DRAM semiconductor die, and the IC stack 1901 can be an HBM compatible structure.

According to some embodiments, the IC stack 1901 further includes the logic control chip 1906 under and electrically connected to the laterally extending RDL structure 118 of the IC stack 1901.

According to some embodiments, referring to FIG. 19A or 19B, the IC stack 1901 further includes the laterally extending thermal conductivity layer 1914 covering each second sidewall 1920S2 of the plurality of IC structures 1920, wherein the laterally extending RDL structure 118 is opposite to the laterally extending thermal conductivity layer 1914, and the thermal conductivity of the laterally extending thermal conductivity layer is higher than that of Si or $SiO_2$.

According to some embodiments, referring to FIGS. 19A and 19B, an IC stack 1901 includes a plurality of IC structures 1920 horizontally separate with each other. Referring to FIGS. FIGS. 2C~2F 3D~3F, 4G~4N, 5A~5B and 19A, each IC structure 1920 can be referred to the IC structure 100A, 100A, 300A to 300C, 400A to 400H, 500A and 500B in FIGS. 2C to 2F, 3D to 3F, 4G to 4N and 5A to 5B. As shown in FIG. 2D, each IC structure 1920 has dimensions similar to those of the RDL structure 108A and includes a top surface 108P1, a bottom surface 108P2 opposite to the top surface 108P1, and four sidewalls with a first sidewall 1920S1 or 108S1, a second sidewall 1920S2 or 108S2, a third sidewall 1920S3 or 108S3 and a fourth sidewall 108S4. The area of the bottom surface 108S2 or the top surface 108S1 is larger than that of any sidewall, e.g., 1920S1 (108S1), 1920S2 (108S2), 1920S3 (108S3) and 108S4. The IC stack 1901 may further include a laterally extending RDL structure 118 covering each first sidewall 1920S1 (108S1) of each of the plurality of IC structures 1920. The IC stack 1901 may also include an upward extending thermal conductivity layer 1912 between two adjacent IC structures 1920. According to some embodiments, the thermal conductivity of the upward extending thermal conductivity layer 1912 is higher than that of Si or $SiO_2$, such as a SiC chip with the same size as the IC structure 1920.

According to some embodiments, the IC stack 1901 further includes a laterally extending thermal conductivity layer 1914 covering each second sidewall 108S2 or 1920S2 of the plurality of IC structures 1920 and thermally coupling to each of the upward extending thermal conductivity layers 1912, wherein the laterally extending RDL structure 118 is opposite to the laterally extending thermal conductivity layer 1914, and the thermal conductivity of the laterally extending thermal conductivity layer 1914 is higher than that of Si or $SiO_2$, such as a SiC chip.

According to some embodiments, the upward extending thermal conductivity layer 1912 or the laterally extending thermal conductivity layer 1914 includes a material of BN, AlN, W, SiC or copper.

According to some embodiments, referring to FIG. 19B, the IC stack 1901 further includes an upward extending RDL structure 1916 covering each third sidewall 108S3 or 1920S3 of the plurality of IC structures 1920, wherein the upward extending RDL structure 1916 is electrically connected to the laterally extending RDL structure 118.

According to some embodiments, each IC structure 1920 includes a DRAM semiconductor die, and the IC stack 1901 is a HBM-compatible structure (that is, the essential signals through its own IO pads P31 to P3N is compatible with signal paths as defined by JEDEC for HBMs).

According to some embodiments, the IC stack 1901 further includes a logic control chip 1906 under and electrically connected to the laterally extending RDL structure 118 of the IC stack 1901.

According to some embodiments, referring to FIG. 19A and FIG. 20A or FIG. 20B, each IC structure 1920 is a DRAM semiconductor die MR1, MR2, MR3 or MR4, and includes a plurality of memory I/O pads MIO11, MIO12, MIO13 or MIO14, respectively. According to some embodiments, the logic control chip 1906 shown in FIG. 19A or 19B can be the logic control chip 2014 shown in FIG. 20A or 20B and includes a plurality of logic I/O pads P31-P3N. The plurality of memory I/O pads MIO11 to MIO14 of each of the DRAM semiconductor dies MR1 to MR4 are electrically coupled to the plurality of logic I/O pads P31 to P3N through the laterally extending RDL structure 118 shown in FIG. 19A or 19B.

According to some embodiments, the memory I/O pads MIO11 to MIO14 do not include an electrostatic discharge (ESD) protection circuit. Each DRAM semiconductor die MR1 to MR4 includes a plurality of row address I/O pads (not separately shown) and a plurality of column address I/O pads (not separately shown) physically independent of the plurality of row address I/O pads.

According to some embodiments, referring to FIG. 20A, each DRAM semiconductor die MR1 to MR4 further includes a plurality of external bidirectional repeaters R1, R2, R3 or R4, respectively. The bidirectional repeater R2 of the second DRAM semiconductor die MR2 is electrically coupled to the corresponding bidirectional repeater R1 of the first DRAM semiconductor die MR1 through a second metal line of the laterally extending RDL structure 118 or the upward extending RDL structure 1916, and the corresponding bidirectional repeater R1 of the first DRAM semiconductor die MR1 is electrically coupled to the corresponding logic I/O pad P31 of the logic control chip 2014 through a first metal line of the laterally extending RDL structure 118 or the upward extending RDL structure 1916.

According to some embodiments, referring to FIG. 20B, each DRAM semiconductor die MR1 to MR4 further includes a plurality of external bidirectional repeaters R1 to R4, respectively, wherein the bidirectional repeater R1 of the first DRAM semiconductor die MR1 is electrically coupled to a corresponding the corresponding logic I/O pad P31 of the logic control chip 2014 through a first metal line of the laterally extending RDL structure 118 or the upward extending RDL structure 1916, the bidirectional repeater R2 of the second DRAM semiconductor die MR2 is electrically coupled to the corresponding logic I/O pad P31 of the logic control chip through a second metal line of the laterally extending RDL structure 118 or the upward extending RDL structure 1916.

According to some embodiments, referring to FIG. 19A, 19B and FIGS. 2C, 2D to 2F, 3D to 3F, 4G to 4N, 5A, 5B and 6E, the IC structure 1920 can include the IC structure 100A to 100C, 300A to 300C, 400A to 400H, 500A, 500B and 600A described therein. For example, referring to FIG. 5A, 5B and FIG. 19A or 19B, the IC structure 1920 includes the IC structure 500A, and the IC structure includes a first semiconductor body 122F and an interconnection structure 108A or 108B. The first semiconductor body (122E or 122F) has a first primary surface (102P) and a first secondary surface (102S), with the first primary surface being substantially perpendicular to the first secondary surface. The interconnect structure includes a primary redistribution layer (RDL) (FIG. 5A, 108A) over the first primary surface 102P, with the primary RDL 108A having a second secondary surface (FIG. 5A, 108S) that is aligned with the first secondary surface 102S of the first semiconductor body 122F, wherein the first secondary surface 102S and the second secondary surface 108S jointly form a secondary plane (FIG. 5A, 500AS) which could be corresponding to the first sidewall 1920S1 or second sidewall 1920S2 of the IC structure 1920, wherein the primary RDL 108S further comprises a first conductive element (FIG. 5A, 212, 214) exposed through the second secondary surface 108S of the primary RDL 108A.

According to some embodiments, the first conductive element can be a conductive pad 212 (see FIG. 2C) on a surface 108P of the primary RDL structure 108A/108B substantially parallel to the first primary surface 102P1, a conductive via 216 (see FIG. 2G) connecting adjacent layers of the primary RDL 118A/118B, a stacked via 214 (see FIG. 2G) traversing the primary RDL 118A/118B, or a combination thereof.

According to some embodiments, the first semiconductor body (122E in FIG. 4G or 4I) further includes at least a through-silicon via 104B (FIG. 4G), a through-molding via 232 (FIG. 4G), or an insulating element 242 (FIG. 4I) exposed through the first secondary surface.

According to some embodiments, the first semiconductor body of the IC structure 1920 shown in FIG. 19A or 19B can be the counterparts as the semiconductor dies 400A to 400H or 600A shown in FIGS. 4K to 4N or FIG. 6E and includes (1) multiple first dies 122D and 122E placed in a same package layer (FIGS. 4K to 4N); (2) multiple second dies 122G, 122H vertically stacked (FIG. 6E); (3) multiple second dies 122G, 122H placed side-by-side with other third dies 122E in the same package layer (FIG. 6E); or a combination thereof. The first, second and third dies 122D, 122E, 122G, 122H are of the same or different sizes.

According to some embodiments, the first semiconductor body (see the partial structure of the semiconductor die 600A excluding the primary RDL 108C) of the IC structures 1920 shown in FIG. 19A or 19B also includes a plurality of conductive vias 104B (see the semiconductor die 122E), pillars 224 or plugs 234 of same or different lengths, electrically connecting the multiple first dies 122E, 122G and 122H to the primary RDL 108C along the Z-axis as shown in FIG. 6E and/or to the laterally extending RDL structure 118 in the XZ plane as shown in FIG. 6E, 19A or 19B.

According to some embodiments, the laterally extending RDL structure 118 shown in FIG. 19A or 19B is electrically connected to the first conductive element of the primary RDL, to the conductive pad 212 or conductive via 214 shown in FIG. 4G or 6D, pillars 224 or plugs 234 shown in FIG. 6D.

According to some embodiments, the laterally extending RDL structure 118 (corresponding to the RDL 118A shown in FIG. 7I) includes a hybrid bonding layer or a bump pad array (244).

According to some embodiments, referring to FIGS. 19A and 19B, an IC stack 1901 includes a plurality of IC structures 1920 horizontally separate with each other. Referring to FIGS. 2C, 2D and 19A, each IC structure 1920 can be the structure 108A shown in FIG. 2D that includes a top surface 108P1, a bottom surface 108P2 opposite to the top surface, and four sidewalls including a first sidewall 1920S1 or 108S1, a second sidewall 1920S2 or 108S2, a third sidewall 1920S3 or 108S3 and a fourth sidewall 108S4. The area of the bottom surface or the top surface is larger than that of any of the four sidewalls, e.g., 1920S1 (108S1), 1920S2 (108S2), 1920S3 (108S3) and 108S4. The IC stack 1901 may further include a laterally extending RDL structure 118 covering each first sidewall 1920S1 (108S1) of each of the plurality of the IC structures 1920.

According to some embodiments, the IC stack 1901 further includes a set of upward extending thermal conductivity layers 1912, wherein a corresponding upward extending thermal conductivity layer 1912 is disposed between any two adjacent IC structures 1920 of the plurality of IC structures 1920. The IC stack 1901 may also include a first laterally extending thermal conductivity layer 1914 covering each second sidewall 1920S2 (108S2) of each of the plurality of IC structures 1920 and thermally coupling to the set of upward extending thermal conductivity layers 1912. The thermal conductivity of any of the upward extending thermal conductivity layer 1912 or the first laterally extending thermal conductivity layer 1914 is higher than that of Si or $SiO_2$.

According to some embodiments, referring to FIG. 19B, the IC stack 1901 further includes a second laterally extending thermal conductivity layer 1917 covering each of the third sidewall 1920S3 (108S3) of the plurality of IC structures 1920. The second laterally extending thermal conductivity layer 1917 is thermally coupling to the set of upward extending thermal conductivity layers 1912.

According to some embodiments, the IC stack 1901 is an HBM-compatible structure and each IC structure 1920 includes a DRAM semiconductor die 1920. The IC stack 1901 further includes a logic control chip 1906 under and electrically connected to the laterally extending RDL structure 118 of the IC stack 1901.

In summary, the present invention provide a 3D IC stack with a plurality of semiconductor die, RDL(s) are over the side face(s) of 3D IC stack for interconnecting dies in the 3D IC stack to allow for skip-die signal and power distribution. Moreover, the high thermal conductivity material is disposed between two adjacent semiconductor dies and thermally coupled to another high thermal conductivity material covering other side face of 3D IC stack.

The foregoing outlines structures of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An IC stack comprising:

a plurality of integrated circuit (IC) structures horizontally separated with each other, wherein each IC structure comprises a top surface, a bottom surface opposite to the top surface, and four sidewalls with a first sidewall, a second sidewall, a third sidewall and a fourth sidewall; wherein an area of the bottom surface or the top surface is larger than that of any sidewall;

a laterally extending RDL structure covering each first sidewall of the plurality of IC structures, wherein the laterally extending RDL structure comprises:
a front interconnect surface with a set of front contacting pads coupled with the first sidewall of each IC structure; and
a back interconnect surface opposite to the front interconnect surface, wherein the back interconnect surface includes a set of back contacting pads and is configured to be electrically coupled to other components external to the IC stack through the set of back contacting pads; and
a set of upward extending thermal conductivity layers, wherein a corresponding upward extending thermal conductivity layer is disposed between every two adjacent IC structures, wherein each IC structure of the plurality of IC structures is a single semiconductor die.

2. The IC stack of claim 1, further comprising a laterally extending thermal conductivity layer covering each second sidewall of the plurality of IC structures and thermally coupling to the upward extending thermal conductivity layers, wherein the laterally extending RDL structure is opposite to the laterally extending thermal conductivity layer, and a thermal conductivity of the upward extending thermal conductivity layers and/or the laterally extending thermal conductivity layer is higher than that of Si.

3. The IC stack of claim 2, wherein the upward extending thermal conductivity layer or the laterally extending thermal conductivity layer comprises BN, AlN, W, SiC or copper.

4. The IC stack of claim 1, further comprising an upward extending RDL structure covering each third sidewall of the plurality of IC structures, wherein the upward extending RDL structure is electrically connected to the laterally extending RDL structure.

5. The IC stack of claim 1, wherein each IC structure comprises a DRAM semiconductor die, and the IC stack is an HBM compatible structure.

6. The IC stack of claim 4, further comprising a logic control chip under and electrically connected to the laterally extending RDL structure of the IC stack.

7. The IC stack of claim 6, wherein each of the IC structures comprises a DRAM semiconductor die comprising a plurality of memory I/O pads, the logic control chip comprises a plurality of logic I/O pads, and the plurality of memory I/O pads of each DRAM semiconductor die are electrically coupled to the plurality of logic I/O pads through the laterally extending RDL structure.

8. The IC stack of claim 7, wherein the memory I/O pads do not comprise an electrostatic discharge (ESD) protection circuit, or each DRAM semiconductor die further comprises a plurality of row address pads and a plurality of column address pads physically independent of the plurality of row address pads.

9. The IC stack of claim 7, wherein each DRAM semiconductor die further comprises a plurality of external bidirectional repeaters, wherein a bidirectional repeater of a second DRAM semiconductor die is electrically coupled to a corresponding bidirectional repeater of a first DRAM semiconductor die through a second metal line of the laterally extending RDL structure or the upward extending RDL structure, and the corresponding bidirectional repeater of the first DRAM semiconductor die is electrically coupled to a corresponding logic I/O pad of the logic control chip through a first metal line of the laterally extending RDL structure or the upward extending RDL structure.

10. The IC stack of claim 7, wherein each DRAM semiconductor die further comprises a plurality of external bidirectional repeaters, wherein a bidirectional repeater of a first DRAM semiconductor die is electrically coupled to a corresponding logic I/O pad of the logic control chip through a first metal line of the laterally extending RDL structure or the upward extending RDL structure, and a bidirectional repeater of a second DRAM semiconductor die is electrically coupled to the corresponding logic I/O pad of the logic control chip through a second metal line of the laterally extending RDL structure or the upward extending RDL structure.

11. The IC stack of claim 1, wherein a first IC structure of the plurality of IC structures comprises:
a first semiconductor body having a first primary surface and a first secondary surface, with the first primary surface being substantially perpendicular to the first secondary surface; and
an interconnection structure including a primary redistribution layer (RDL) over the first primary surface, with the primary RDL having a second secondary surface that is aligned with the first secondary surface of the first semiconductor body,
wherein the first secondary surface and the second secondary surface jointly form a secondary plane, wherein the primary RDL further comprises a first conductive element exposed through the second secondary surface of the primary RDL.

12. The IC stack of claim 11, wherein the first conductive element comprises a conductive pad on a surface of the primary RDL substantially parallel to the first primary surface, a conductive via connecting adjacent layers of the primary RDL, a stacked via traversing the primary RDL, or a combination thereof.

13. The IC stack of claim 11, wherein the first semiconductor body further includes at least a through-silicon via, a through-molding via, or an insulating element exposed through the first secondary surface.

14. The IC stack of claim 11, wherein the laterally extending RDL structure is electrically connected to the first conductive element of the primary RDL, to conductive vias, pillars or plugs in the first semiconductor body, or to a combination thereof; wherein the laterally extending RDL structure includes a hybrid bonding layer or a bump pad array.

15. An IC stack comprising:
a plurality of integrated circuit (IC) structure horizontally separate with each other, wherein each IC structure comprises a top surface, a bottom surface opposite to the top surface, and four sidewalls with a first sidewall, a second sidewall, a third sidewall and a fourth sidewall; wherein an area of the bottom surface or the top surface is larger than that of any of the four sidewalls, and each IC structure comprises:
a first semiconductor body having a first primary surface and a first secondary surface, and the first semiconductor body includes a first edge connection aligned with the first secondary surface; and
an interconnection structure including a primary redistribution layer (RDL) over the first primary surface; wherein the primary RDL includes a second edge connection aligned with the first secondary surface of the first semiconductor body; and
a laterally extending RDL structure covering each first sidewall of the plurality of IC structures, the laterally extending RDL structure further electrically connected to the first edge connection and/or the second edge connection.

16. The IC stack of claim 15, further comprising:

a set of upward extending thermal conductivity layers, wherein a corresponding upward extending thermal conductivity layer is disposed between every two adjacent IC structures of the plurality of IC structures; and a first laterally extending thermal conductivity layer covering each second sidewall of the plurality of IC structures and thermally coupling to the set of upward extending thermal conductivity layers.

17. The IC stack of claim 16, wherein each IC structure comprises a DRAM semiconductor die, and the IC stack further comprises a logic control chip under and electrically connected to the laterally extending RDL structure of the IC stack; wherein the IC stack is an HBM compatible structure.

18. The IC stack of claim 16, further comprising a second laterally extending thermal conductivity layer covering each third sidewall of the plurality of IC structures, wherein the second laterally extending thermal conductivity layer is thermally coupling to the set of upward extending thermal conductivity layers.

19. An IC stack comprising:

a plurality of integrated circuit (IC) structures horizontally separated with each other, wherein each IC structure comprises a top surface, a bottom surface opposite to the top surface, and four sidewalls with a first sidewall, a second sidewall, a third sidewall and a fourth sidewall; wherein an area of the bottom surface or the top surface is larger than that of any sidewall;

a laterally extending RDL structure covering each first sidewall of the plurality of IC structures, wherein the laterally extending RDL structure comprises:

a front interconnect surface with a set of front contacting pads coupled with the first sidewall of each IC structure; and a back interconnect surface opposite to the front interconnect surface, wherein the back interconnect surface includes a set of back contacting pads;

an upward extending thermal conductivity layer between two adjacent IC structures; and a logic control chip under and electrically connected to the laterally extending RDL structure of the IC stack, wherein each of the IC structures comprises a DRAM semiconductor die comprising a plurality of memory I/O pads, the logic control chip comprises a plurality of logic I/O pads, and the plurality of memory I/O pads of each DRAM semiconductor die are electrically coupled to the plurality of logic I/O pads through the laterally extending RDL structure, and wherein the plurality of IC structures are electrically coupled to the logic control chip through the set of back contacting pads of the back interconnect surface of the laterally extending RDL structure.

* * * * *